United States Patent
Yamazaki et al.

(10) Patent No.: US 12,094,979 B2
(45) Date of Patent: Sep. 17, 2024

(54) METHOD FOR MANUFACTURING SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Yasuhiro Jinbo, Kanagawa (JP); Jun Ishikawa, Kanagawa (JP); Sachiaki Tezuka, Kanagawa (JP); Tetsuya Kakehata, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 601 days.

(21) Appl. No.: 17/285,401

(22) PCT Filed: Oct. 17, 2019

(86) PCT No.: PCT/IB2019/058842
§ 371 (c)(1),
(2) Date: Apr. 14, 2021

(87) PCT Pub. No.: WO2020/084406
PCT Pub. Date: Apr. 30, 2020

(65) Prior Publication Data
US 2021/0399134 A1    Dec. 23, 2021

(30) Foreign Application Priority Data

Oct. 26, 2018   (JP) .................................. 2018-201928
Oct. 26, 2018   (JP) .................................. 2018-201930

(51) Int. Cl.
*H01L 29/00*    (2006.01)
*H01L 21/02*    (2006.01)
(Continued)

(52) U.S. Cl.
CPC .... *H01L 29/7869* (2013.01); *H01L 21/02164* (2013.01); *H01L 21/02274* (2013.01); *H01L 21/76826* (2013.01); *H01L 29/66742* (2013.01)

(58) Field of Classification Search
CPC .......... H01L 29/7869; H01L 29/66969; H01L 21/76822; H01L 21/76826
See application file for complete search history.

(56) References Cited

U.S. PATENT DOCUMENTS 7,791,072 B2   9/2010   Kumomi et al.
8,455,868 B2   6/2013   Yamazaki et al.
(Continued)

FOREIGN PATENT DOCUMENTS

CN   106165106 A   11/2016
JP   2007-096055 A   4/2007
(Continued)

OTHER PUBLICATIONS

International Search Report (Application No. PCT/IB2019/058842) Dated Jan. 21, 2020.
(Continued)

*Primary Examiner* — Reema Patel
(74) *Attorney, Agent, or Firm* — NIXON PEABODY LLP; Jeffrey L. Costellia

(57) ABSTRACT

A semiconductor device having favorable electrical characteristics is provided. The semiconductor device includes a first oxide; a first conductor and a second conductor over the first oxide; a first insulator over the first conductor; a second insulator over the second conductor; a third insulator over the first insulator and the second insulator; a second oxide positioned over the first oxide and between the first conductor and the second conductor; a fourth insulator over the second oxide; a third conductor over the fourth insulator; a
(Continued)

fifth insulator in contact with a top surface of the third insulator, a top surface of the second oxide, a top surface of the fourth insulator, and a top surface of the third conductor; a fourth conductor embedded in an opening formed in the first insulator, the third insulator, and the fifth insulator and in contact with the first conductor; and a fifth conductor embedded in an opening formed in the second insulator, the third insulator, and the fifth insulator and in contact with the second conductor. The third insulator includes, in the vicinity of an interface with the fourth conductor and in the vicinity of an interface with the fifth conductor, a region having a higher nitrogen concentration than a different region of the third insulator.

6 Claims, 36 Drawing Sheets

(51) Int. Cl.
  *H01L 21/768* (2006.01)
  *H01L 29/66* (2006.01)
  *H01L 29/786* (2006.01)

(56) References Cited

U.S. PATENT DOCUMENTS

| | | | |
|---|---|---|---|
| 8,547,771 | B2 | 10/2013 | Koyama |
| 8,878,288 | B2 | 11/2014 | Isobe et al. |
| 8,932,913 | B2 | 1/2015 | Sasagawa et al. |
| 8,946,812 | B2 | 2/2015 | Ishizuka et al. |
| 9,059,219 | B2 | 6/2015 | Sasagawa et al. |
| 9,368,636 | B2 | 6/2016 | Kurata. et al. |
| 9,559,211 | B2 | 1/2017 | Yamazaki |
| 9,882,061 | B2 | 1/2018 | Yamazaki et al. |
| 9,947,801 | B2 | 4/2018 | Yamazaki. et al. |
| 10,050,152 | B2 | 8/2018 | Yamazaki |
| 10,236,392 | B2 | 3/2019 | Yamazaki. et al. |
| 10,566,460 | B2 | 2/2020 | Yamazaki et al. |
| 10,833,203 | B2 | 11/2020 | Yamazaki et al. |
| 11,177,392 | B2 | 11/2021 | Yamazaki. et al. |
| 11,581,440 | B2 | 2/2023 | Yamazaki. et al. |
| 11,888,073 | B2 | 1/2024 | Yamazaki. et al. |
| 2006/0113536 | A1 | 6/2006 | Kumomi et al. |
| 2007/0072439 | A1 | 3/2007 | Akimoto et al. |
| 2007/0108446 | A1 | 5/2007 | Akimoto |
| 2007/0187760 | A1 | 8/2007 | Furuta et al. |
| 2012/0001170 | A1 | 1/2012 | Yamazaki |
| 2012/0187475 | A1 | 7/2012 | Yamazaki et al. |
| 2012/0199842 | A1 | 8/2012 | Takemura |
| 2012/0223310 | A1 | 9/2012 | Noda et al. |
| 2013/0009146 | A1 | 1/2013 | Nomura. et al. |
| 2014/0004656 | A1 | 1/2014 | Sasagawa et al. |
| 2014/0008647 | A1 | 1/2014 | Yamazaki |
| 2014/0034946 | A1 | 2/2014 | Yamazaki et al. |
| 2014/0138674 | A1 | 5/2014 | Sato et al. |
| 2014/0291674 | A1 | 10/2014 | Kurata. et al. |
| 2014/0339544 | A1 | 11/2014 | Hanaoka et al. |
| 2014/0339548 | A1 | 11/2014 | Yamazaki et al. |
| 2014/0339549 | A1 | 11/2014 | Yamazaki et al. |
| 2015/0221678 | A1 | 8/2015 | Yamazaki et al. |
| 2015/0221679 | A1 | 8/2015 | Yamazaki et al. |
| 2015/0270402 | A1 | 9/2015 | Endo. et al. |
| 2015/0280013 | A1 | 10/2015 | Yamazaki et al. |
| 2015/0372009 | A1 | 12/2015 | Yamazaki |
| 2016/0172500 | A1 | 6/2016 | Yamazaki et al. |
| 2016/0218219 | A1 | 7/2016 | Asami. et al. |
| 2016/0276487 | A1 | 9/2016 | Yamazaki. et al. |
| 2016/0293766 | A1 | 10/2016 | Kurata. et al. |
| 2016/0308060 | A1 | 10/2016 | Tanaka. et al. |
| 2017/0179293 | A1 | 6/2017 | Yamazaki |
| 2017/0229486 | A1 | 8/2017 | Matsuda et al. |
| 2017/0236842 | A1 | 8/2017 | Matsuda et al. |
| 2017/0236848 | A1 | 8/2017 | Yamazaki |
| 2018/0019343 | A1 | 1/2018 | Asami |
| 2018/0158671 | A1 | 6/2018 | Suzuki et al. |
| 2020/0203489 | A1 | 6/2020 | Tochibayashi et al. |
| 2020/0203533 | A1 | 6/2020 | Yamazaki et al. |

FOREIGN PATENT DOCUMENTS

| | | |
|---|---|---|
| JP | 2011-151383 A | 8/2011 |
| JP | 2012-257187 A | 12/2012 |
| JP | 2011/010726 | 1/2013 |
| JP | 2013-254942 A | 12/2013 |
| JP | 2016-157937 A | 9/2016 |
| JP | 2016-225602 A | 12/2016 |
| JP | 2017-050530 A | 3/2017 |
| WO | WO-2015/145292 | 10/2015 |
| WO | WO-2017/072627 | 5/2017 |
| WO | WO-2017072627 A1 * | 5/2017 |

OTHER PUBLICATIONS

Written Opinion (Application No. PCT/IB2019/058842) Dated Jan. 21, 2020.

Kunitake.H et al., "High thermal tolerance of 25-nm c-axis aligned crystalline In—Ga—Zn oxide FET", IEDM 18: Technical Digest of International Electron Devices Meeting, Dec. 1, 2018, pp. 312-315.

Chatterjee.A et al., "Sub-100nm Gate Length Metal Gate NMOS Transistors Fabricated by a Replacement Gate Process", IEDM 97: Technical Digest of International Electron Devices Meeting, Dec. 7, 1997, pp. 821-824.

Yagishita.A et al., "High Performance Damascene Metal Gate MOSFET's for 0.1 μm Regime", IEEE Transactions on Electron Devices, May 1, 2000, vol. 47, No. 5, pp. 1028-1034.

Hisamoto.D et al., "FinFET—A Self-Aligned Double-Gate MOSFET Scalable to 20 nm", IEEE Transactions on Electron Devices, Dec. 1, 2000, vol. 47, No. 12, pp. 2320-2325.

Kobayashi.T et al., "The Inverted-Staggered InGaZnO TFT with Hydrogen-Free PECVD-SiO2 Etch-Stopper and Passivation Layers", SSDM 2018 (Extended Abstracts of The 2018 International Conference on Solid State Devices and Materials), Sep. 9, 2018, pp. 815-816.

Chinese Office Action (Application No. 201980066151.8) Dated Mar. 28, 2024.

* cited by examiner

METHOD FOR MANUFACTURING SEMICONDUCTOR DEVICE

TECHNICAL FIELD

One embodiment of the present invention relates to a semiconductor device and a method for manufacturing the semiconductor device. Alternatively, one embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

In recent years, semiconductor devices have been developed and an LSI, a CPU, and a memory are mainly used. A CPU is an aggregation of semiconductor elements each provided with an electrode that is a connection terminal, which includes a semiconductor integrated circuit (including at least a transistor and a memory) separated from a semiconductor wafer.

A semiconductor circuit (IC chip) of LSIs, CPUs, memories, and the like is mounted on a circuit board, for example, a printed wiring board, to be used as one of components of a variety of electronic devices.

In addition, a technique for forming a transistor by using a semiconductor thin film formed over a substrate having an insulating surface has attracted attention. The transistor is used in a wide range of electronic devices such as an integrated circuit (IC) and an image display device (also simply referred to as a display device). A silicon-based semiconductor material is widely known as a material for a semiconductor thin film that can be used in a transistor, and as another material, an oxide semiconductor has attracted attention.

It is known that a transistor using an oxide semiconductor has an extremely low leakage current in a non-conduction state. For example, a low-power-consumption CPU utilizing a characteristic of a low leakage current of the transistor using an oxide semiconductor is disclosed (see Patent Document 1). Furthermore, a memory device that can retain stored contents for a long time by utilizing a characteristic of a low leakage current of a transistor using an oxide semiconductor is disclosed, for example (see Patent Document 2).

In recent years, demand for an integrated circuit with higher density has risen with reductions in size and weight of electronic devices. Furthermore, the productivity of a semiconductor device including an integrated circuit is required to be improved.

REFERENCE

Patent Document

[Patent Document 1] Japanese Published Patent Application No. 2012-257187
[Patent Document 2] Japanese Published Patent Application No. 2011-151383

SUMMARY OF THE INVENTION

Problems to be Solved by the Invention

An object of one embodiment of the present invention is to provide a semiconductor device having favorable electrical characteristics. Another object of one embodiment of the present invention is to provide a semiconductor device having normally-off electrical characteristics. Another object of one embodiment of the present invention is to provide a semiconductor device having favorable reliability. Another object of one embodiment of the present invention is to provide a semiconductor device with a high on-state current. Another object of one embodiment of the present invention is to provide a semiconductor device having excellent frequency characteristics. Another object of one embodiment of the present invention is to provide a semiconductor device that can be miniaturized or highly integrated. Another object of one embodiment of the present invention is to provide a semiconductor device with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device in which power consumption can be reduced. Another object of one embodiment of the present invention is to provide a novel semiconductor device.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention is a semiconductor device including a first oxide; a first conductor and a second conductor over the first oxide; a first insulator over the first conductor, a second insulator over the second conductor, a third insulator over the first insulator and the second insulator; a second oxide positioned over the first oxide and between the first conductor and the second conductor; a fourth insulator over the second oxide; a third conductor over the fourth insulator, a fifth insulator in contact with a top surface of the third insulator, a top surface of the second oxide, a top surface of the fourth insulator, and a top surface of the third conductor, a fourth conductor embedded in an opening formed in the first insulator, the third insulator, and the fifth insulator and in contact with the first conductor, and a fifth conductor embedded in an opening formed in the second insulator, the third insulator, and the fifth insulator and in contact with the second conductor, in which the third insulator includes, in the vicinity of an interface with the fourth conductor and in the vicinity of an interface with the fifth conductor, a region having a higher nitrogen concentration than a different region of the third insulator.

In the above, the first conductor preferably includes, in the vicinity of an interface with the fourth conductor, a region having a higher nitrogen concentration than a different region of the first conductor, and the second conductor preferably includes, in the vicinity of an interface with the fifth conductor, a region having a higher nitrogen concentration than a different region of the second conductor.

Another embodiment of the present invention is a semiconductor device including a first insulator; a first conductor over the first insulator, a second insulator over the first conductor; a first oxide over the second insulator, a second conductor and a third conductor over the first oxide; a third insulator over the second conductor; a fourth insulator over the third conductor; a fifth insulator over the third insulator and the fourth insulator; a second oxide positioned over the first oxide and between the second conductor and the third conductor, a sixth insulator over the second oxide; a fourth conductor over the sixth insulator; a seventh insulator in contact with a top surface of the fifth insulator, a top surface of the second oxide, a top surface of the sixth insulator, and a top surface of the fourth conductor; an eighth insulator in contact with a top surface and a side surface of the seventh insulator, a side surface of the fifth insulator, a side surface of the second insulator, and a top surface of the first insulator, a fifth conductor embedded in an opening formed in the third insulator, the fifth insulator, the seventh insulator, and the eighth insulator and in contact with the second conductor; and a sixth conductor embedded in an opening formed in the fourth insulator, the fifth insulator, the seventh insulator, and the eighth insulator and in contact with the third conductor, in which the fifth insulator includes, in the vicinity of an interface with the fifth conductor, in the vicinity of an interface with the sixth conductor, and in the vicinity of an interface with the eighth insulator, a region having a higher nitrogen concentration than a different region of the fifth insulator.

In the above, it is preferable that the second conductor include, in the vicinity of an interface with the fifth conductor, a region having a higher nitrogen concentration than a different region of the second conductor and that the third conductor include, in the vicinity of an interface with the sixth conductor, a region having a higher nitrogen concentration than a different region of the third conductor.

Another embodiment of the present invention is a method for manufacturing a semiconductor device including first to fifth conductors, first to fifth insulators, and first and second oxides, the method including: forming the first oxide over a substrate, a first conductor layer over the first oxide, and a first insulator layer over the first conductor layer; depositing the third insulator over the first insulator layer; forming an opening reaching the first insulator layer in the third insulator; removing regions overlapping the opening of the first conductor layer and the first insulator layer to form the first conductor, the second conductor, the first insulator, and the second insulator; depositing a first oxide film in contact with the first oxide between the first conductor and the second conductor; depositing a first insulating film over the first oxide film; depositing a first conductive film over the first insulating film; removing part of the first oxide film, part of the first insulating film, and part of the first conductive film until a top surface of the third insulator is exposed to form the second oxide, the fourth insulator, and the third conductor, depositing the fifth insulator over the third insulator, the second oxide, the fourth insulator, and the third conductor, forming an opening reaching the first conductor in the first insulator, the third insulator, and the fifth insulator and forming an opening reaching the second conductor in the second insulator, the third insulator, and the fifth insulator; performing microwave treatment in an atmosphere containing nitrogen; and forming a fourth conductor to be embedded in the opening reaching the first conductor and forming a fifth conductor to be embedded in the opening reaching the second conductor.

In the above, the microwave treatment is preferably performed under a reduced pressure.

Another embodiment of the present invention is a method for manufacturing a semiconductor device including first and second conductors, first to seventh insulators, and first and second oxides, the method including: depositing the first insulator over a substrate; forming the first conductor over the first insulator; depositing the second insulator over the first conductor, depositing the third insulator over the second insulator; forming the first oxide over the third insulator; depositing the fourth insulator over the first oxide; forming a first opening reaching the first oxide in the fourth insulator; depositing a first oxide film in contact with the first oxide and the fourth insulator in the first opening; depositing a first insulating film over the first oxide film; depositing a first conductive film over the first insulating film; removing part of the first oxide film, part of the first insulating film, and part of the first conductive film until a top surface of the fourth insulator is exposed to form the second oxide, the fifth insulator, and the second conductor, depositing the sixth insulator in contact with the fourth insulator, the second oxide, the fifth insulator, and the second conductor; removing part of the sixth insulator, part of the fourth insulator, part of the third insulator, and part of the second insulator to form a second opening reaching the first insulator; and depositing the seventh insulator covering the sixth insulator, the fourth insulator, the third insulator, and the second insulator and in contact with the first insulator in the second opening, in which the third insulator, the fourth insulator, and the first insulating film are deposited using a gas containing a molecule including a silicon atom, and the molecule including a silicon atom contains three or less hydrogen atoms per silicon atom.

In the above, microwave treatment is preferably performed in a nitrogen-containing atmosphere after the second opening is formed.

In the above, the molecule including a silicon atom preferably does not contains a hydrogen atom. In the above, the gas containing a molecule including a silicon atom preferably does not contain a hydrogen atom.

In the above, the first insulator and the seventh insulator are less likely to transmit hydrogen than the fourth insulator.

In the above, the fourth insulator is preferably deposited by a PECVD method or an APCVD method. In the above, the first insulating film is preferably deposited by a PEALD method or a thermal ALD method.

Effect of the Invention

According to one embodiment of the present invention, a semiconductor device having favorable electrical characteristics can be provided. According to one embodiment of the present invention, a semiconductor device having normally-off electrical characteristics can be provided. According to one embodiment of the present invention, a semiconductor device having favorable reliability can be provided. According to one embodiment of the present invention, a semiconductor device with a high on-state current can be provided. According to one embodiment of the present invention, a semiconductor device having excellent frequency characteristics can be provided. According to one embodiment of the present invention, a semiconductor device that can be miniaturized or highly integrated can be provided. According to one embodiment of the present invention, a semiconductor device with high productivity can be provided.

A semiconductor device capable of retaining data for a long time can be provided. A semiconductor device capable of high-speed data writing can be provided. A semiconductor device having high design flexibility can be provided. A semiconductor device in which power consumption can be reduced can be provided. A novel semiconductor device can be provided.

Note that the description of the effects does not preclude the existence of other effects. One embodiment of the present invention does not have to have all these effects. Note that effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 28A, FIG. 28B, FIG. 28C, FIG. 28D, FIG. 28E1, FIG. 28E2, and FIG. 28F are diagrams illustrating electronic devices of embodiments of the present invention.

MODE FOR CARRYING OUT THE INVENTION

Figure 1A:
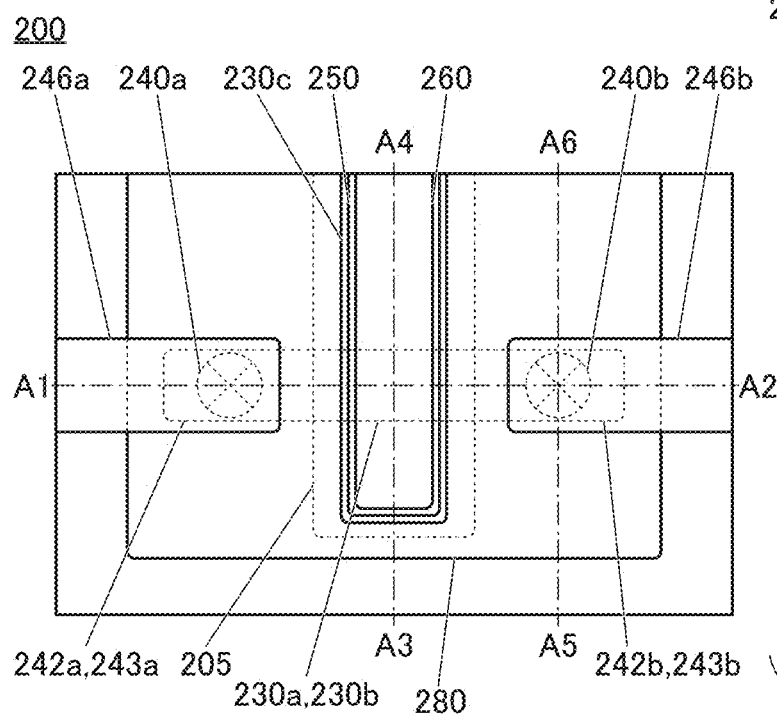
FIG. 1A, FIG. 1B, FIG. 1C, and FIG. 1D are a top view and cross-sectional views of a semiconductor device of one embodiment of the present invention.

Hereinafter, embodiments are described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in an actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a plan view), a perspective view, or the like, some components might not be illustrated for easy understanding of the invention. In addition, some hidden lines and the like might not be shown.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

In this specification and the like, terms for describing arrangement, such as "over" and "below", are used for convenience to describe the positional relation between components with reference to drawings. The positional relation between components is changed as appropriate in accordance with a direction in which each component is described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is disclosed in the drawings or the texts.

Here, X and Y each denote an object (e.g., a device, an element, a circuit, a wiring, an electrode, a terminal, a conductive film, or a layer).

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that in this specification and the like, depending on the transistor structure, a channel width in a region where a channel is actually formed (channel formation region) (hereinafter also referred to as an "effective channel width") is different from a channel width shown in a top view of a transistor (hereinafter also referred to as an "apparent channel width") in some cases. For example, when a gate covers a side surface of a semiconductor, an effective channel width is greater than an apparent channel width, and its influence cannot be ignored in some cases. For example, in a miniaturized transistor having a gate covering a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to apparent channel width in some cases. Alternatively, in this specification, the simple term "channel width" refers to effective channel width in some cases. Note that values of channel length, channel width, effective channel width, apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, DOS (Density of States) in a semiconductor may be increased or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor, hydrogen, lithium, sodium, silicon, boron, phosphorus, carbon, and nitrogen are given as examples. In the case of an oxide semiconductor, water also serves as an impurity in some cases. Also in the case of an oxide semiconductor, oxygen vacancies are formed in some cases by entry of impurities, for example. Furthermore, when the semiconductor is silicon, examples of an impurity that changes characteristics of the semiconductor include oxygen, Group 1 elements except hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5 is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle greater than or equal to 60° and less than or equal to 120°.

Note that in this specification, a barrier film means a film having a function of inhibiting transmission of oxygen and impurities such as water and hydrogen, and the barrier film having conductivity is sometimes referred to as a conductive barrier film.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS FET or an OS transistor can also be referred to as a transistor including an oxide or an oxide semiconductor.

In this specification and the like, "normally off" means that a current per micrometer of channel width flowing through a transistor when a potential is not applied to a gate or a ground potential is applied to the gate is lower than or equal to $1\times10^{-20}$ A at room temperature, lower than or equal to $1\times10^{-18}$ A at 85° C., or lower than or equal to $1\times10^{-6}$ A at 125° C.

Embodiment 1

An example of a semiconductor device including a transistor 200 of one embodiment of the present invention and a manufacturing method thereof are described below.
<Structure Example of Semiconductor Device>

FIG. 1A, FIG. 1B, FIG. 1C, and FIG. 1D are a top view and cross-sectional views of the transistor 200 of one embodiment of the present invention and the periphery of the transistor 200.

Figure 1C:
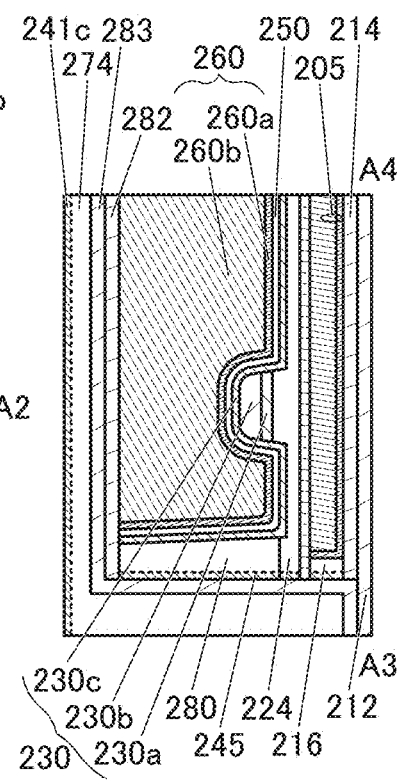
Figure 1B:
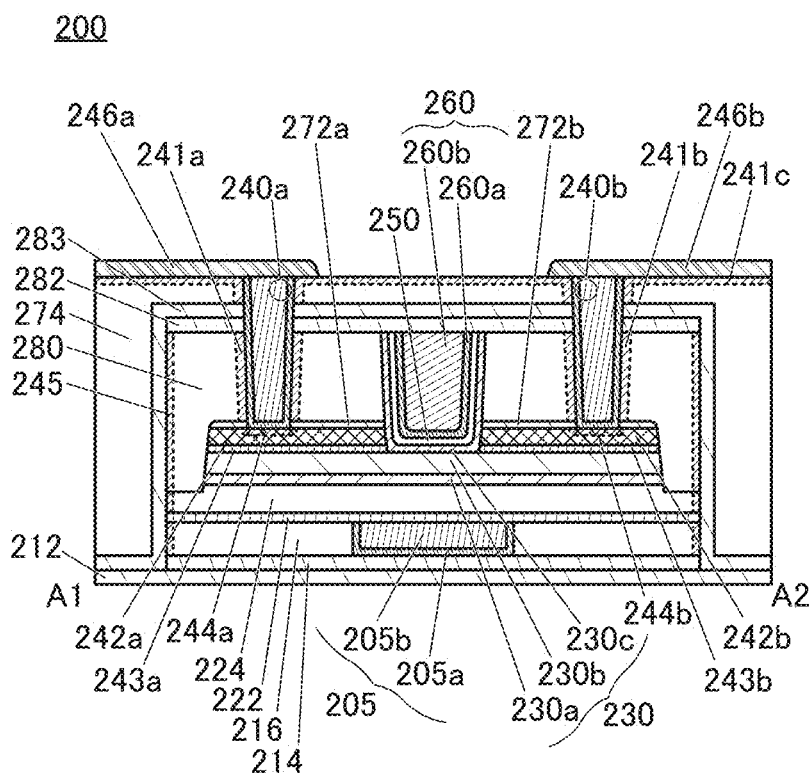
Figure 1D:
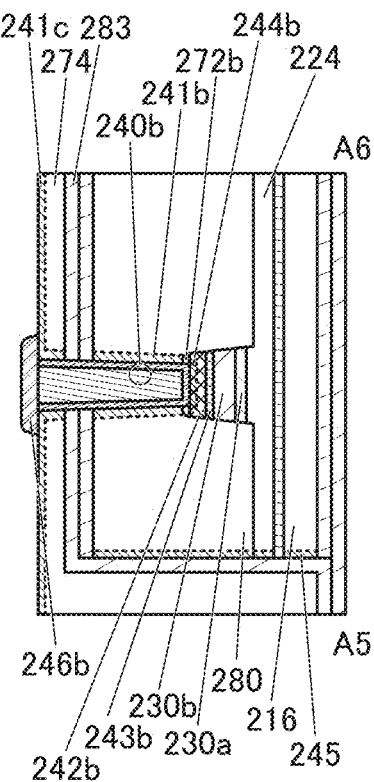
Figure 2A:
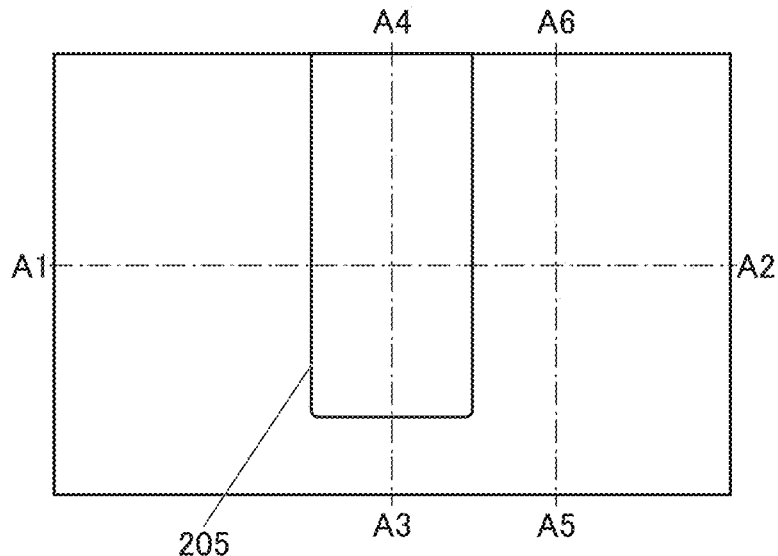
FIG. 2A, FIG. 2B, FIG. 2C, and FIG. 2D are a top view and cross-sectional views illustrating a method for manufacturing a semiconductor device of one embodiment of the present invention.
Figure 2C:
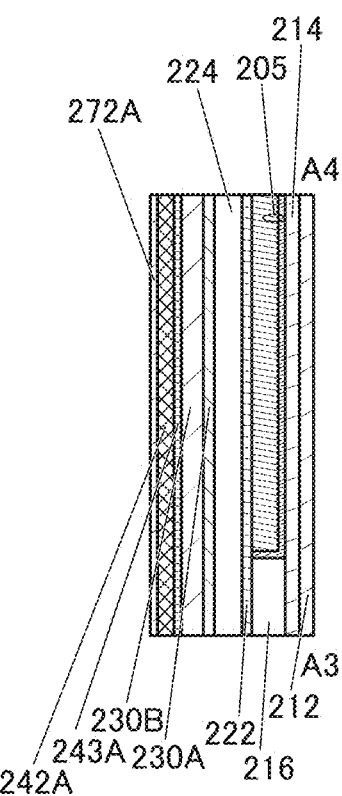
Figure 2B:
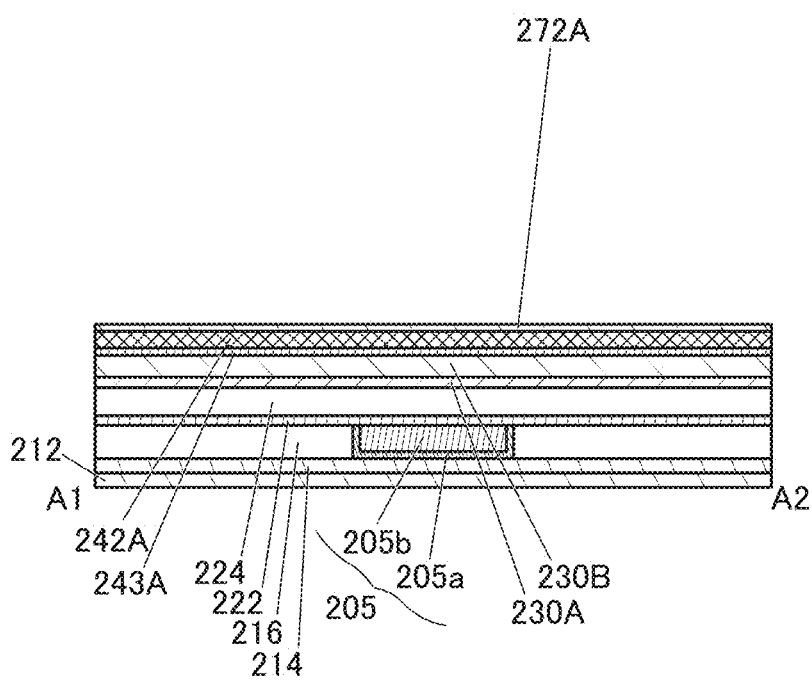
Figure 2D:
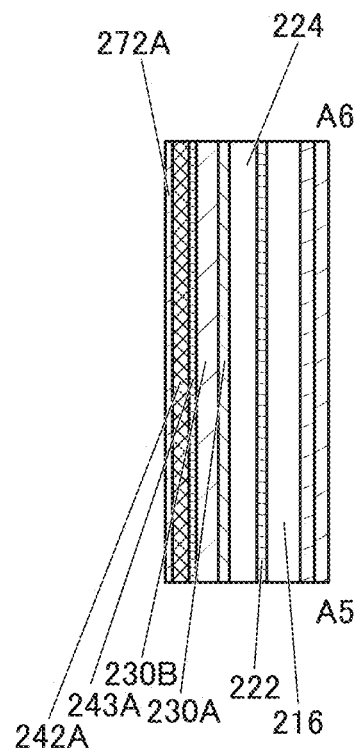

FIG. 1A is a top view of the semiconductor device including the transistor 200. FIG. 1B and FIG. 1C are cross-sectional views of the semiconductor device. Here, FIG. 1B is a cross-sectional view of a portion indicated by the dashed-dotted line A1-A2 in FIG. 1A, and is a cross-sectional view in the channel length direction of the transistor 200. FIG. 1C is a cross-sectional view of a portion indicated by the dashed-dotted line A3-A4 in FIG. 1A, and is a cross-sectional view in the channel width direction of the transistor 200. FIG. 1D is a cross-sectional view of a portion indicated by the dashed-dotted line A5-A6 in FIG. 1A. Note that for clarity of the drawing, some components are not illustrated in the top view of FIG. 1A.

The semiconductor device of one embodiment of the present invention includes an insulator 212 over a substrate (not illustrated), an insulator 214 over the insulator 212, the transistor 200 over the insulator 214, an insulator 280 over the transistor 200, an insulator 282 over the insulator 280, an insulator 283 over the insulator 282, and an insulator 274 over the insulator 283. The insulator 212, the insulator 214, the insulator 280, the insulator 282, the insulator 283, and the insulator 274 function as interlayer films. A conductor 240 (a conductor 240a and a conductor 240b) that is electrically connected to the transistor 200 and functions as a plug is also included. A conductor 246 (a conductor 246a and a conductor 246b) that is electrically connected to the conductor 240 and functions as a wiring is provided over the insulator 274 and the conductor 240.

In the conductor 240, a first conductor is provided, and a second conductor is provided on the inner side. Here, the level of a top surface of the conductor 240 and the level of a top surface of the insulator 274 can be substantially the same. Note that although the transistor 200 has a structure in which the first conductor of the conductor 240 and the second conductor of the conductor 240 are stacked, the present invention is not limited thereto. For example, the conductor 240 may be provided as a single layer or to have a stacked-layer structure of three or more layers. In the case where a structure body has a stacked-layer structure, layers may be distinguished by ordinal numbers corresponding to the formation order.

As illustrated in FIG. 1, it is preferable that the transistor 200 descried in this embodiment be formed over the insulator 212, and the top and side surfaces of the transistor 200 be covered with the insulator 283. Furthermore, when seen from the above, it is preferable that the insulator 283 and the insulator 212 be in contact with each other outside the transistor 200 and that the transistor 200 be sealed with the insulator 283 and the insulator 212.
[Transistor 200]

As illustrated in FIG. 1, the transistor 200 includes an insulator 216 over the insulator 214; a conductor 205 (a conductor 205a and a conductor 205b) positioned to be embedded in the insulator 216; an insulator 222 over the insulator 216 and the conductor 205; an insulator 224 over the insulator 222; an oxide 230a over the insulator 224; an oxide 230b over the oxide 230a; an oxide 243a and an oxide 243b over the oxide 230b; a conductor 242a over the oxide 243a; a conductor 242b over the oxide 243b; an insulator 272a over the conductor 242a; an insulator 272b over the conductor 242b; an oxide 230c over the oxide 230b; an insulator 250 over the oxide 230c; and a conductor 260 (a conductor 260a and a conductor 260b) positioned over the insulator 250 and overlapping with the oxide 230c. The oxide 230c is in contact with a side surface of the oxide 243a, a side surface of the oxide 243b, a side surface of the conductor 242a, and a side surface of the conductor 242b. The conductor 260 includes the conductor 260a and the conductor 260b, and the conductor 260a is positioned so as to cover a bottom surface and a side surface of the conductor 260b. Here, as illustrated in FIG. 1B, a top surface of the conductor 260 is positioned to be substantially aligned with a top surface of the insulator 250 and a top surface of the oxide 230c. The insulator 282 is in contact with the top surfaces of the conductor 260, the insulator 250, the oxide 230c, and the insulator 280.

Hereinafter, the oxide 243a and the oxide 243b might be collectively referred to as an oxide 243. The conductor 242a and the conductor 242b might be collectively referred to as a conductor 242. The conductor 242a and the conductor 242b might be collectively referred to as a conductor 242. The insulator 272a and the insulator 272b might be collectively referred to as an insulator 272.

In the transistor 200, the conductor 260 functions as a gate of the transistor, and the conductor 242a and the conductor 242b function as a source electrode and a drain electrode. In the transistor 200, the conductor 260 functioning as a gate is formed in a self-aligned manner to fill an opening formed in the insulator 280 and the like. When the conductor 260 is formed in such a manner, the conductor 260 can be surely positioned in a region between the conductor 242a and the conductor 242b without position alignment of the conductor 260.

At least one of the insulator 212, the insulator 214, the insulator 222, the insulator 272 (hereinafter, the insulator 272a and the insulator 272b might be collectively referred to as the insulator 272), the insulator 282, and the insulator 283 preferably has a function of inhibiting diffusion of hydrogen (e.g., at least one of a hydrogen atom, a hydrogen molecule, and the like) or a water molecule. It is particularly preferable that the insulator 212 and the insulator 283 have higher capability of inhibiting diffusion of hydrogen (e.g., at least one of a hydrogen atom, a hydrogen molecule, and the like) or a water molecule. In addition, it is preferable that at least one of the insulator 212, the insulator 214, the insulator 222, the insulator 272, the insulator 282, and the insulator 283 have a function of inhibiting diffusion of oxygen (e.g., at least one of an oxygen atom, an oxygen molecule, and the like). For example, it is preferable that at least one of the insulator 212, the insulator 214, the insulator 222, the insulator 272, the insulator 282, and the insulator 283 have lower permeability of one or both of oxygen and hydrogen than the insulator 224. It is preferable that at least one of the insulator 212, the insulator 214, the insulator 222, the insulator 272, the insulator 282, and the insulator 283 have lower permeability of one or both of oxygen and hydrogen than the insulator 250. It is preferable that at least one of the insulator 212, the insulator 214, the insulator 222, the insulator 272, the insulator 282, and the insulator 283 have lower permeability of one or both of oxygen and hydrogen than the insulator 280.

Aluminum oxide, hafnium oxide, gallium oxide, indium gallium zinc oxide, silicon nitride, or silicon nitride oxide can be used for the insulator 212, the insulator 214, the insulator 222, the insulator 272, the insulator 282, and the insulator 283, for example. In particular, for the insulator 212 and the insulator 283, silicon nitride or silicon nitride oxide with a higher hydrogen barrier property is preferably used.

As illustrated in FIG. 1, in one embodiment of the semiconductor device described in this embodiment, the insulator 214, the insulator 216, the insulator 222, the insulator 224, the insulator 280, and the insulator 282 are patterned, and they are covered with the insulator 283. That is, the insulator 283 is in contact with a top surface and side surfaces of the insulator 282, side surfaces of the insulator 280, side surfaces of the insulator 224, side surfaces of the insulator 222, side surfaces of the insulator 216, side surfaces of the insulator 214, and a top surface of the insulator 212. Accordingly, the insulator 214, the insulator 216, the insulator 222, the insulator 224, the insulator 280, and the insulator 282 in addition to the oxide 230 and the like are isolated from the outside by the insulator 283 and the insulator 212.

The oxide 230 preferably includes the oxide 230a over the insulator 224, the oxide 230b over the oxide 230a, and the oxide 230c that is positioned over the oxide 230b and is at least partly in contact with a top surface of the oxide 230b. Side surfaces of the oxide 230c are preferably provided in contact with the oxide 243a, the oxide 243b, the conductor 242a, the conductor 242b, the insulator 272a, the insulator 272b, and the insulator 280.

Note that the transistor 200 has a structure in which three layers of the oxide 230a, the oxide 230b, and the oxide 230c are stacked in a channel formation region and its vicinity; however, the present invention is not limited thereto. For example, a single layer of the oxide 230b, a two-layer structure of the oxide 230b and the oxide 230a, a two-layer structure of the oxide 230b and the oxide 230c, or a stacked-layer structure of four or more layers may be provided. For example, a four-layer structure including the oxide 230c with a two-layer structure may be provided.

In the transistor 200, as the oxide 230 (the oxide 230a, the oxide 230b, and the oxide 230c) that includes the channel formation region, a metal oxide functioning as an oxide semiconductor (hereinafter also referred to as an oxide semiconductor) is preferably used. For example, a metal oxide having an energy gap of 2 eV or more, preferably 2.5 eV or more is preferably used as the metal oxide functioning as an oxide semiconductor. With the use of a metal oxide having such a wide energy gap, the leakage current in a non-conduction state (off-state current) of the transistor 200 can be extremely low. With the use of such a transistor, a semiconductor device with low power consumption can be provided.

For example, for the oxide 230, a metal oxide such as an In-M-Zn oxide (an element M is one or more selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, an In-M oxide, an In—Zn oxide, or an M-Zn oxide may be used as the oxide 230.

The oxide 230 includes the oxide 230a, the oxide 230b over the oxide 230a, and the oxide 230c over the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

Note that the oxide 230 preferably has a stacked-layer structure using oxides that differ in the atomic ratio of metal atoms. Specifically, the atomic proportion of the element M in the constituent elements in the metal oxide used as the oxide 230a is preferably greater than the atomic proportion of the element M in the constituent elements in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a. A metal oxide that can be used as the oxide 230a or the oxide 230b can be used as the oxide 230c.

Specifically, as the oxide 230a, a metal oxide with In:Ga:Zn=1:3:4 [atomic ratio] or 1:1:0.5 [atomic ratio] is used. As the oxide 230b, a metal oxide with In:Ga:Zn=4:2:3 [atomic ratio] or 1:1:1 [atomic ratio] is used. As the oxide 230c, a metal oxide with In:Ga:Zn=1:3:4 [atomic ratio], Ga:Zn=2:1 [atomic ratio], or Ga:Zn=2:5 [atomic ratio] is used. Specific examples of the oxide 230c having a stacked-layer structure include a stacked-layer structure of In:Ga:Zn=4:2:3 [atomic ratio] and In:Ga:Zn=1:3:4 [atomic ratio], a stacked-layer structure of Ga:Zn=2:1 [atomic ratio] and In:Ga:Zn=4:2:3 [atomic ratio], a stacked-layer structure of Ga:Zn=2:5 [atomic ratio] and In:Ga:Zn=4:2:3 [atomic ratio] and, and a stacked-layer structure of gallium oxide and In:Ga:Zn=4:2:3 [atomic ratio].

The oxide 230b preferably has crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. This can reduce oxygen extraction from the oxide 230b even when heat treatment is performed; thus, the transistor 200 is stable with respect to high temperatures in a manufacturing process (what is called thermal budget).

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b.

Hem, electron affinity or conduction band minimum Ec can be obtained from an energy gap Eg and an ionization potential Ip, which is a difference between a vacuum level and an energy of valence band maximum Ev. The ionization potential Ip can be measured using, for example, an ultraviolet photoelectron spectroscopy (UPS) apparatus. The energy gap Eg can be measured using, for example, a spectroscopic ellipsometer.

Furthermore, the energy level of the conduction band minimum is gradually varied at junction regions of the oxide 230a, the oxide 230b, and the oxide 230c. In other words, the energy level of the conduction band minimum at the junction regions of the oxide 230a, the oxide 230b, and the oxide 230c is continuously varied or continuously connected. To obtain this, the density of defect states in mixed layers formed at an interface between the oxide 230a and the oxide 230b and an interface between the oxide 230b and the oxide 230c is preferably made low.

Moreover, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have high on-state current and excellent frequency characteristics.

An oxide semiconductor with a low carrier concentration is preferably used as the oxide 230 (e.g., the oxide 230b). In the case where the carrier concentration of the oxide semiconductor is lowered, the impurity concentration in the oxide semiconductor is lowered to decrease the density of defect states. In this specification and the like, a state with a low impurity concentration and a low density of defect states is referred to as a highly purified intrinsic or substantially highly purified intrinsic state. Examples of the impurities in the oxide semiconductor include hydrogen, nitrogen, alkali metal, alkaline earth metal, iron, nickel, and silicon.

In particular, hydrogen contained in the oxide semiconductor reacts with oxygen bonded to a metal atom to be water, and thus sometimes forms an oxygen vacancy (also referred to as Vo) in the oxide semiconductor. In some cases, a defect where hydrogen enters an oxygen vacancy (hereinafter, sometimes referred to as VoH) functions as a donor and generates an electron serving as a carrier. In other cases, bonding of part of hydrogen to oxygen bonded to a metal atom generates electrons serving as carriers. Thus, a transistor including an oxide semiconductor which contains a large amount of hydrogen is likely to be normally on. Moreover, hydrogen in an oxide semiconductor is easily transferred by a stress such as heat or an electric field; thus, a large amount of hydrogen in an oxide semiconductor might reduce the reliability of a transistor.

VoH can serve as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Accordingly, in the case where an oxide semiconductor is used as the oxide 230, the amount of VoH in the oxide 230 is preferably reduced as much as possible so that the oxide 230 becomes a highly purified intrinsic or substantially highly purified intrinsic oxide. In order to obtain such an oxide semiconductor with sufficiently reduced VoH, it is important to remove impurities such as moisture and hydrogen in the oxide semiconductor (this treatment is sometimes referred to as dehydration or dehydrogenation treatment) and supply oxygen to the oxide semiconductor to fill oxygen vacancies (this treatment is sometimes referred to as oxygen adding treatment). When an oxide semiconductor with sufficiently reduced impurities such as VoH is used for a channel formation region of a transistor, stable electrical characteristics can be given.

However, even when an oxide semiconductor is formed to have a low hydrogen concentration, hydrogen might be taken from the conductor 240 that is in contact with the oxide semiconductor. The conductor 240 is a conductor functioning as a via and positioned to be embedded in an opening formed in the insulator 274 and the insulator 280. Here, each of the insulator 274 and the insulator 280 is an insulating film functioning as an interlayer film and is preferably formed using an insulator containing silicon, such as silicon oxide or silicon oxynitride. In the case where the insulator 274 and the insulator 280 as described above are deposited, silicon hydride such as $SiH_4$ is often used as a source gas. A source gas containing silicon hydride such as $SiH_4$ is decomposed in the deposition, whereby a large amount of hydrogen having high reactivity (e.g. a hydrogen radical) is generated, and thus the large amount of hydrogen might be taken into the deposited insulator 274 and the deposited insulator 280. Part of the large amount of hydrogen taken into the insulator 274 and the insulator 280 is diffused into the conductor 240 functioning as a via by heat treatment or the like in a fabrication process of the transistor 200 in some cases. The hydrogen might be diffused into the oxide 230 through the conductor 240. As described above, the hydrogen concentration in the oxide semiconductor might be increased through the conductor 240.

On the other hand, the transistor 200 described in this embodiment has a region 241 with a higher nitrogen concentration than different regions being formed in the vicinity of an interface with the conductor 240a and in the vicinity of an interface with the conductor 240b in the insulator 274 and the insulator 280, whereby entry of hydrogen from the insulator 274 and the insulator 280 into the conductor 240 is reduced.

In this embodiment, as illustrated in FIG. 1, the region 241 may be separately described as a region 241a formed in the vicinity of the interface with the conductor 240a in the insulator 280, a region 241b formed in the vicinity of the interface with the conductor 240b in the insulator 280, and a region 241c formed in the vicinity of the interface with the conductor 240a and the conductor 240b in the insulator 274. As illustrated in FIG. 1, the region 241c is formed in the vicinity of the top surface of the insulator 274 in some cases.

In the insulator 274 and the insulator 280, the region 241 is preferably formed to have a thickness of 1 nm or more, further preferably a thickness of 1.5 nm or more, for example. In the insulator 274 and the insulator 280, the region 241 can have a thickness of 50 nm or less, 20 nm or less, or 10 nm or less, for example.

The region 241 has a higher nitrogen concentration than the different regions of the insulator 274 and the insulator 280. The region 241a and the region 241b have a higher nitrogen concentration than at least part of the different regions of the insulator 280. The region 241c has a higher nitrogen concentration than at least part of the different regions of the insulator 274. The region 241 has a lower oxygen concentration than the different regions of the insulator 274 and the insulator 280 in some cases.

The region 241 can be formed in such a manner that in a state where the conductor 240 is not provided and an opening is formed in the insulator 272, the insulator 280, the insulator 282, the insulator 283, and the insulator 274, surfaces of the insulator 274 and the insulator 280 are subjected to solid-phase nitridation. The solid-phase nitridation of the insulator 274 and the insulator 280 can be performed by plasma treatment in a nitrogen-containing atmosphere. Such treatment may be referred to as nitrogen plasma treatment below. In the nitrogen plasma treatment, a nitrogen gas is made into a plasma state using a microwave or a high-frequency wave such as RF, and the nitrogen plasma acts on the vicinities of the surfaces of the insulator 280 and the insulator 274, which thus can be subjected to solid-phase nitridation.

Note that for the nitrogen plasma treatment, an apparatus including a power source for generating high-density plasma using a microwave is preferably used, for example. Plasma treatment using a microwave may be referred to as microwave treatment, and an apparatus including a power source for generating high-density plasma using a microwave may be referred to as a microwave treatment apparatus below. The microwave treatment apparatus may include a power source for applying RF to a substrate side. A high-density plasma is used in a nitrogen-containing atmosphere, whereby a high-density nitrogen radical can be generated. Furthermore, application of RF to the substrate side allows ions generated by the high-density plasma to be efficiently introduced into the insulator 274 and the insulator 280. The microwave treatment in a nitrogen-containing atmosphere is preferably performed under a reduced pressure, and the pressure is set to 400 Pa or lower, preferably 200 Pa or lower, further preferably 60 Pa or lower, still further preferably 12 Pa or lower. Furthermore, the treatment is performed with the nitrogen flow rate ratio ($N_2/N_2+Ar$) of 50% or lower, preferably 10% or higher and 30% or lower. The treatment temperature is approximately 400° C., for example. Note that in this specification and the like, a treatment temperature include not only a substrate temperature during treatment but also a set temperature for the treatment apparatus.

It is preferable that the region 241 described above have a function of inhibiting diffusion of hydrogen (e.g., at least one of a hydrogen atom, a hydrogen molecule, and the like). For example, the region 241 preferably has a lower hydrogen permeability than the insulator 274 or the insulator 280. Such a region 241 is formed between the conductor 240 and the insulator 274 and the insulator 280, whereby entry of hydrogen contained in the insulator 274 and the insulator 280 into the conductor 240 can be reduced. Thus, the amount of hydrogen diffused from the conductor 240 to the conductor 242 and the oxide 230 can be reduced. Note that it is preferable that the region 241 also have a function of inhibiting diffusion of oxygen.

As described above, the region 241 is provided between the insulator 280 and the insulator 274 and the conductor 240, whereby the hydrogen concentration in the oxide 230 can be reduced. The hydrogen concentration of the oxide 230b, which is measured by secondary ion mass spectrometry (SIMS), can be lower than $1 \times 10^{20}$ atoms/cm$^3$, preferably lower than $1 \times 10^{19}$ atoms/cm$^3$, further preferably lower than $5 \times 10^{11}$ atoms/cm$^3$, still further preferably lower than $1 \times 10^{18}$ atoms/cm$^3$, for example. The oxide 230 with sufficiently reduced impurities such as hydrogen is used in the channel formation region of the transistor 200, whereby the transistor can have normally-off characteristics, stable electrical characteristics, and improved reliability.

When an oxide semiconductor is used for the oxide 230, the carrier concentration of the oxide semiconductor in a region functioning as a channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet still further preferably lower than $1 \times 10^{1}$ cm$^{-3}$, yet still further preferably lower than $1 \times 10^{12}$ cm$^{-3}$. Note that the lower limit of the carrier concentration of the oxide semiconductor in the region functioning as the channel formation region is not particularly limited and can be, for example, $1 \times 10^{-4}$ cm$^{-3}$.

When the region 241 is formed, the above nitrogen plasma treatment is performed in a state where an opening reaching the conductor 242a and an opening reaching the conductor 242b are formed in the insulator 272, the insulator 280, the insulator 282, the insulator 283, and the insulator 274. Thus, in the vicinity of an interface of the conductor 242a with the conductor 240a (in the vicinity of a surface of the conductor 242a in formation), a region 244a having a higher nitrogen concentration than a different region of the conductor 242a is formed; and in the vicinity of an interface of the conductor 242b with the conductor 240b (in the vicinity of a surface of the conductor 242b in formation), a region 244b having a higher nitrogen concentration than a different region of the conductor 242b is formed. Hereinafter, the region 244a and the region 244b are collectively referred to as a region 244 in some cases.

In the case where a metal nitride such as tantalum nitride is used for the conductor 242, the region 244 preferably has substantially the same resistivity as the different region of the conductor 242. For example, the resistivity of the region 244 is preferably lower than, or equal to 130% of the resistivity of the different region of the conductor 242. Thus, the region 244 does not significantly hinder the conductivity of the conductor 242 functioning as a source electrode and a drain electrode. Therefore, even when the region 241 is formed by the above nitrogen plasma treatment, the conductor 242 does not require special posttreatment. The region 244 having a higher nitrogen concentration than the different region of the conductor 242 is provided, whereby the amount of hydrogen diffused from the conductor 240 into the conductor 242 can be further reduced in some cases.

In the vicinities of interfaces of the insulator 280, the insulator 224, and the insulator 216 with the insulator 283, a region 245 having a higher nitrogen concentration than different regions of the insulator 280, the insulator 224, and the insulator 216 may be formed. The region 245 is formed on side surface of the insulator 280, the insulator 224, and the insulator 216 as illustrated in FIG. 1. The region 245 preferably has a structure similar to that of the region 241. The region 245 described above has a function of inhibiting diffusion of hydrogen (e.g., at least one of a hydrogen atom, a hydrogen molecule, and the like). The region 245 preferably has hydrogen permeability lower than the insulator 280, the insulator 224, and the insulator 216, for example. The region 245 can be formed by nitrogen plasma treatment like the region 241. Therefore, the description of the region 241 can be referred to for the details of a structure and a formation method of the region 245.

When such a region 245 is formed between the insulator 283 and the insulator 280, the insulator 224, and the insulator 216, entry of hydrogen contained in the insulator 274 into the insulator 280 and the like can be reduced. Thus, the amount of hydrogen diffused from the insulator 280 and the like to the oxide 230 can be further reduced.

The region 245 is formed on the side surfaces of the insulator 280, the insulator 224, and the insulator 216 before deposition of the insulator 283, whereby even when the insulator 283 is deposited by a CVD method in which a large amount of hydrogen is generated in a chamber, entry of the hydrogen into the insulator 280, the insulator 224, and the insulator 216 can be reduced. Accordingly, the insulator 283 can be deposited by a deposition method with favorable step coverage, such as a CVD method; therefore, the insulator 283 can be deposited without a break or formation of a pinhole, even with a step being formed by the insulator 280 or the like. Thus, the transistor 200 can be sealed with the insulator 283 and the insulator 212.

Note that although the conductor 240 penetrates the insulator 283, the region 241 is provided in contact with the conductor 240 as described above, and thus hydrogen entering the insulator 283 through the conductor 240 can also be reduced. In this manner, the transistor 200 is sealed more surely with the insulator 283, the insulator 212, and the region 241, so that entry of impurities such as hydrogen contained in the insulator 274 or the like from the outside of the insulator 283 can be reduced.

Interlayer insulating films (the insulator 216, the insulator 274, the insulator 280, and the like) and gate insulating films (the insulator 224, the insulator 250, and the like) may be deposited using a source gas with no hydrogen atoms or less hydrogen atoms to reduce the concentration of hydrogen contained in these insulating films and to reduce hydrogen entering a channel formation region of an oxide semiconductor.

A gas containing a molecule including a silicon atom is mainly used as a deposition gas for depositing the above insulating films. In order to reduce hydrogen contained in the above insulating films, the molecule including a silicon atom preferably contains as few hydrogen atoms as possible; further preferably, the molecule including a silicon atom contains no hydrogen atom. A deposition gas other than a gas containing a molecule including a silicon atom preferably includes as few hydrogen atoms as possible, further preferably includes no hydrogen atoms.

In the case where the molecule containing a silicon atom is expressed as Sir-Ry, a functional group R can be at least one of an isocyanate group (—N=C=O), a cyanate group (—O—C≡N), a cyano group (—C≡N), a diazo group (=N$_2$), an azide group (—N$_3$), a nitroso group (—NO), and a nitro group (—NO$_2$). For example, $1 \leq x \leq 3$ and $1 \leq y \leq 8$ may be employed. For example, tetraisocyanatesilane, tetracyanatesilane, tetracyanosilane, hexaisocyanatesilane, or octaisocyanatesilane can be used as the molecule including a silicon atom. The examples here each show the molecule in which functional groups of the same kind are bonded to the silicon atom; however, this embodiment is not limited to these examples. Different kinds of functional groups may be bonded to the silicon atom.

A halogen (Cl, Br, I, or F) can be used for the functional group R, for example. For example, $1 \leq x \leq 2$, and $1 \leq y \leq 6$ are employed. Examples of such a molecule including a silicon atom are tetrachlorosilane ($SiCl_4$), hexachlorodisilane ($Si_2Cl_6$), and the like. Although an example of using chlorine as the functional group is described here, halogens other than chlorine, such as bromine, iodine, or fluorine, can be used as the functional group. In addition, different kinds of halogens can be bonded to the silicon atom.

The insulator 216, the insulator 274, the insulator 280, the insulator 224, and the insulator 250 are deposited by a chemical vapor deposition (CVD) method using the gas, as described above, containing a molecule including a silicon atom. A CVD method is preferable for depositing the insulator 280, the insulator 274, and the insulator 216, which have large thicknesses, because the deposition rate of a CVD method is relatively fast.

As a CVD method, a plasma CVD (PECVD: Plasma Enhanced CVD) method using plasma or a thermal CVD (TCVD) method using heat is preferably used. In the case of using a thermal CVD method, an atmospheric pressure CVD (APCVD) method, which deposits a film in an atmospheric pressure may be used, or a low pressure CVD (LPCVD) method, which deposits a film in a pressure lower than an atmospheric pressure, may be used.

In the case where the insulator 216, the insulator 274, the insulator 280, the insulator 224, and the insulator 250 are deposited by a CVD method, an oxidizer is preferably used. For an oxidizer, a gas with no hydrogen atoms, such as $O_2$, $O_3$, NO, $NO_2$, $N_2O$, $N_2O_3$, $N_2O_4$, $N_2O_5$, CO, and $CO_2$, is preferably used.

The insulator 216, the insulator 274, the insulator 280, the insulator 224, and the insulator 250 may be deposited by an ALD (Atomic Layer Deposition) method. In an ALD method, deposition is performed by introducing a first source gas for reaction (hereinafter referred to as a precursor and also referred to as a metal precursor) and a second source gas for reaction (hereinafter referred to as a reactant and also referred to as a non-metal precursor) alternately into a chamber, and repeating the introduction of these source gases.

An ALD method makes it possible to deposit a film by a single layer of atoms when deposition is performed by alternate introduction of source gases as described above, using self-regulating characteristics of the atoms. Hence, deposition by an ALD method enables deposition of an extremely thin film, deposition on a component with a large aspect ratio, deposition of a film with a small number of defects such as pinholes, deposition with excellent coverage, and the like. Thus, an ALD method is suitable for deposition of the insulator 250 and the insulator 224.

For an ALD method, either a thermal ALD method, in which a precursor reacts with a reactant only by thermal energy, or a PEALD (Plasma Enhanced ALD) method, which uses a reactant excited by plasma, can be employed.

In the case of using an ALD method, the above gas containing a molecule including a silicon atom is used as a precursor, and the above oxidizer is used as a reactant. Thus, the amount of hydrogen that enters the insulator 216, the insulator 274, the insulator 280, the insulator 224, and the insulator 250 can be significantly reduced.

An example of a molecule including a silicon atom without a hydrogen atom is shown above; however, this embodiment is not limited to these examples. In the molecule including a silicon atom, some of the functional groups bonded to a silicon atom may be replaced with hydrogen atoms. Note that the number of hydrogen atoms in the molecule including a silicon atom is preferably smaller than that of hydrogen atoms in silane ($SiH_4$). That is, the molecule including a silicon atom preferably contains three or less hydrogen atoms per silicon atom. It is further preferable that the gas that contains the molecule including a silicon atom contain three or less hydrogen atoms per silicon atom.

As described above, at least one of the insulator 216, the insulator 274, the insulator 280, the insulator 224, and the insulator 250 is deposited by a deposition method using a gas in which hydrogen atoms are reduced or removed, whereby the amount of hydrogen contained in these insulating films can be reduced. In particular, the insulator 216, the insulator 224, the insulator 280, and the insulator 250 formed together with the oxide 230 in a region sealed with the insulator 283 and the insulator 212 are preferably deposited by the above deposition method, in which case the hydrogen concentration of the sealed region can be reduced and hydrogen entering from the outside can be reduced by the insulator 283, the insulator 212, and the region 241.

As illustrated in FIG. 1B, FIG. 1C, and FIG. 1D, the transistor 200 has a structure in which the insulator 282 and the insulator 250 are in direct contact with each other. With such a structure, oxygen contained in the insulator 280 is less likely to be absorbed into the conductor 260. Therefore, oxygen contained in the insulator 280 can be supplied to the oxide 230a and the oxide 230b efficiently through the oxide 230c; hence, oxygen vacancies in the oxide 230a and the oxide 230b can be reduced and the electrical characteristics and the reliability of the transistor 200 can be improved. In addition, entry of impurities such as hydrogen contained in the insulator 280 into the insulator 250 can be inhibited, which can further reduce the hydrogen concentration of the insulator 250 and the oxide 230. Thus, adverse effects on the electrical characteristics and the reliability of the transistor 200 can be inhibited. For the insulator 282, silicon nitride, silicon nitride oxide, aluminum oxide, or hafnium oxide can be used.

As described above, a semiconductor device that has stable electrical characteristics with a small variation in electrical characteristics and improved reliability can be provided. A semiconductor device having normally-off electrical characteristics can be provided. A semiconductor device that includes a transistor with a high on-state current can be provided. A semiconductor device that includes a transistor having excellent frequency characteristics can be provided. A semiconductor device that includes a transistor having a low off-state current can be provided.

The detailed structure of the semiconductor device including the transistor 200 of one embodiment of the present invention is described below.

The conductor 205 is provided to overlap with the oxide 230 and the conductor 260. Furthermore, the conductor 205 is preferably provided to be embedded in the insulator 214 and the insulator 216.

Here, the conductor 260 sometimes functions as a first gate (also referred to as a top gate) electrode. The conductor 205 sometimes functions as a second gate (also referred to as a bottom gate) electrode. In that case, Vth of the transistor 200 can be controlled by changing a potential applied to the conductor 205 independently of a potential applied to the conductor 260. In particular, by applying a negative potential to the conductor 205, Vth of the transistor 200 can be higher than 0 V, and the off-state current can be reduced. Thus, drain current when a potential applied to the conductor 260 is 0 V can be lower in the case where a negative potential is applied to the conductor 205 than in the case where the negative potential is not applied to the conductor 205.

As illustrated in FIG. 1A, the conductor 205 is preferably provided to be larger than a region of the oxide 230 that does not overlap with the conductor 242a and the conductor 242b. As illustrated in FIG. 1C, it is particularly preferable that the conductor 205 extend to a region outside an end portion of the oxide 230 that intersects with the channel width direction. That is, the conductor 205 and the conductor 260 preferably overlap with each other with the insulators therebetween on an outer side of the side surface of the oxide 230 in the channel width direction. A large conductor 205 can sometimes reduce local charging (referred to as charge up) in treatment using plasma of a fabrication step after the formation of the conductor 205. Note that one embodiment of the present invention is not limited thereto. The conductor 205 overlaps with at least the oxide 230 positioned between the conductor 242a and the conductor 242b.

When a bottom surface of the insulator 224 is used as a reference, the level of a bottom surface of the conductor 260 in a region where the oxide 230a and the oxide 230b do not overlap with the conductor 260 is preferably placed lower than the level of a bottom surface of the oxide 230b. The difference between the level of the bottom surface of the conductor 260 in the region where the oxide 230b does not overlap with the conductor 260 and the level of the bottom surface of the oxide 230b is set to greater than or equal to 0 nm and less than or equal to 100 nm, preferably greater than or equal to 3 nm and less than or equal to 50 nm, further preferably greater than or equal to 5 nm and less than or equal to 20 nm.

As described above, the conductor 260, which functions as the gate, covers the side surface and the top surface of the oxide 230b of the channel formation region, with the oxide 230c and the insulator 250 positioned therebetween; this structure enables the electric field of the conductor 260 to easily affect the entire oxide 230b of the channel formation region. Thus, the on-state current of the transistor 200 can be increased and the frequency characteristics of the transistor 200 can be improved. In this specification, a transistor structure in which a channel formation region is electrically surrounded by electric fields of the first gate and the second gate is referred to as a surrounded channel (S-channel) structure.

The conductor 205a is preferably a conductor that inhibits the transmission of oxygen and impurities such as water or hydrogen. For example, titanium, titanium nitride, tantalum, or tantalum nitride can be used. Moreover, the conductor

205b is preferably formed using a conductive material containing tungsten, copper, or aluminum as its main component. Although the conductor 205 is illustrated as having two layers, a multilayer structure with three or more layers may be employed.

Here, it is preferable that as an oxide semiconductor, an insulator or a conductor positioned below the oxide semiconductor, and an insulator or a conductor positioned over the oxide semiconductor, different kinds of films be successively deposited without being exposed to the air, in which case a substantially highly purified intrinsic oxide semiconductor film where the concentration of impurities (in particular, hydrogen and water) is reduced can be deposited.

At least one of the insulator 212, the insulator 214, the insulator 222, the insulator 272, the insulator 282, and the insulator 283 preferably functions as a barrier insulating film that inhibits impurities such as water and hydrogen from entering the transistor 200 from the substrate side or from above. Thus, for at least one of the insulator 212, the insulator 214, the insulator 222, the insulator 272, the insulator 282, and the insulator 283, an insulating material having a function of inhibiting diffusion of impurities such as hydrogen atoms, hydrogen molecules, water molecules, nitrogen atoms, nitrogen molecules, nitrogen oxide molecules (e.g., $N_2O$, $NO$, or $NO_2$), or copper atoms (through which the impurities are less likely to pass) is preferably used. Alternatively, it is preferable to use an insulating material having a function of inhibiting diffusion of oxygen (e.g., at least one of an oxygen atom, an oxygen molecule, and the like)(through which the above oxygen is less likely to pass).

For example, it is preferable that the insulator 212 and the insulator 283 be formed using silicon nitride, silicon nitride oxide, or the like, and the insulator 214, the insulator 222, the insulator 272, and the insulator 282 be formed using aluminum oxide, hafnium oxide, or the like. Accordingly, impurities such as water and hydrogen can be inhibited from being diffused to the transistor 200 side from the substrate side through the insulator 212 and the insulator 214. Alternatively, oxygen contained in the insulator 224 or the like can be inhibited from being diffused to the substrate side through the insulator 212 and the insulator 214. Impurities such as water and hydrogen can be inhibited from diffusing into the transistor 200 side from the insulator 274 and the like, which are provided above the insulator 272, the insulator 282, and the insulator 283. In this manner, the transistor 200 is preferably surrounded by the insulator 212, the insulator 214, the insulator 222, the insulator 272, the insulator 282, and the insulator 283 having a function of inhibiting diffusion of oxygen and impurities such as water and hydrogen.

The resistivities of the insulator 212 and the insulator 283 are preferably low in some cases. For example, by setting the resistivities of the insulator 212 and the insulator 283 to approximately $1\times10^{13}$ Ωcm, the insulator 212 and the insulator 283 can sometimes reduce charge up of the conductor 205, the conductor 242, or the conductor 260 in treatment using plasma or the like in the manufacturing process of a semiconductor device. The resistivities of the insulator 212 and the insulator 283 are preferably higher than or equal to $1\times10^{11}$ Ωcm and lower than or equal to $1\times10^{5}$ Ωcm.

The insulator 216, the insulator 280, and the insulator 274 preferably have a lower permittivity than the insulator 214. When a material with a low permittivity is used as an interlayer film, the parasitic capacitance generated between wirings can be reduced. As the insulator 216, the insulator 280, and the insulator 274, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide is used as appropriate, for example.

The insulator 222 and the insulator 224 have a function of a gate insulator.

Here, it is preferable that the insulator 224 in contact with the oxide 230 release oxygen by heating. In this specification, oxygen that is released by heating is referred to as excess oxygen in some cases. For example, silicon oxide, silicon oxynitride, or the like is used as appropriate for the insulator 224. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating is preferably used. An oxide that releases oxygen by heating is an oxide film in which the number of released oxygen molecules is greater than or equal to $1.0\times10^{11}$ molecules/cm$^3$, preferably greater than or equal to $1.0\times10^{19}$ molecules/cm$^3$, further preferably greater than or equal to $2.0\times10^{19}$ molecules/cm$^3$ or greater than or equal to $3.0\times10$ molecules/cm$^3$ in thermal desorption spectroscopy analysis (TDS analysis). Note that the temperature of the film surface in the TDS analysis is preferably within the range of 100° C. to 700° C., or 100° C. to 400° C.

The insulator 222 preferably functions as a barrier insulating film that inhibits impurities such as water and hydrogen from entering the transistor 200 from the substrate side. For example, the insulator 222 preferably has lower hydrogen permeability than the insulator 224. Surrounding the insulator 224, the oxide 230, and the like by the insulator 222 and the insulator 283 can inhibit entry of impurities such as water and hydrogen into the transistor 200 from the outside.

Furthermore, it is preferable that the insulator 222 have a function of inhibiting diffusion of oxygen (e.g., at least one of an oxygen atom, an oxygen molecule, and the like) (through which the above oxygen is less likely to pass). For example, the insulator 222 preferably has lower oxygen permeability than the insulator 224. The insulator 222 preferably has a function of inhibiting diffusion of oxygen or impurities, in which case diffusion of oxygen contained in the oxide 230 into a layer under the insulator 222 can be reduced. Moreover, the conductor 205 can be inhibited from reacting with oxygen contained in the insulator 224 and the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. When the insulator 222 is formed using such a material, the insulator 222 functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

Alternatively, for example, a single layer or stacked layers of an insulator containing what is called a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST), may be used as the insulator 222. With miniaturization and high integration of transistors, a problem such as leakage current may arise because of a thinner gate insulator. When a high-k material is used as an insulator functioning as the gate insulator, a gate potential during operation of the transistor can be lowered while the physical thickness of the gate insulator is kept.

Note that the insulator 222 and the insulator 224 may each have a stacked-layer structure of two or more layers. In such cases, without limitation to a stacked-layer structure formed of the same material, a stacked-layer structure formed of different materials may be employed.

The oxide 243 (the oxide 243a and the oxide 243b) may be positioned between the oxide 230b and the conductor 242 (the conductor 242a and the conductor 242b) which functions as the source electrode or the drain electrode. This structure in which the conductor 242 and the oxide 230 are not in contact with each other can inhibit the conductor 242 from absorbing oxygen in the oxide 230. That is, preventing oxidation of the conductor 242 can inhibit the decrease in conductivity of the conductor 242. Thus, the oxide 243 preferably has a function of inhibiting oxidation of the conductor 242.

Accordingly, the oxide 243 preferably has a function of inhibiting transmission of oxygen. It is preferable to provide the oxide 243 having a function of inhibiting transmission of oxygen between the oxide 230b and the conductor 242, which functions as the source electrode and the drain electrode, in which case the electrical resistance between the conductor 242 and the oxide 230b is reduced. Such a structure improves the electrical characteristics of the transistor 200 and the reliability of the transistor 200.

A metal oxide containing the element M may be used as the oxide 243. In particular, aluminum, gallium, yttrium, or tin is preferably used as the element M. The concentration of the element M in the oxide 243 is preferably higher than that in the oxide 230b. Alternatively, gallium oxide may be used as the oxide 243. A metal oxide such as an In-M-Zn oxide may be used as the oxide 243. Specifically, the atomic ratio of the element M to In in the metal oxide used as the oxide 243 is preferably greater than the atomic ratio of the element M to In in the metal oxide used as the oxide 230b. The thickness of the oxide 243 is preferably larger than or equal to 0.5 nm and smaller than or equal to 5 nm, further preferably larger than or equal to 1 nm and smaller than or equal to 3 nm. The oxide 243 preferably has crystallinity. In the case where the oxide 243 has crystallinity, release of oxygen from the oxide 230 can be favorably inhibited. When the oxide 243 has a hexagonal crystal structure, for example, release of oxygen from the oxide 230 can sometimes be inhibited.

Note that the oxide 243 is not necessarily provided. In that case, contact between the conductor 242 (the conductor 242a and the conductor 242b) and the oxide 230 may make oxygen in the oxide 230 diffuse into the conductor 242, resulting in oxidation of the conductor 242. It is highly possible that oxidation of the conductor 242 lowers the conductivity of the conductor 242. Note that diffusion of oxygen in the oxide 230 into the conductor 242 can be rephrased as absorption of oxygen in the oxide 230 by the conductor 242.

When oxygen in the oxide 230 diffuses to the conductor 242 (the conductor 242a and the conductor 242b), another layer is sometimes formed between the conductor 242a and the oxide 230b, and between the conductor 242b and the oxide 230b. The layer contains more oxygen than the conductor 242 does and thus the layer presumably has an insulating property. In this case, a three-layer structure of the conductor 242, the layer, and the oxide 230b can be regarded as a three-layer structure of a metal, an insulator, and a semiconductor and is sometimes referred to as a MIS (Metal-Insulator-Semiconductor) structure or a diode junction structure having an MIS structure as its main part.

The above layer is not necessarily formed between the conductor 242 and the oxide 230b, but the layer may be formed between the conductor 242 and the oxide 230c or formed between the conductor 242 and the oxide 230b and between the conductor 242 and the oxide 230c.

The conductor 242 (the conductor 242a and the conductor 242b) functioning as the source electrode and the drain electrode is provided over the oxide 243. The thickness of the conductor 242 is greater than or equal to 1 nm and less than or equal to 50 nm, preferably greater than or equal to 2 nm and less than or equal to 25 nm, for example.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

The insulator 272 is provided in contact with a top surface of the conductor 242 and preferably functions as a barrier layer. With this structure, absorption of excess oxygen contained in the insulator 280 by the conductor 242 can be inhibited. Furthermore, by inhibiting oxidation of the conductor 242, an increase in the contact resistance between the transistor 200 and a wiring can be inhibited. Consequently, the transistor 200 can have favorable electrical characteristics and reliability.

Thus, the insulator 272 preferably has a function of inhibiting diffusion of oxygen. For example, the insulator 272 preferably has a function of further inhibiting diffusion of oxygen as compared to the insulator 280. An insulator containing an oxide of one or both of aluminum and hafnium is preferably deposited as the insulator 272, for example. An insulator containing aluminum nitride may be used as the insulator 272, for example.

Note that although the insulator 272 is in contact with only the top surface of the conductor 242 in FIG. 1B, FIG. 1C, and FIG. 1D, this embodiment is not limited thereto. For example, the insulator 272 may be in contact with the top surface and the side surface of the conductor 242, the side surface of the oxide 243, a side surface of the oxide 230b, and a side surface of the oxide 230a.

The insulator 250 functions as a gate insulator. The insulator 250 is preferably positioned in contact with the top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

Like the insulator 224, the insulator 250 is preferably formed using an insulator from which oxygen is released by heating. When an insulator from which oxygen is released by heating is provided as the insulator 250 in contact with the top surface of the oxide 230c, oxygen can be efficiently supplied to the channel formation region of the oxide 230b. Furthermore, as in the insulator 224, the concentration of impurities such as water and hydrogen in the insulator 250 is preferably reduced. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 to the conductor 260. That is, a reduction in the amount of oxygen supplied to the oxide 230 can be inhibited. In addition, oxidation of the conductor 260 due to oxygen from the insulator 250 can be inhibited.

The metal oxide has a function of part of the gate insulator in some cases. Therefore, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, it is possible to use a metal oxide containing one kind or two or more kinds selected from hafnium, aluminum, gallium, yttrium, zirconium, tungsten, titanium, tantalum, nickel, germanium, magnesium, and the like. It is particularly preferable to use an insulator containing an oxide of one or both of aluminum and hafnium, such as aluminum oxide, hafnium oxide, or an oxide containing aluminum and hafnium (hafnium aluminate).

Alternatively, the metal oxide has a function of part of the gate in some cases. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate, a conductive material containing oxygen and a metal element contained in a metal oxide where the channel is formed. Alternatively, a conductive material containing the above metal element and nitrogen may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

Although the conductor 260 has a two-layer structure in FIG. 1, a single-layer structure or a stacked-layer structure of three or more layers may be employed.

For the conductor 260a, it is preferable to use a conductive material having a function of inhibiting diffusion of impurities such as hydrogen atoms, hydrogen molecules, water molecules, nitrogen atoms, nitrogen molecules, nitrogen oxide molecules ($N_2O$, NO, $NO_2$, and the like), and copper atoms. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, ruthenium oxide, or the like is preferably used.

Moreover, a conductive material containing tungsten, copper, or aluminum as its main component is preferably used for the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of any of the above conductive materials and titanium or titanium nitride.

The insulator 280 preferably contains, for example, silicon oxide, silicon oxynitride, silicon nitride oxide, silicon oxide to which fluorine is added, silicon oxide to which carbon is added, silicon oxide to which carbon and nitrogen are added, porous silicon oxide, or the like. As described above, the use of a silicon-based oxide as the insulator 280 facilitates solid-phase nitridation of the region 241 and the region 245 through the above nitrogen plasma treatment. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable. The insulator 280 may have a stacked-layer structure of the above materials, for example, a structure in which silicon oxynitride deposited by a CVD method is stacked over silicon oxide deposited by a sputtering method. Furthermore, silicon nitride may be stacked thereover.

The concentration of impurities such as water and hydrogen in the insulator 280 is preferably reduced. In addition, a top surface of the insulator 280 may be planarized.

Note that although the region 245 is formed in the vicinity of an interface of the insulator 280 with the insulator 283 in FIG. 1B, FIG. 1C, and FIG. 1D, this embodiment is not limited thereto. A structure in which the region 245 is not formed in the insulator 280 may be employed in the case where a hydrogen atmosphere is not excessively used in the deposition of the insulator 283, for example. Similarly, the structure in which the region 245 is not formed in the insulator 224 and the insulator 216, either may be employed. In this case, an insulating film having a high hydrogen barrier property and being similar to the insulator 272 or the like is preferably formed to cover the insulator 216, the insulator 222, the insulator 224, the insulator 280, and the insulator 282 instead of formation of the region 245. As such an insulating film having a high hydrogen barrier property, a silicon nitride film or a silicon nitride oxide film is used, for example. In the case where a silicon nitride film is used, deposition may be performed by a PEALD method, a PECVD method, or the like using the above gas in which hydrogen atoms are reduced or removed. In the case of using a PEALD method, a nitrogen radical obtained by making a nitrogen gas in a plasma state is used as a reactant.

The insulator 282 and the insulator 283 preferably function as barrier insulating films that inhibit impurities such as water and hydrogen from entering the insulator 280 from above. The insulator 282 and the insulator 283 preferably function as barrier insulating films that inhibit transmission of oxygen. As insulator 282 and the insulator 283, for example, an insulator such as aluminum oxide, silicon nitride, or silicon nitride oxide may be used. The insulator 282 may be formed using aluminum oxide, which has high barrier property against oxygen, and the insulator 283 may be formed using silicon nitride or silicon nitride oxide, which has high barrier property against hydrogen, for example.

The insulator 274 functioning as an interlayer film is preferably provided over the insulator 283. In the insulator 274, as in the insulator 224 and the like, the concentration of impurities such as water and hydrogen in the film is preferably lowered.

For the conductor 240a and the conductor 240b, a conductive material containing tungsten, copper, or aluminum as its main component is preferably used. The conductor 240a and the conductor 240b may each have a stacked-layer structure. Note that the conductor 240a and the conductor 240b each have a circular shape in the top view in FIG. 1A; however, the shapes of the conductors are not limited thereto. For example, in the top view, the conductor 240a and the conductor 240b may each have an almost circular shape such as an elliptical shape, a polygonal shape such as a quadrangular shape, or a polygonal shape such as a quadrangular shape with rounded corners.

In the case where the conductor 240 has a stacked-layer structure, a conductive material having a function of inhibiting passage of oxygen and impurities such as water and hydrogen is preferably used for a conductor in contact with the region 241. For example, tantalum, tantalum nitride, titanium, titanium nitride, ruthenium, ruthenium oxide, or the like is preferably used. A single layer or a stacked layer of the conductive material having a function of inhibiting passage of oxygen and impurities such as water and hydrogen may be used.

With the use of the conductive material, entry of impurities diffused from the insulator 280 and the like, such as water and hydrogen, into the oxide 230 through the conductor 240a and the conductor 240b can be further reduced. In addition, oxygen added to the insulator 280 can be prevented from being absorbed by the conductor 240a and the conductor 240b. The region 241 has a high barrier property against oxygen; thus, absorption of oxygen by the conductor 240a and the conductor 240b can be further reduced.

The conductor 246 (the conductor 246a and the conductor 246b) functioning as a wiring may be provided in contact with a top surface of the conductor 240a and a top surface of the conductor 240b. The conductor 246 is preferably formed using a conductive material containing tungsten, copper, or aluminum as its main component. Furthermore, the conductor may have a stacked-layer structure and may be a stack of titanium or titanium nitride and any of the above conductive materials, for example. Note that the conductor may be formed to be embedded in an opening provided in an insulator.

<Constituent Material of Semiconductor Device>

Constituent materials that can be used for the semiconductor device are described below.

<Substrate>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon, germanium, or the like as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<Insulator>

Examples of an insulator include an oxide, a nitride, an oxynitride, a nitride oxide, a metal oxide, a metal oxynitride, and a metal nitride oxide, each of which has an insulating property.

As miniaturization and high integration of transistors progress, for example, a problem such as leakage current may arise because of a thinner gate insulator. When a high-k material is used as the insulator functioning as a gate insulator, the voltage during operation of the transistor can be lowered while the physical thickness of the gate insulator is maintained. In contrast, when a material with a low relative permittivity is used as the insulator functioning as an interlayer film, parasitic capacitance generated between wirings can be reduced. Thus, a material is preferably selected depending on the function of an insulator.

Examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon oxide to which fluorine is added, silicon oxide to which carbon is added, silicon oxide to which carbon and nitrogen are added, porous silicon oxide, and a resin.

When a transistor using an oxide semiconductor is surrounded by an insulator having a function of inhibiting transmission of oxygen and impurities such as hydrogen, the electrical characteristics of the transistor can be stable. As the insulator having a function of inhibiting transmission of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

The insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be filled.

<Conductor>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used as the channel formation region of the transistor, a stacked-layer structure in which a material containing the above metal element and a conductive material containing oxygen are combined is preferably used as the conductor functioning as the gate. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

<Metal Oxide>

As the oxide 230, a metal oxide functioning as an oxide semiconductor is preferably used. A metal oxide that can be used as the oxide 230 according to the present invention is described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of the non-single-crystal oxide semiconductors include a CAAC-OS, a polycrystalline oxide semiconductor, an nc-OS, an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary cannot be observed in the CAAC-OS; thus, it can be said that a reduction in electron mobility due to the crystal grain boundary is less likely to occur. Furthermore, entry of impurities, formation of defects, or the like might decrease the crystallinity of a metal oxide, which means that the CAAC-OS is a metal oxide having small amounts of impurities and defects (e.g., oxygen vacancies (Vo)). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above described nanocrystals) rather than larger crystals (here, crystals with a size of several millimeters or several centimeters).

An a-like OS is a metal oxide having a structure between those of the nc-OS and an amorphous oxide semiconductor. The a-like OS contains a void or a low-density region. That is, the a-like OS has low crystallinity compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

Note that there is no particular limitation on a structure of an oxide semiconductor (metal oxide) in the semiconductor device of one embodiment of the present invention; however, the oxide semiconductor preferably has crystallinity. For example, the oxide 230 can have a CAAC-OS structure and the oxide 243 can have a hexagonal crystal structure. The semiconductor device can have high reliability when the oxide 230 and the oxide 243 have the above crystal structures. Moreover, the oxide 230a, the oxide 230c, and the oxide 243 can have substantially the same composition.

[Impurities]

Here, the influence of each impurity in the metal oxide is described.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide (the concentration obtained by SIMS) is lower than or equal to $1 \times 10^{18}$ atoms/cm$^3$, preferably lower than or equal to $2 \times 10^{16}$ atoms/cm$^3$.

Hydrogen contained in a metal oxide reacts with oxygen bonded to a metal atom to be water, and thus forms an oxygen vacancy in some cases. When hydrogen enters the oxygen vacancy, an electron which is a carrier is generated in some cases. Furthermore, in some cases, bonding of part of hydrogen to oxygen bonded to a metal atom causes generation of an electron serving as a carrier. Thus, a transistor using a metal oxide containing hydrogen is likely to have normally-on characteristics. Accordingly, hydrogen in the metal oxide is preferably reduced as much as possible.

Note that as a metal oxide used as a semiconductor of a transistor, a thin film having high crystallinity is preferably used. With the use of the thin film, the stability or reliability of the transistor can be improved. Examples of the thin film include a thin film of a single-crystal metal oxide and a thin film of a polycrystalline metal oxide. However, to form the thin film of a single-crystal metal oxide or the thin film of a polycrystalline metal oxide over a substrate, a high-temperature process or a laser heating process is needed. Thus, manufacturing cost is increased, and throughput is decreased.

<Method for Manufacturing Semiconductor Device>

Next, a method for manufacturing a semiconductor device including the transistor 200 according to the present invention, which is illustrated in FIG. 1, is described with reference to FIG. 2 to FIG. 14. In FIG. 2 to FIG. 14, A in each drawing is a top view. Moreover, B of each drawing is a cross-sectional view corresponding to a portion indicated by dashed-dotted line A1-A2 in A, and is also a cross-sectional view of the transistor 200 in the channel length direction. Furthermore, C of each drawing is a cross-sectional view corresponding to a portion indicated by dashed-dotted line A3-A4 in A, and is also a cross-sectional view of the transistor 200 in the channel width direction. Furthermore, D of each drawing is a cross-sectional view corresponding to a portion indicated by the dashed-dotted line A5-A6 in A. Note that for simplification of the drawing, some components are not illustrated in the top view of A of each drawing.

First, a substrate (not illustrated) is prepared, and the insulator 212 is deposited over the substrate. The insulator 212 can be deposited by a sputtering method, a chemical vapor deposition (CVD) method, a molecular beam epitaxy (MBE) method, a pulsed laser deposition (PLD) method, an atomic layer deposition (ALD) method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used. In addition, according to the pressure in deposition, CVD methods can be classified into an atmospheric pressure CVD (APCVD) method, in which deposition is performed under the atmospheric pressure, a low pressure CVD (LPCVD) method, in which deposition is performed under pressure lower than the atmospheric pressure, and the like.

By a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

As the ALD method, a thermal ALD method, in which a precursor and a reactant react with each other only by a thermal energy, a PEALD (Plasma Enhanced ALD) method, in which a reactant excited by plasma is used, and the like can be used.

In an ALD method, one atomic layer can be deposited at a time using self-regulating characteristics of atoms. Thus, an ALD method has advantages such as deposition of an extremely thin film, deposition on a component with a high aspect ratio, deposition of a film with a small number of defects such as pinholes, deposition with good coverage, and low-temperature deposition. In the PEALD method, the use of plasma is sometimes preferable because deposition at lower temperature is possible. Note that a precursor used in the ALD method sometimes contains impurities such as carbon. Thus, in some cases, a film provided by the ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is deposited by reaction at a surface of an object to be processed. Thus, a CVD method and an ALD method are deposition methods that enable favorable step coverage almost regardless of the shape of an object to be processed. In particular, an ALD method has excellent step coverage and excellent thickness uniformity and thus is suitable for covering a surface of an opening with a high aspect ratio, for example. On the other hand, an ALD method has a relatively low deposition rate, and thus is preferably used in combination with another deposition method with a high deposition rate, such as a CVD method, in some cases.

Each of a CVD method and an ALD method enables the composition of a film that is to be deposited to be controlled with a flow rate ratio of source gases. For example, by each of a CVD method and an AUD method, a film with a certain composition can be deposited depending on the flow rate ratio of the source gases. Moreover, with each of a CVD method and an ALD method, by changing the flow rate ratio of the source gases while depositing the film, a film whose composition is continuously changed can be deposited. In the case where the film is deposited while changing the flow rate ratio of the source gases, as compared to the case where the film is deposited using a plurality of deposition chambers, the time taken for the deposition can be shortened because the time taken for transfer and pressure adjustment is omitted. Thus, the productivity of the semiconductor device can be increased in some cases.

In this embodiment, for the insulator 212, silicon nitride is deposited by a CVD method. When an insulator through which copper is less likely to pass, such as silicon nitride, is used for the insulator 212 in such a manner, even in the case where a metal that is likely to diffuse, such as copper, is used for a conductor in a layer (not illustrated) below the insulator 212, diffusion of the metal into a layer above the insulator 212 through the insulator 212 can be inhibited. The use of an insulator through which impurities such as water and hydrogen are less likely to pass, such as silicon nitride, can inhibit diffusion of impurities such as water and hydrogen from a layer under the insulator 212.

Next, the insulator 214 is deposited over the insulator 212. The insulator 214 can be deposited by a sputtering method, a CVD method, an MBE method, a PLD method, an ALD method, or the like. In this embodiment, aluminum oxide is used for the insulator 214.

Next, the insulator 216 is deposited over the insulator 214. The insulator 216 can be deposited by a sputtering method, a CVD method, an MBE method, a PLD method, an ALD method, or the like. In this embodiment, silicon oxide or silicon oxynitride is used for the insulator 216. The insulator 216 is preferably deposited by the deposition method using the gas in which hydrogen atoms are reduced or removed. Thus, the hydrogen concentration of the insulator 216 can be reduced.

Then, an opening reaching the insulator 214 is formed in the insulator 216. A groove and a slit, for example, are included in the category of the opening. A region where an opening is formed may be referred to as an opening portion. Wet etching can be used for the formation of the opening; however, dry etching is preferably used for microfabrication. As the insulator 214, it is preferable to select an insulator that functions as an etching stopper film used in forming the groove by etching the insulator 216. For example, in the case where a silicon oxide film or a silicon oxynitride film is used as the insulator 216 in which the groove is to be formed, a silicon nitride film, an aluminum oxide film, or a hafnium oxide film is preferably used as the insulator 214.

After the formation of the opening, a conductive film to be the conductor 205a is deposited. The conductive film preferably includes a conductor that has a function of inhibiting transmission of oxygen. For example, tantalum nitride, tungsten nitride, or titanium nitride can be used. Alternatively, a stacked-layer film with tantalum, tungsten, titanium, molybdenum, aluminum, copper, or a molybdenum-tungsten alloy can be used. The conductive film to be the conductor 205a can be deposited by a sputtering method, a CVD method, an MBE method, a PLD method, an ALD method, or the like.

In this embodiment, the conductive film to be the conductor 205a has a multilayer structure. First, tantalum nitride is deposited by a sputtering method, and titanium nitride is stacked over the tantalum nitride. When such metal nitrides are used for a lower layer of the conductor 205b, even in the case where a metal that is likely to diffuse, such as copper, is used for a conductive film to be a conductor 205b described below, outward diffusion of the metal from the conductor 205a can be inhibited.

Next, a conductive film to be the conductor 205b is deposited. The conductive film can be deposited by a plating method, a sputtering method, a CVD method, an MBE method, a PLD method, an ALD method, or the like. In this embodiment, for the conductive film to be the conductor 205b, a low-resistance conductive material such as copper is deposited.

Next, CMP treatment (Chemical Mechanical Polishing) is performed, thereby removing part of the conductive film to be the conductor 205a and part of the conductive film to be the conductor 205b to expose the insulator 216. As a result, the conductor 205a and the conductor 205b remain only in the opening portion. Thus, the conductor 205 whose top surface is flat can be formed. Note that the insulator 216 is partly removed by the CMP treatment in some cases (see FIG. 2).

Although the conductor 205 is embedded in the opening in the insulator 216 in the above description, this embodiment is not limited to this structure. For example, the surface of the conductor 205 may be exposed in the following manner: the conductor 205 is formed over the insulator 214, the insulator 216 is deposited over the conductor 205, and the insulator 216 is subjected to the CMP treatment so that the insulator 216 is partly removed.

Next, the insulator 222 is deposited over the insulator 216 and the conductor 205. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Next, the insulator 224 is deposited over the insulator 222. The insulator 224 can be deposited by a sputtering method, a CVD method, an MBE method, a PLD method, an ALD method, or the like. In this embodiment, silicon oxide or silicon oxynitride is used for the insulator 224. The insulator 224 is preferably deposited by the deposition method using the above gas in which hydrogen atoms are reduced or removed. Thus, the concentration of hydrogen in the insulator 224 can be reduced. As described above, the hydrogen concentration of the insulator 224 is preferably reduced because the insulator 224 is in contact with the oxide 230a in a later step.

Sequentially, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen atmosphere, an inert gas atmosphere, or an atmosphere containing an oxidizing gas at ppm or more, 1% or more, or 10% or more. Alternatively, the heat treatment may be performed under reduced pressure. Alternatively, the heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen.

In this embodiment, treatment is performed at 400° C. in a nitrogen atmosphere for one hour, and treatment is successively performed at 400° C. in an oxygen atmosphere for one hour. By the heat treatment, impurities such as water and hydrogen contained in the insulator 224 can be removed.

Heat treatment may be performed after the insulator 222 is deposited. For the heat treatment, the above-described heat treatment conditions can be used.

Here, plasma treatment containing oxygen may be performed under reduced pressure so that an excess-oxygen region can be formed in the insulator 224. For the plasma treatment with oxygen, an apparatus including a power source for generating high-density plasma using a microwave is preferably used, for example. Alternatively, a power source may be provided to apply a high-frequency wave such as RF to the substrate side. The use of high-density plasma enables high-density oxygen radicals to be produced, and RF application to the substrate side allows the oxygen radicals generated by the high-density plasma to be efficiently introduced into the insulator 224. Alternatively, after plasma treatment with an inert gas is performed using this apparatus, plasma treatment with oxygen may be performed to compensate for released oxygen. Note that impurities such as water and hydrogen contained in the insulator 224 can be removed by selecting the conditions for the plasma treatment appropriately. In that case, the heat treatment does not need to be performed.

Here, aluminum oxide may be deposited over the insulator 224 by a sputtering method and the aluminum oxide may be subjected to CMP until the insulator 224 is reached. The CMP treatment can planarize the surface of the insulator 224 and smooth the surface of the insulator 224. When the CMP treatment is performed on the aluminum oxide placed over the insulator 224, it is easy to detect the endpoint of CMP. Although part of the insulator 224 is polished by CMP and the thickness of the insulator 224 is reduced in some cases, the thickness can be adjusted when the insulator 224 is deposited. Planarizing and smoothing the surface of the insulator 224 can prevent deterioration of the coverage with an oxide deposited later and a decrease in the yield of the semiconductor device in some cases. The deposition of aluminum oxide over the insulator 224 by a sputtering method is preferred because oxygen can be added to the insulator 224.

Next, an oxide film 230A and an oxide film 230B are deposited in this order over the insulator 224 (see FIG. 2). Note that the oxide films are preferably deposited successively without being exposed to an air environment. By the deposition without exposure to the air, impurities or moisture from the atmospheric environment can be prevented from being attached onto the oxide film 230A and the oxide film 230B, so that the vicinity of the interface between the oxide film 230A and the oxide film 230B can be kept clean.

The oxide film 230A and the oxide film 230B can be deposited by a sputtering method, a CVD method, an MBE method, a PLD method, an ALD method, or the like.

For example, in the case where the oxide film 230A and the oxide film 230B are deposited by a sputtering method, oxygen or a mixed gas of oxygen and a rare gas is used as a sputtering gas. Increasing the proportion of oxygen contained in the sputtering gas can increase the amount of excess oxygen in the deposited oxide films. In the case where the above oxide films are deposited by a sputtering method, a target of the above-described In-M-Zn oxide can be used.

In particular, when the oxide film 230A is deposited, part of oxygen contained in the sputtering gas is supplied to the insulator 224 in some cases. Therefore, the proportion of oxygen contained in the sputtering gas for the oxide film 230A is preferably 70% or higher, further preferably 80% or higher, still further preferably 100%.

In the case where the oxide film 230B is formed by a sputtering method, when the proportion of oxygen contained in the sputtering gas is higher than or equal to 1% and lower than or equal to 30%, preferably higher than or equal to 5% and lower than or equal to 20% during the deposition, an oxygen-deficient oxide semiconductor is formed. A transistor in which an oxygen-deficient oxide semiconductor is used for its channel formation region can have relatively high field-effect mobility. Furthermore, when the deposition is performed while the substrate is heated, the crystallinity of the oxide film can be improved. Note that one embodiment of the present invention is not limited thereto. In the case where the oxide film 230B is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained.

In this embodiment, the oxide film 230A is deposited by a sputtering method using a target with In:Ga:Zn=1:1:0.5 [atomic ratio] (2:2:1 [atomic ratio]) or 1:3:4 [atomic ratio]. The oxide film 230B is deposited by a sputtering method using a target with In:Ga:Zn=4:2:4.1 [atomic ratio] or 1:1:1 [atomic ratio]. Note that each of the oxide films is formed to have characteristics required for the oxide 230 by selecting the deposition condition and the atomic ratio as appropriate.

Next, heat treatment may be performed. For the heat treatment, the above-described heat treatment conditions can be used. Through the heat treatment, impurities such as water and hydrogen in the oxide film 230A and the oxide film 230B can be removed, for example. In this embodiment, treatment is performed at 400° C. in a nitrogen atmosphere for one hour, and treatment is successively performed at 400° C. in an oxygen atmosphere for one hour.

Next, an oxide film 243A is deposited over the oxide film 230B (see FIG. 2). The oxide film 243A can be deposited by a sputtering method, a CVD method, an MBE method, a PLD method, an ALD method, or the like. The atomic ratio of Ga to In in the oxide film 243A is preferably greater than the atomic ratio of Ga to In in the oxide film 230B. In this embodiment, the oxide film 243A is deposited by a sputtering method using a target with In:Ga:Zn=1:3:4 [atomic ratio].

Then, a conductive film 242A is deposited over the oxide film 243A (see FIG. 2). The conductive film 242A can be deposited by a sputtering method, a CVD method, an MBE method, a PLD method, an ALD method, or the like.

Next, an insulating film 272A is deposited over the conductive film 242A (see FIG. 2). The insulating film 272A can be deposited by a sputtering method, a CVD method, an MBE method, a PLD method, an ALD method, or the like. As the insulating film 272A, an insulating film having a function of inhibiting transmission of oxygen is preferably used. For example, aluminum oxide, silicon nitride, silicon oxide, or gallium oxide may be deposited by a sputtering method or an ALD method.

Next, the oxide film 230A, the oxide film 230B, the oxide film 243A, the conductive film 242A, and the insulating film 272A are processed into island shapes by a lithography method to form the oxide 230a, the oxide 230b, an oxide layer 243B, a conductor layer 242B, and an insulator layer 272B (see FIG. 3). Here, the oxide 230a, the oxide 230b, the oxide layer 243B, the conductor layer 242B, and the insulator layer 272B are formed to at least partly overlap with the conductor 205. A dry etching method or a wet etching method can be used for the processing. Processing by a dry etching method is suitable for microfabrication. Note that in this step, the thickness of a region of the insulator 224 which does not overlap with the oxide 230a becomes small in some cases.

Note that in the lithography method, first, a resist is exposed to light through a mask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask is formed by, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used instead of the resist mask. In the case where a hard mask is used, a hard mask with a desired shape can be formed by forming an insulating film or a conductive film to be the hard mask material over the conductive film 242A, forming a resist mask thereover, and then etching the hard mask material. The etching of the conductive film 242A and the like may be performed after removing the resist mask or with the resist mask remaining. In the latter case, the resist mask sometimes disappears during the etching. The hard mask may be removed by etching after the etching of the conductive film 242A and the like. Meanwhile, the hard mask is not necessarily removed when the hard mask material does not affect subsequent steps or can be utilized in the subsequent steps.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

Figure 3A:
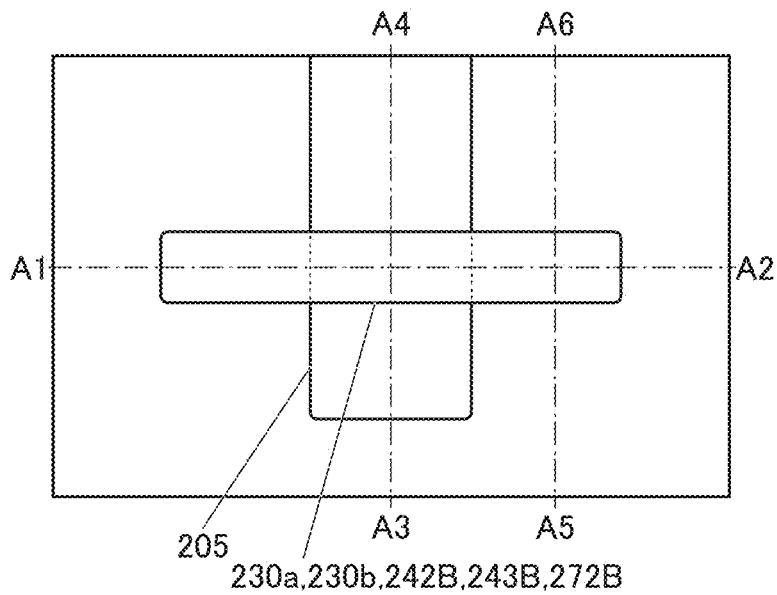
FIG. 3A, FIG. 3B, FIG. 3C, and FIG. 3D are a top view and cross-sectional views illustrating a method for manufacturing a semiconductor device of one embodiment of the present invention.
Figure 3C:
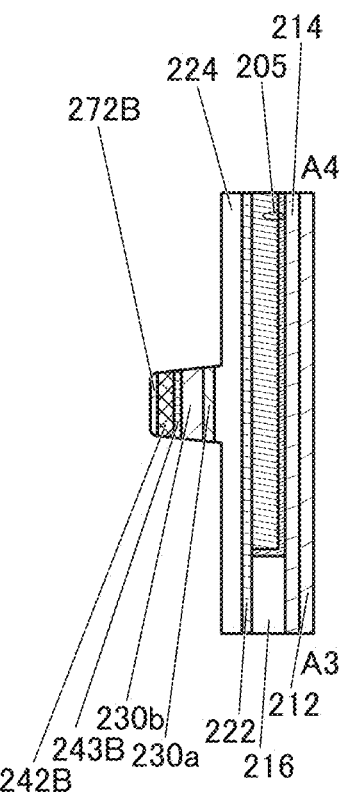
Figure 3B:
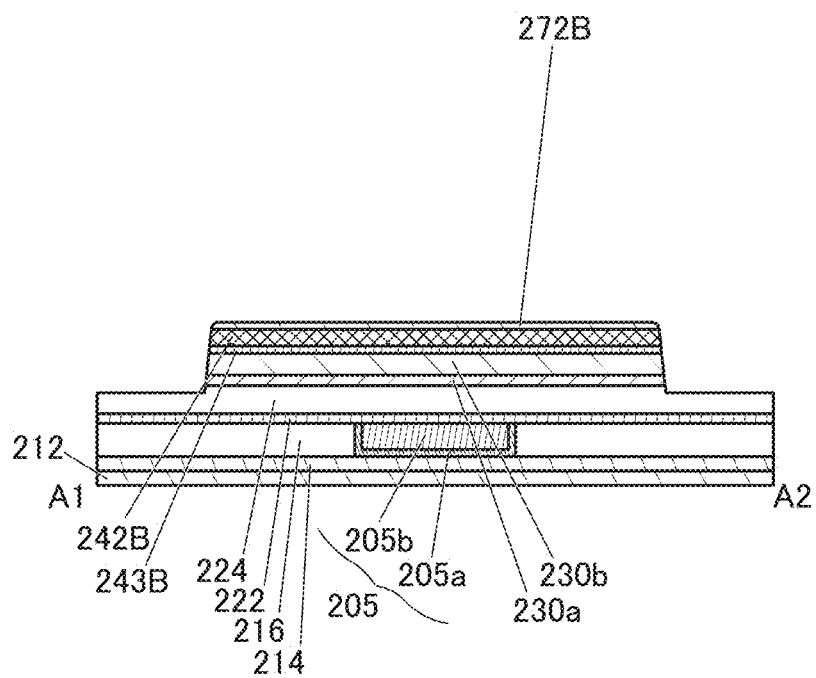
Figure 3D:
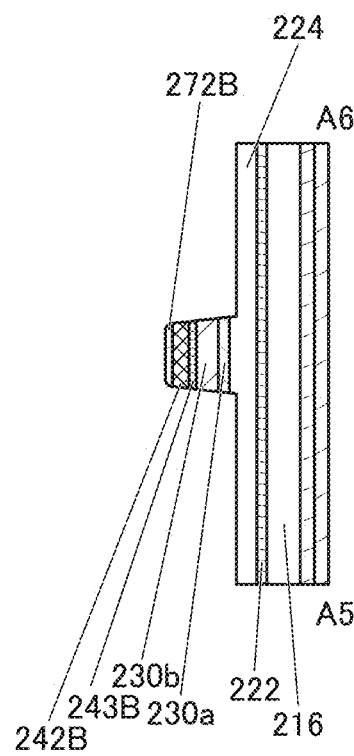
Figure 4A:
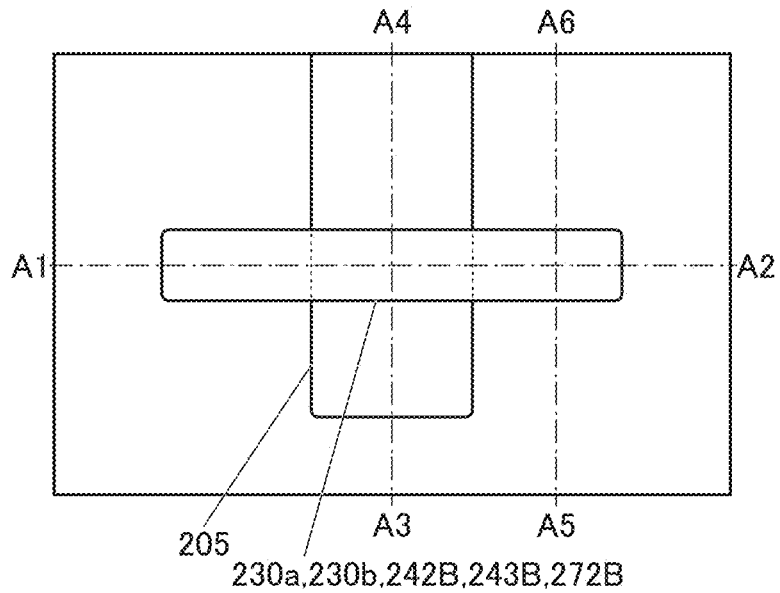
FIG. 4A, FIG. 4B, FIG. 4C, and FIG. 4D are a top view and cross-sectional views illustrating a method for manufacturing a semiconductor device of one embodiment of the present invention.
Figure 4C:
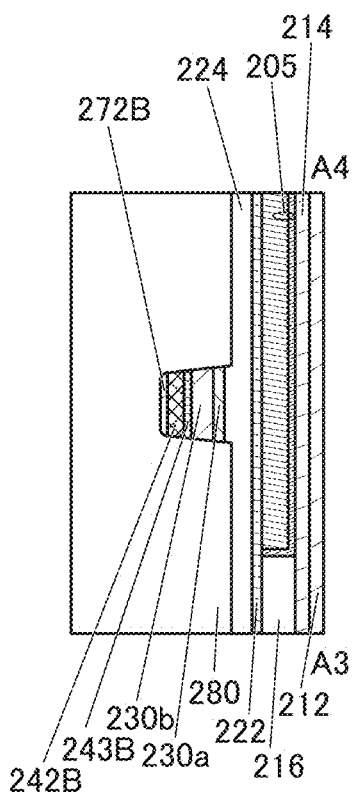
Figure 4B:
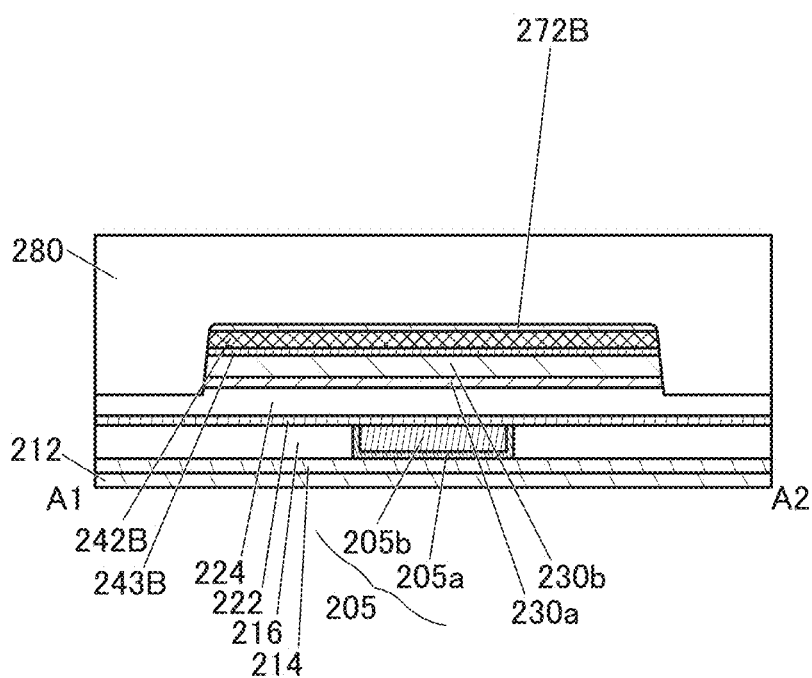
Figure 4D:
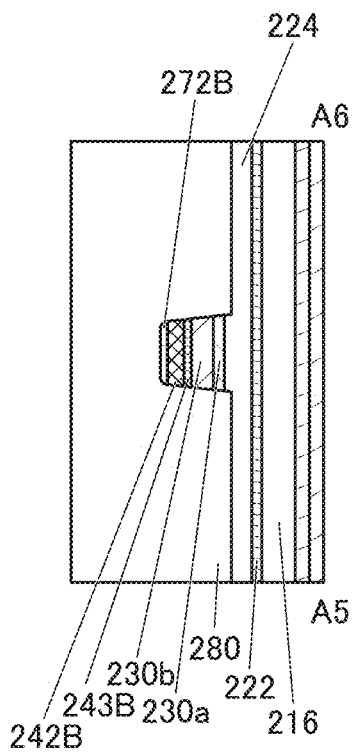
Figure 5A:
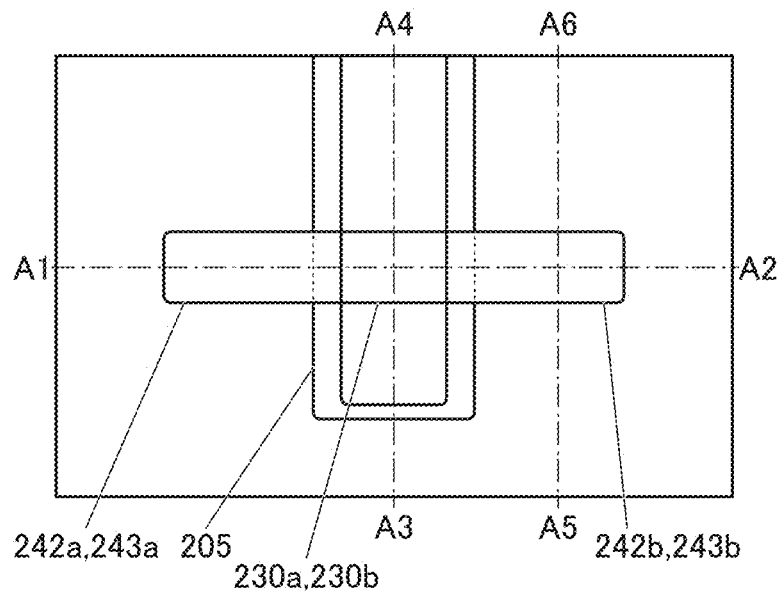
FIG. 5A, FIG. 5B, FIG. 5C, and FIG. 5D are a top view and cross-sectional views illustrating a method for manufacturing a semiconductor device of one embodiment of the present invention.
Figure 5C:
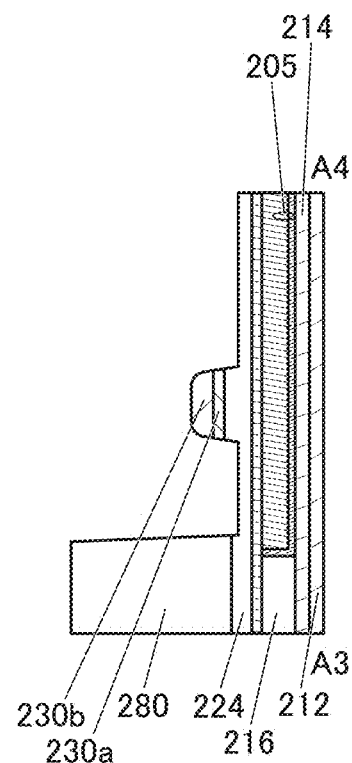
Figure 5B:
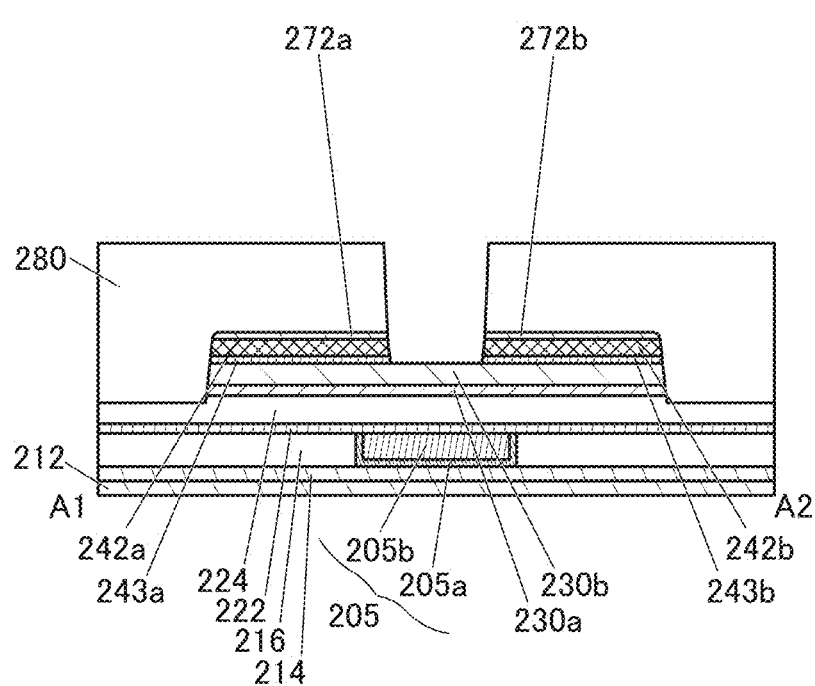
Figure 5D:
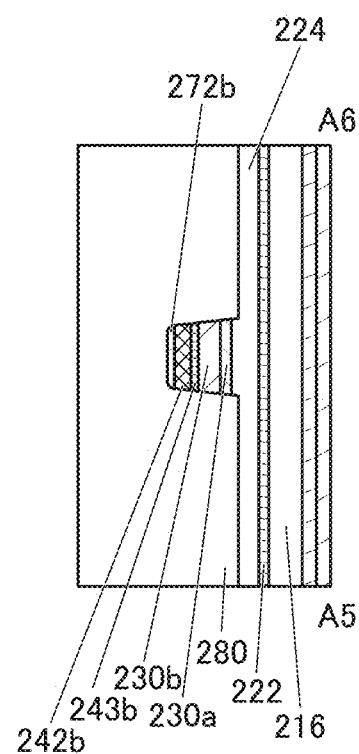
Figure 6A:
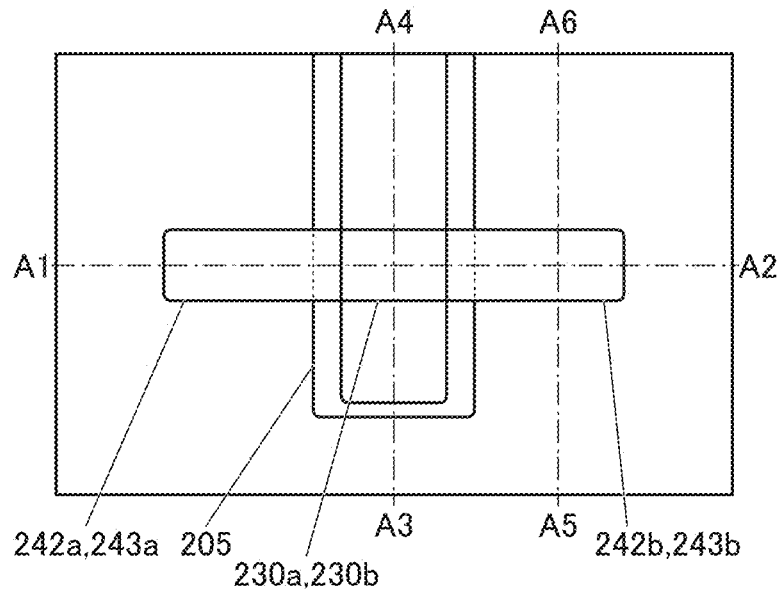
FIG. 6A, FIG. 6B, FIG. 6C, and FIG. 6D are a top view and cross-sectional views illustrating a method for manufacturing a semiconductor device of one embodiment of the present invention.
Figure 6C:
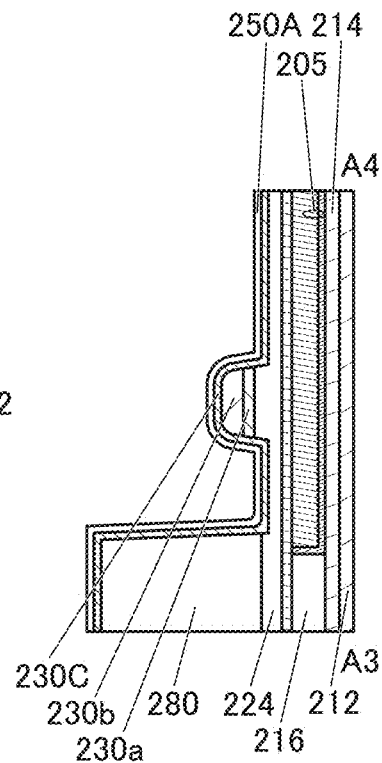
Figure 6B:
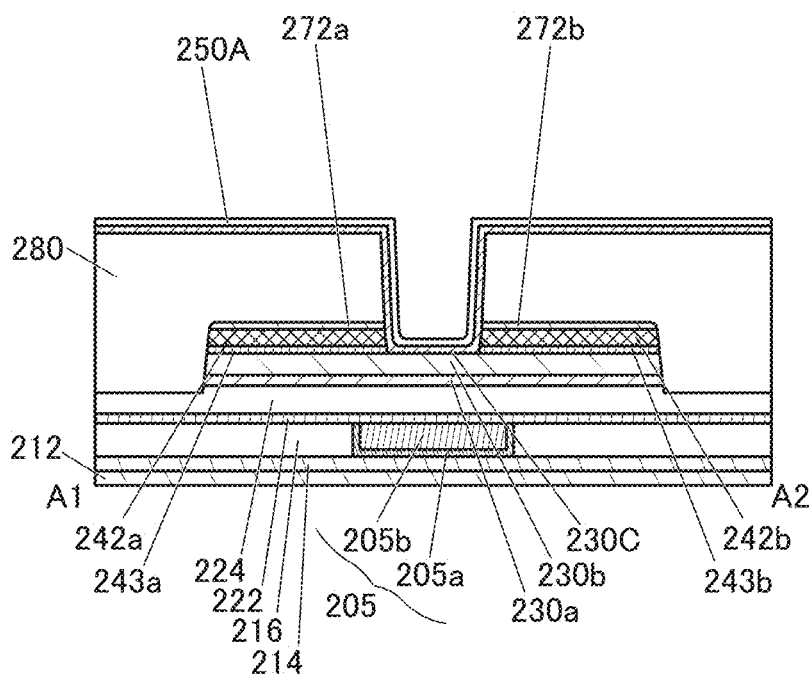
Figure 6D:
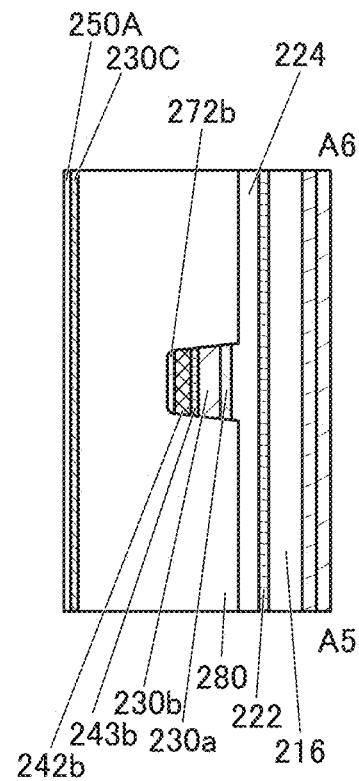
Figure 7A:
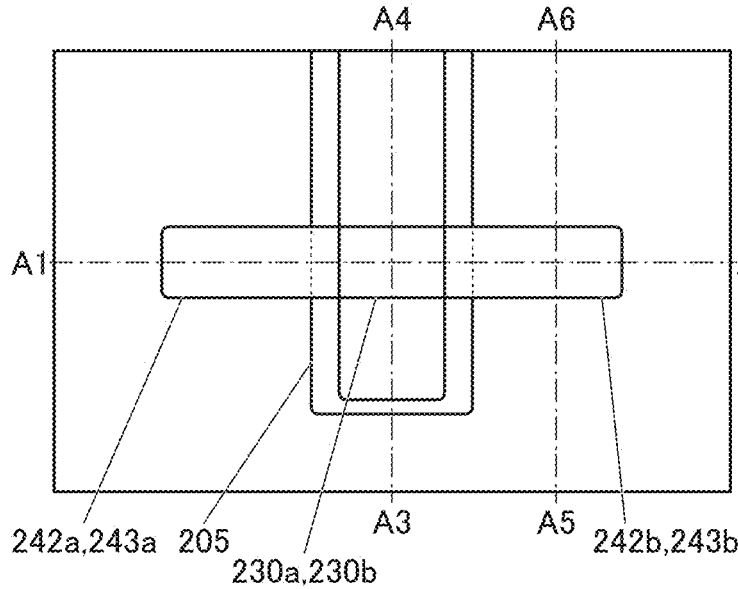
FIG. 7A, FIG. 7B, FIG. 7C, and FIG. 7D are a top view and cross-sectional views illustrating a method for manufacturing a semiconductor device of one embodiment of the present invention.
Figure 7C:
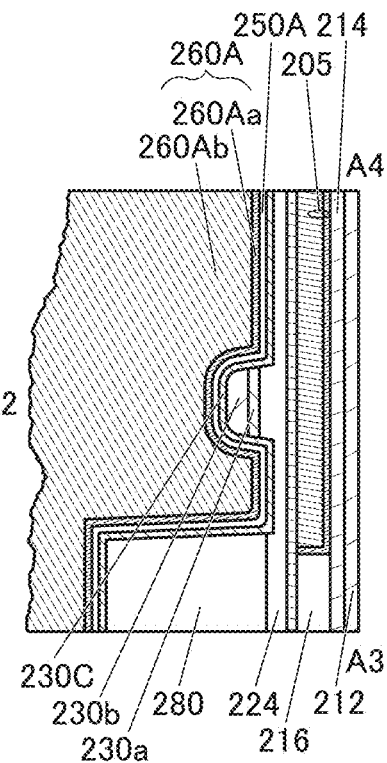
Figure 7B:
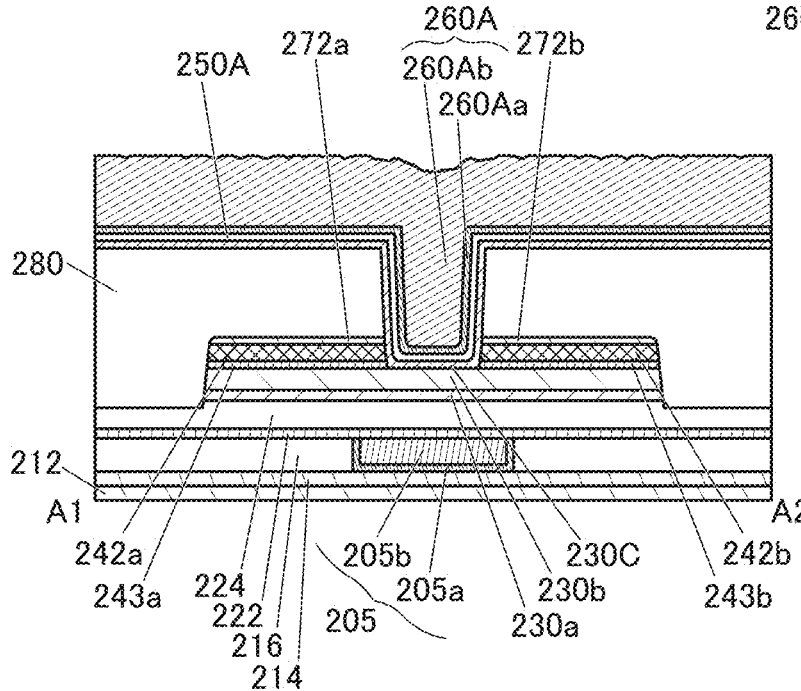
Figure 7D:
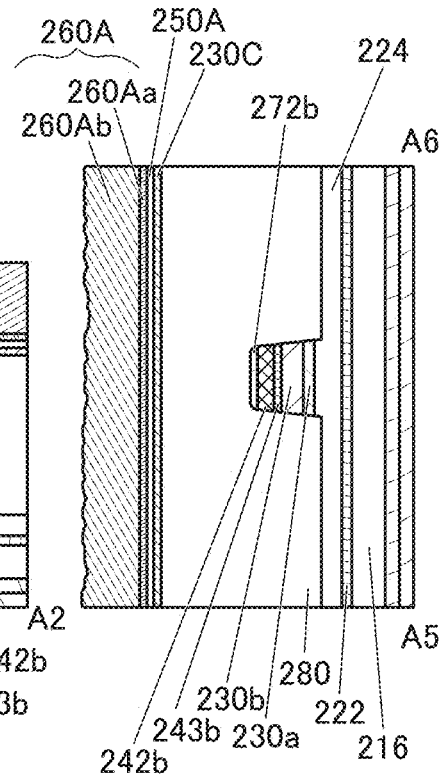
Figure 8A:
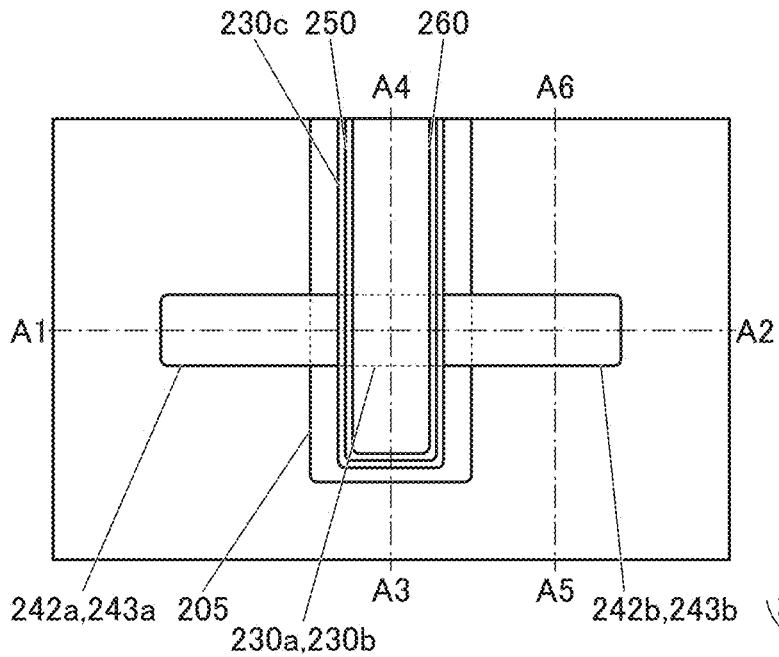
FIG. 8A, FIG. 8B, FIG. 8C, and FIG. 8D are a top view and cross-sectional views illustrating a method for manufacturing a semiconductor device of one embodiment of the present invention.
Figure 8C:
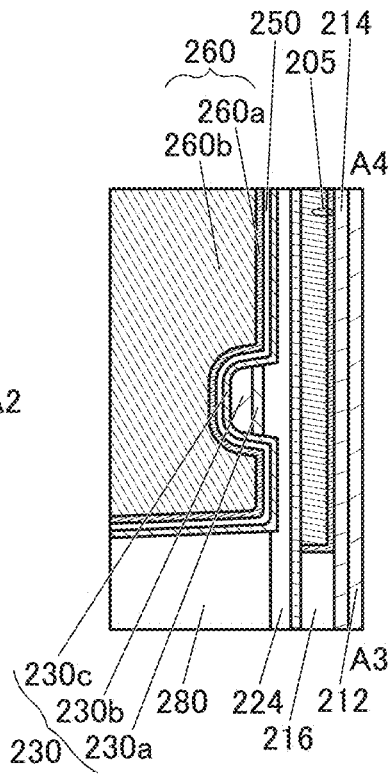
Figure 8B:
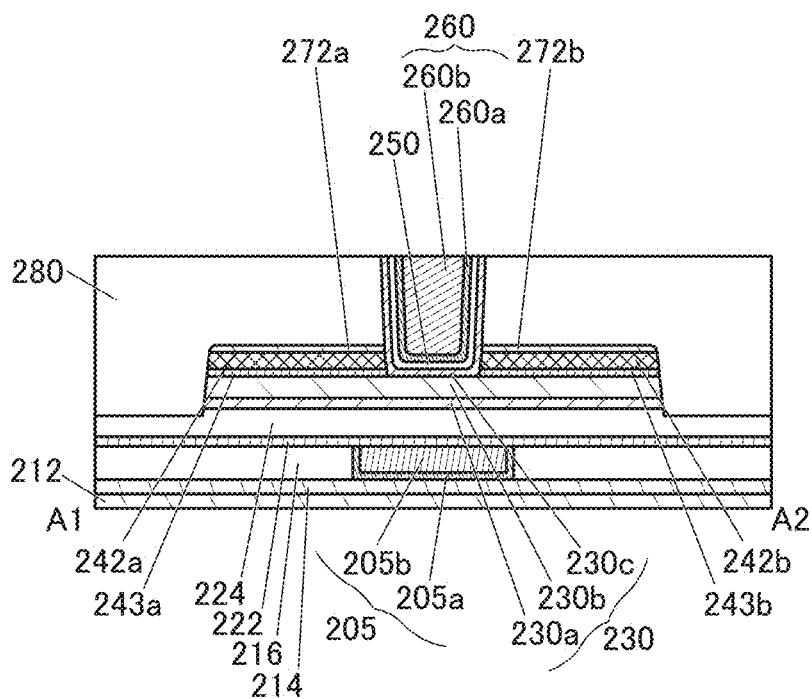
Figure 8D:
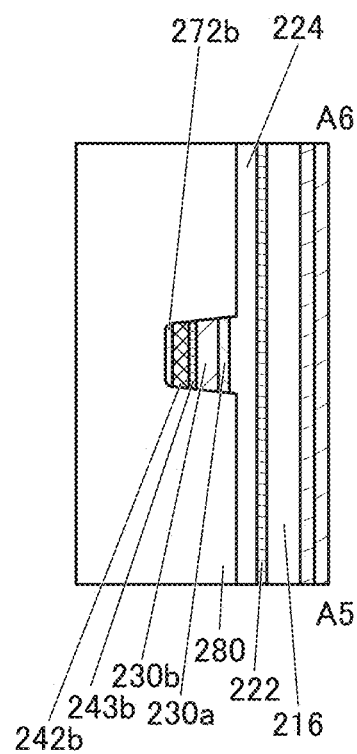
Figure 9A:
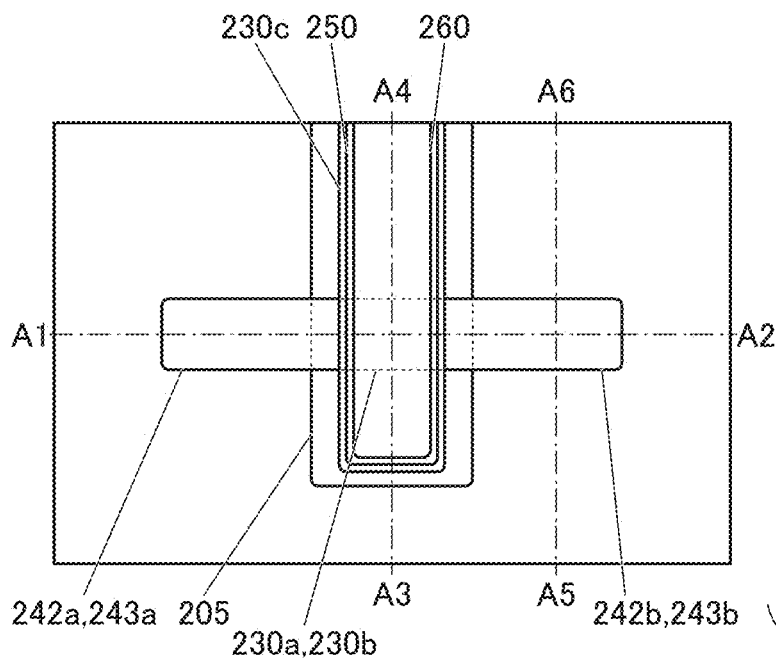
FIG. 9A, FIG. 9B, FIG. 9C, and FIG. 9D are a top view and cross-sectional views illustrating a method for manufacturing a semiconductor device of one embodiment of the present invention.
Figure 9C:
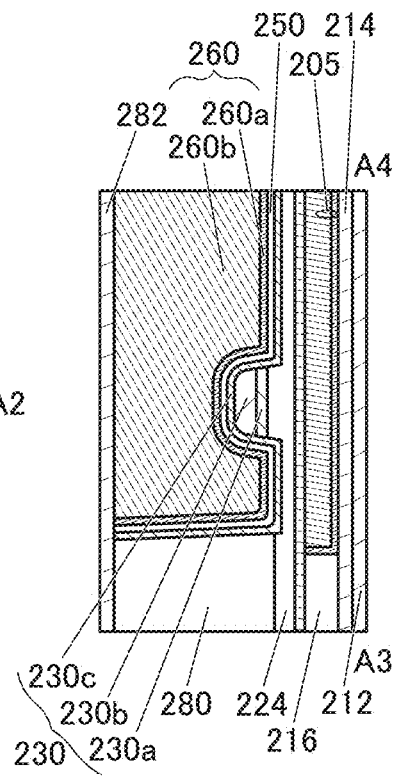
Figure 9B:
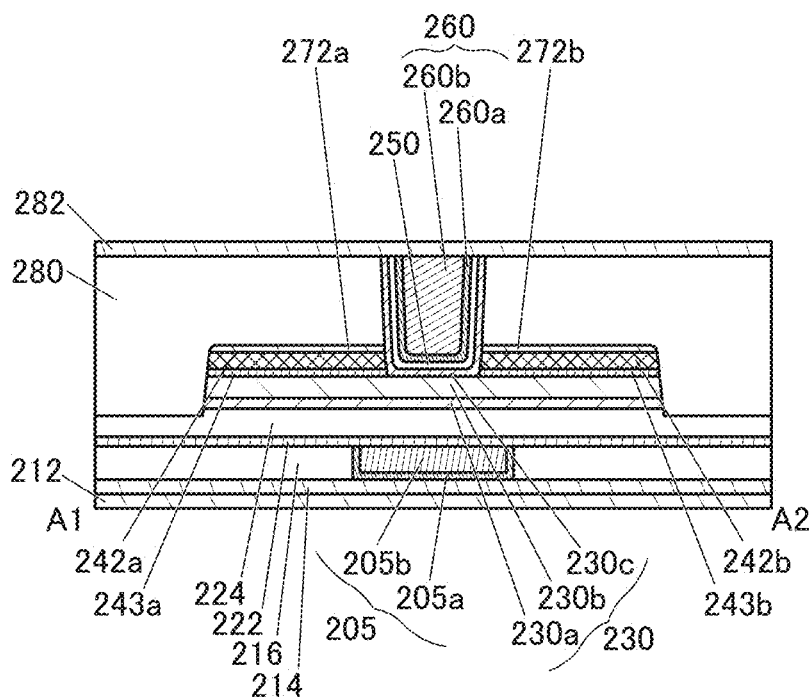
Figure 9D:
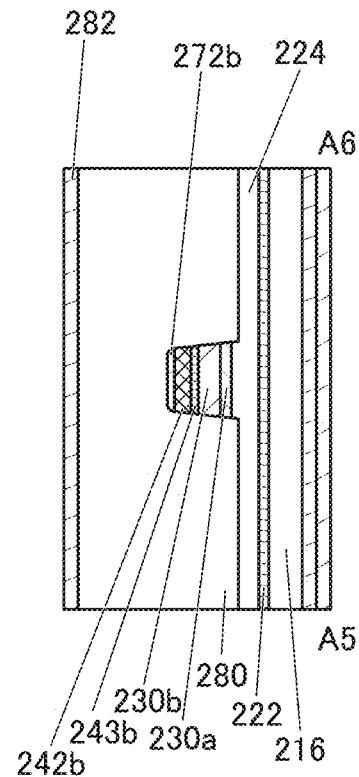
Figure 10A:
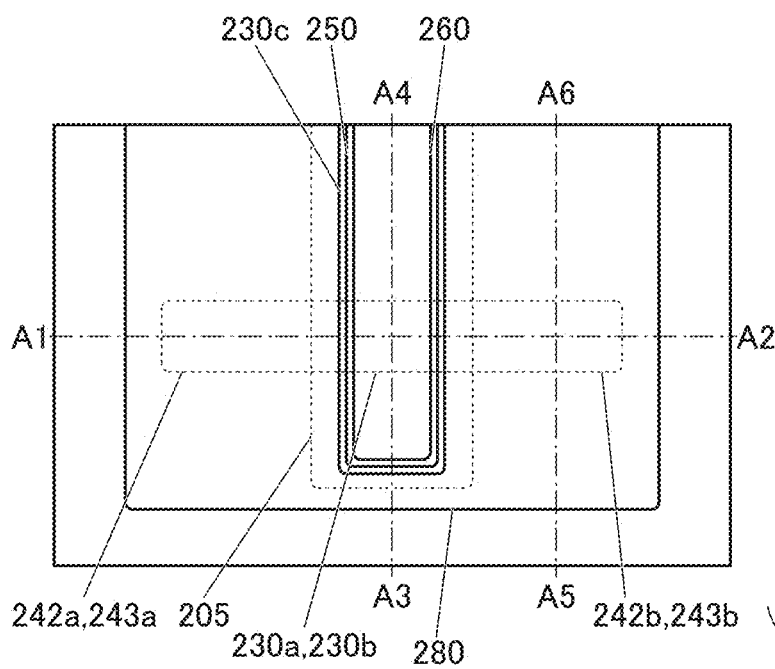
FIG. 10A, FIG. 10B, FIG. 10C, and FIG. 10D are a top view and cross-sectional views illustrating a method for manufacturing a semiconductor device of one embodiment of the present invention.
Figure 10C:
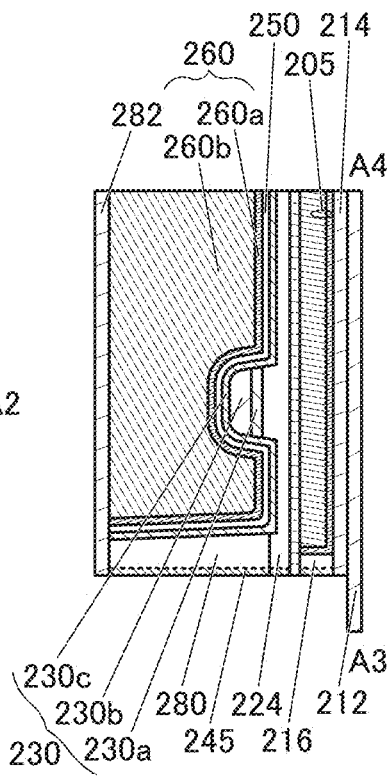
Figure 10B:
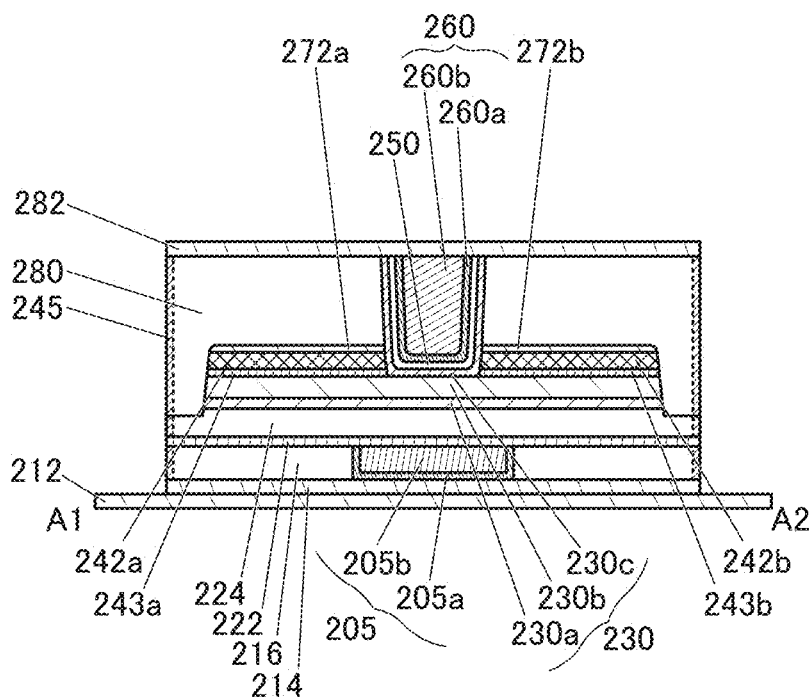
Figure 10D:
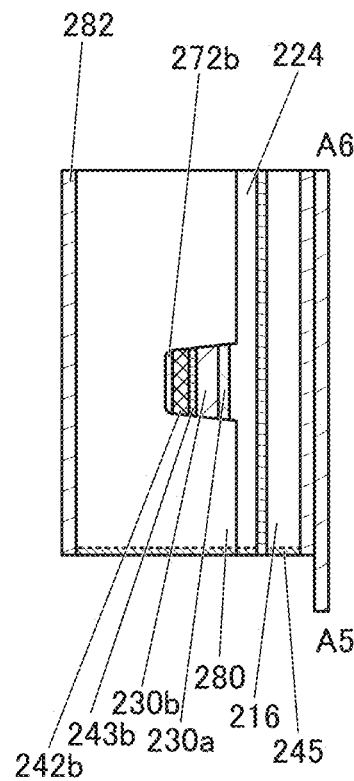
Figure 11A:
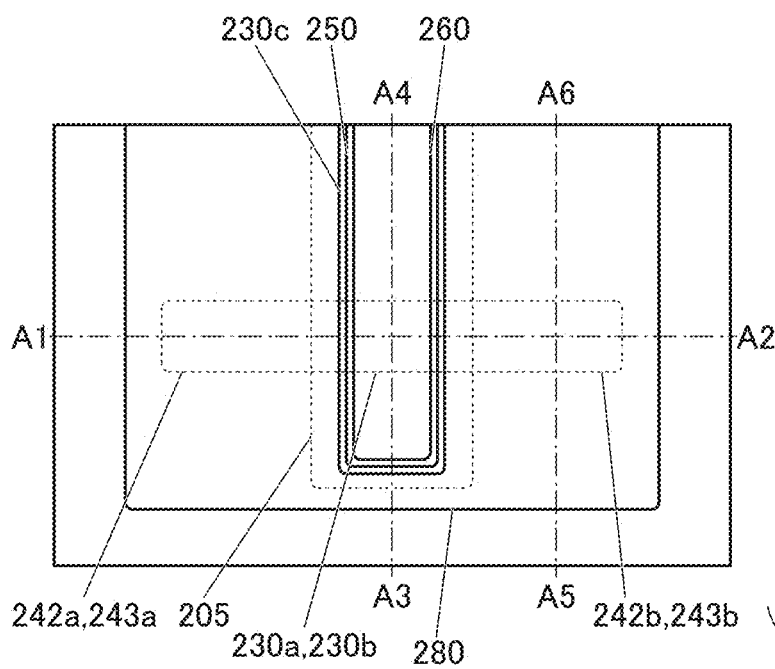
FIG. 11A, FIG. 11B, FIG. 11C, and FIG. 11D are a top view and cross-sectional views illustrating a method for manufacturing a semiconductor device of one embodiment of the present invention.
Figure 11C:
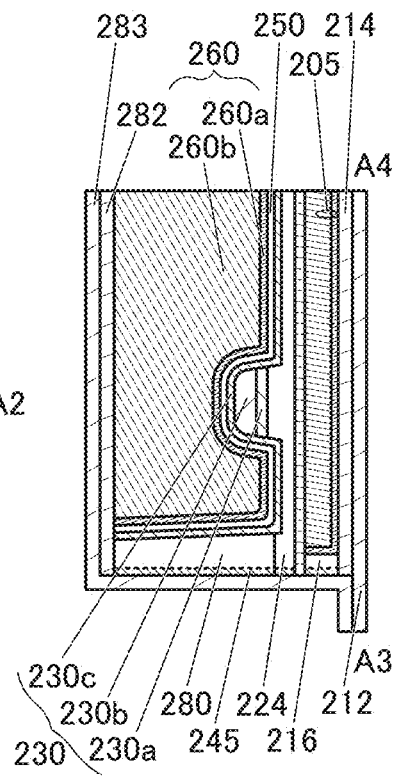
Figure 11B:
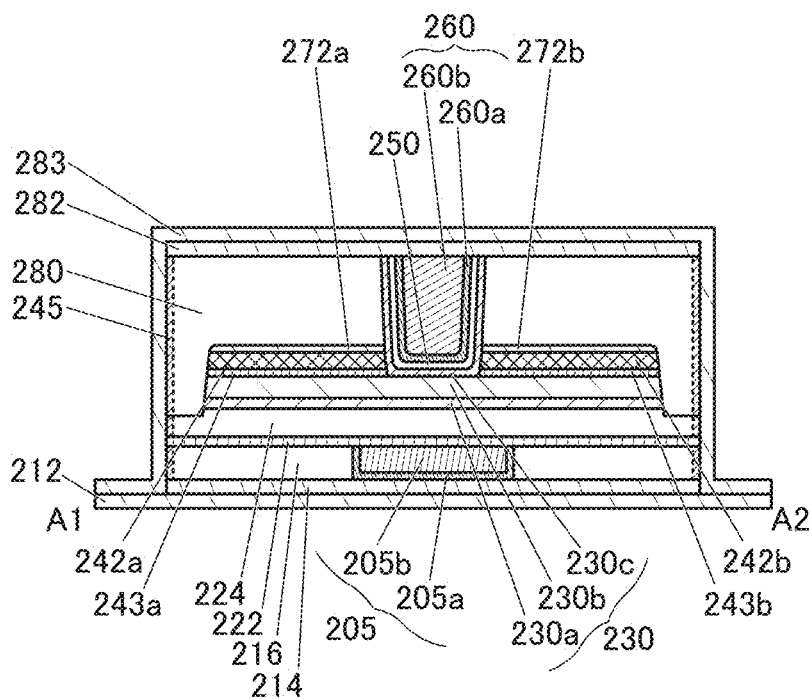
Figure 11D:
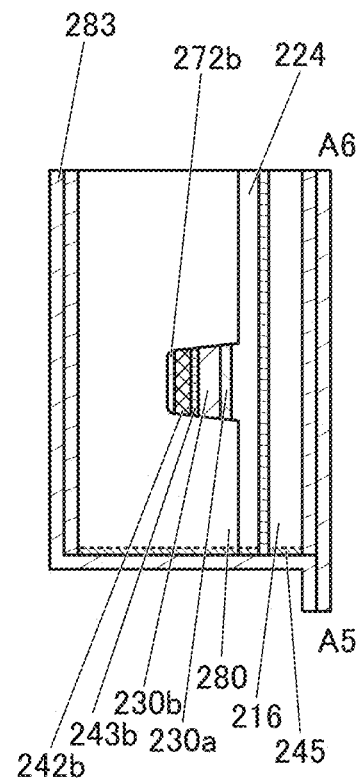
Figure 12A:
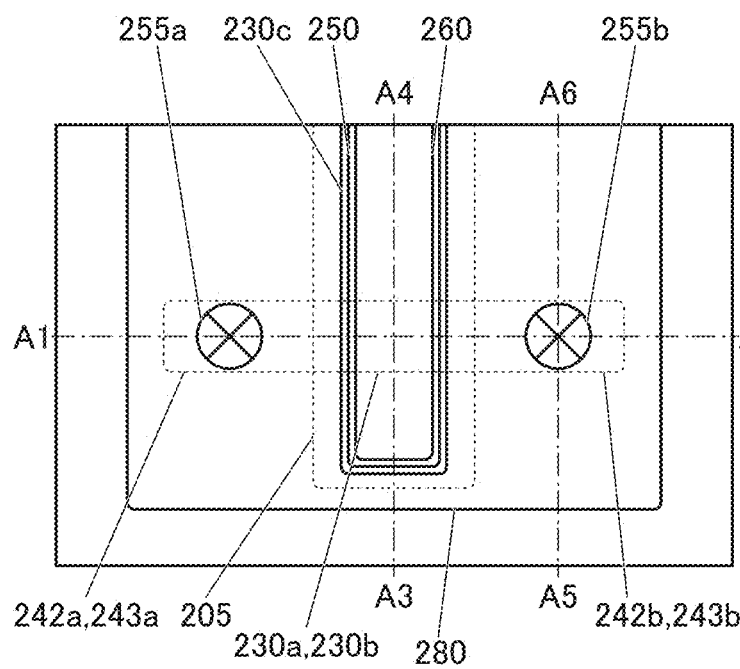
FIG. 12A, FIG. 12B, FIG. 12C, and FIG. 12D are a top view and cross-sectional views illustrating a method for manufacturing a semiconductor device of one embodiment of the present invention.
Figure 12C:
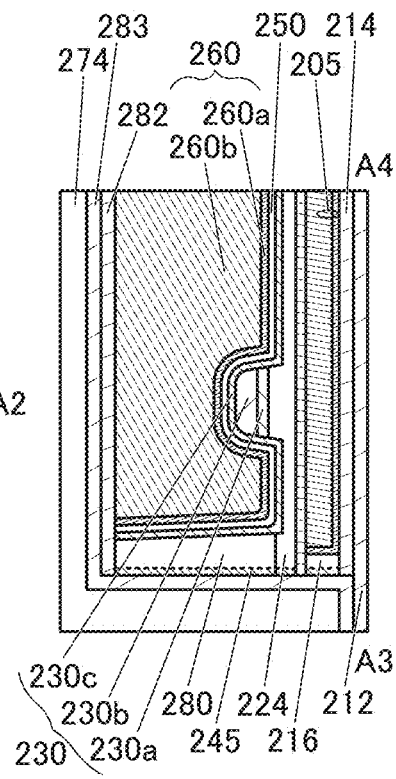
Figure 12B:
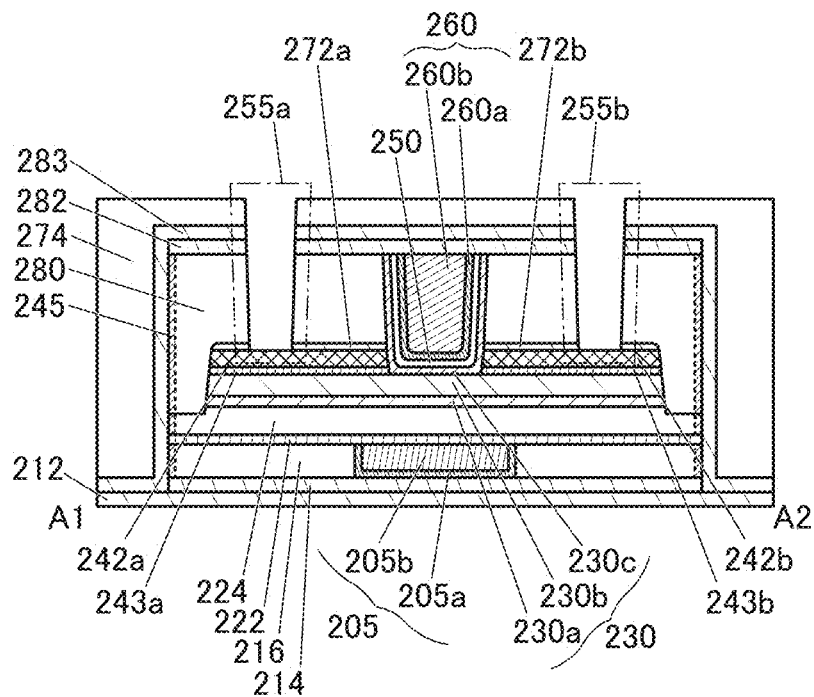
Figure 12D:
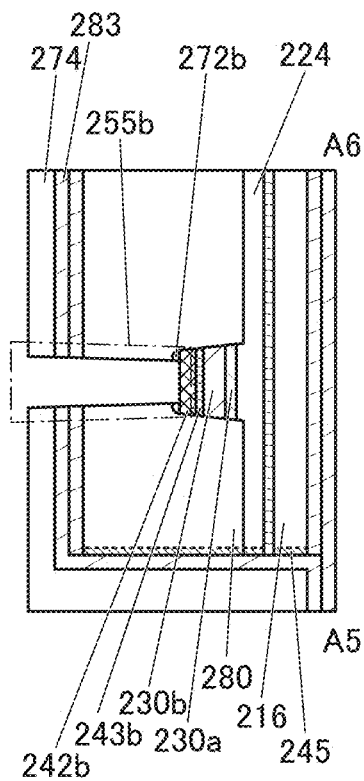
Figure 13A:
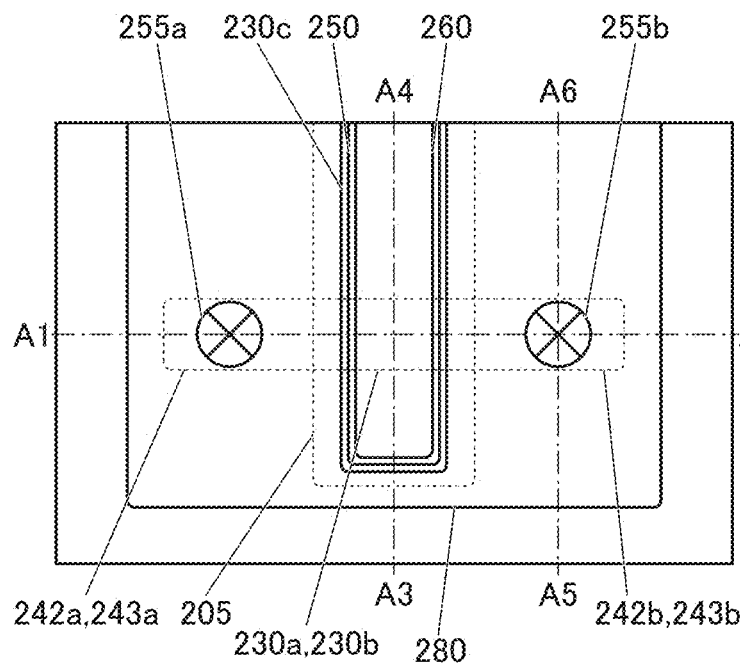
FIG. 13A, FIG. 13B, FIG. 13C, and FIG. 13D are a top view and cross-sectional views illustrating a method for manufacturing a semiconductor device of one embodiment of the present invention.
Figure 13C:
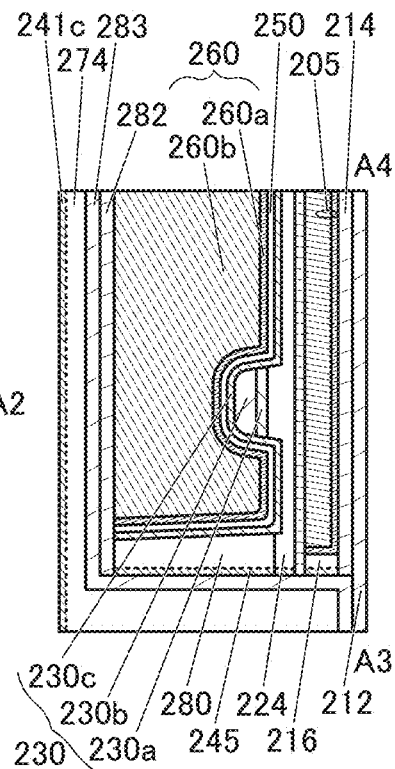
Figure 13B:
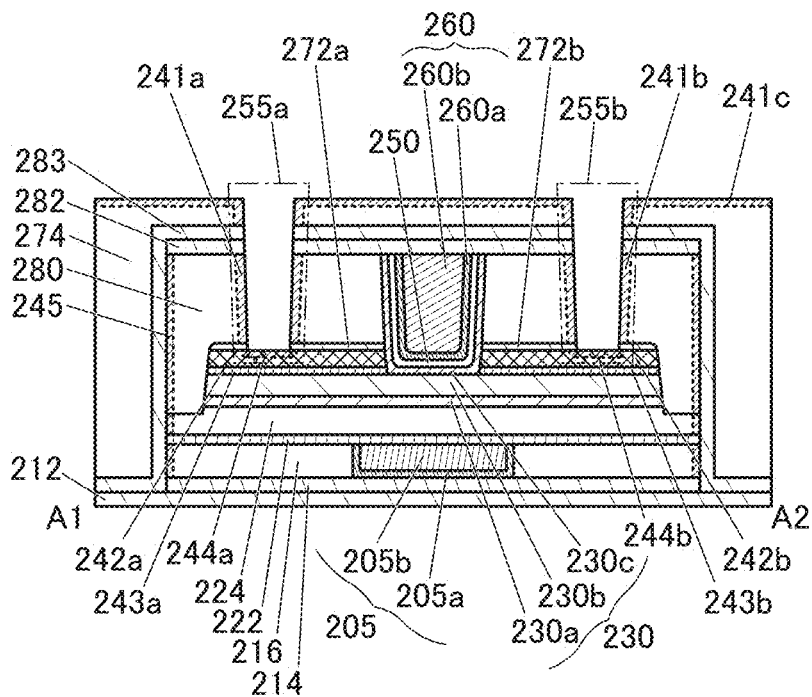
Figure 13D:
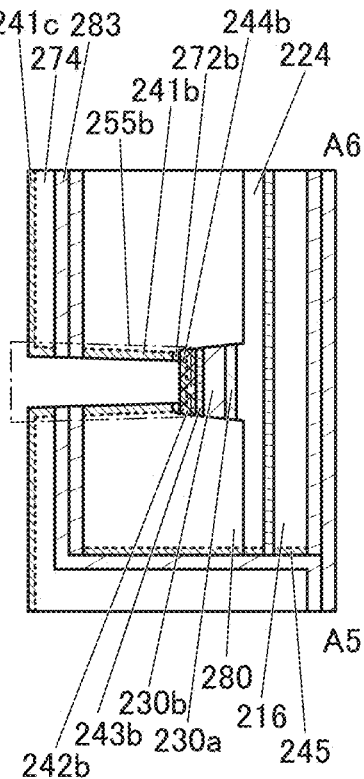
Figure 14A:
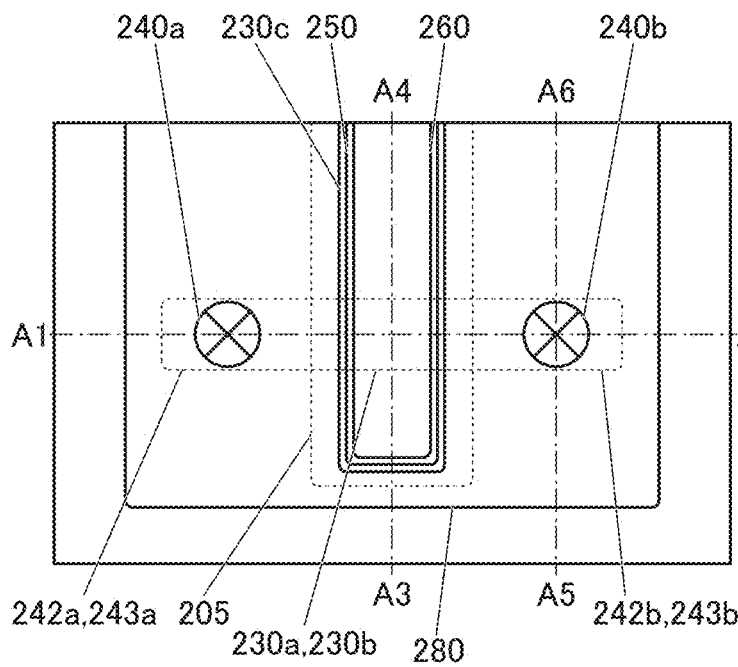
FIG. 14A, FIG. 14B, FIG. 14C, and FIG. 14D are a top view and cross-sectional views illustrating a method for manufacturing a semiconductor device of one embodiment of the present invention.
Figure 14C:
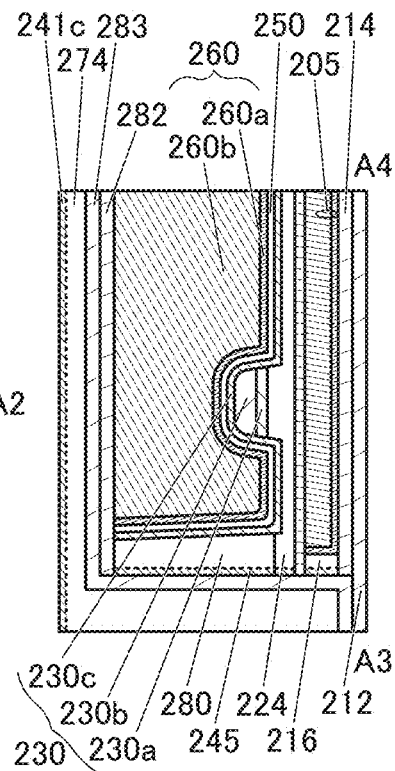
Figure 14B:
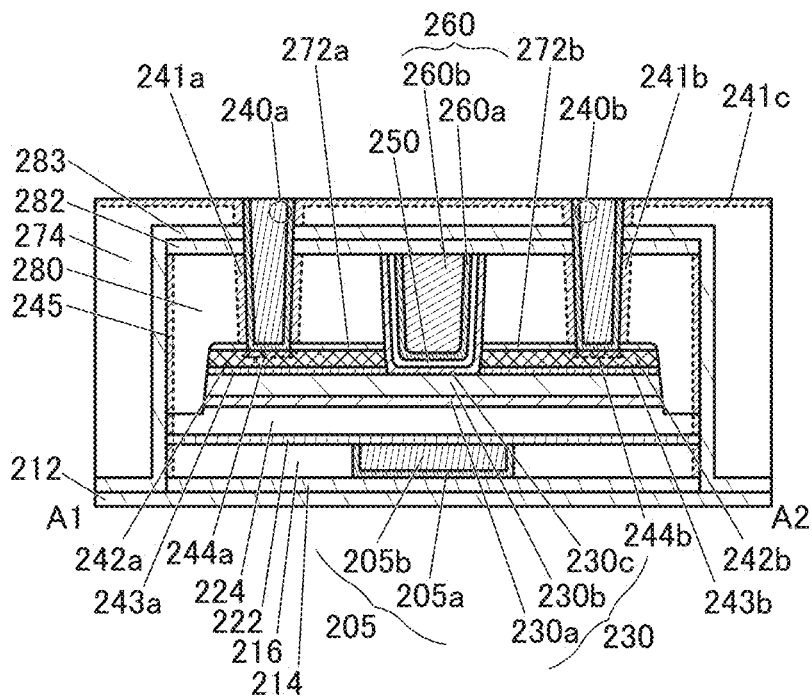
Figure 14D:
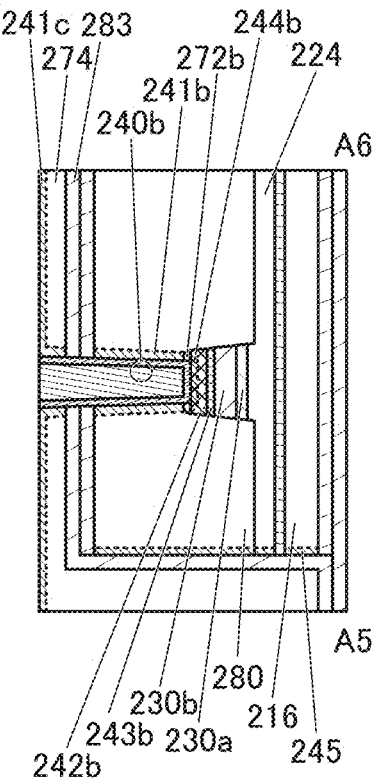

Here, the insulator layer 272B functions as a mask for the conductor layer 242B; thus, as illustrated in FIG. 3C and FIG. 3D, the conductor layer 242B does not have a curved surface between the side surface and the top surface. Thus, end portions at the intersections of the side surfaces and the top surfaces of the conductor 242a and the conductor 242b illustrated in FIG. 1 are angular. The cross-sectional area of the conductor 242 is larger in the case where the end portion at the intersection of the side surface and the top surface of the conductor 242 is angular than in the case where the end portion is rounded. Accordingly, the resistance of the conductor 242 is reduced, so that the on-state current of the transistor 200 can be increased.

It is preferable that the side surfaces of the oxide 230a, the oxide 230b, the oxide layer 243B, the conductor layer 242B, and the insulator layer 272B be substantially perpendicular to a top surface of the insulator 222. When the side surfaces of the oxide 230a, the oxide 230b, the oxide layer 243B, the conductor layer 242B, and the insulator layer 272B are substantially perpendicular to the top surface of the insulator 222, a plurality of transistors 200 can be provided in a smaller area and at a higher density. Note that without being limited thereto, a structure may be employed in which an angle formed by the side surfaces of the oxide 230a, the oxide 230b, the oxide layer 243B, the conductor layer 242B, and the insulator layer 272B and the top surface of the insulator 222 is an acute angle.

Next, the insulator 280 is deposited over the insulator 224, the oxide 230a, the oxide 230b, the oxide layer 243B, the conductor layer 242B, and the insulator layer 272B (see FIG. 4). The insulating film to be the insulator 280 can be deposited by a sputtering method, a CVD method, an MBE method, a PLD method, an ALD method, or the like. For example, as the insulator 280, a silicon oxide film is deposited by a sputtering method, and a silicon oxide film may be deposited thereover by a PEALD method or a thermal ALD method. The insulator 280 is preferably deposited by the deposition method using the above gas in which hydrogen atoms are reduced or removed. Thus, the hydrogen concentration of the insulator 280 can be reduced.

Next, the insulator 280 is subjected to CMP treatment, so that the insulator 280 having a flat top surface is formed (see FIG. 4). Note that in a manner similar to that of the insulator 224, aluminum oxide may be deposited over the insulator 280 by a sputtering method, for example, and the aluminum oxide may be subjected to CMP until the insulator 280 is reached.

Next, the insulator 280, the oxide 230b, and the oxide 230a may be irradiated with a microwave or a high-frequency wave such as RF. The irradiation microwave or the irradiation high-frequency wave such as RF permeates the insulator 280, the oxide 230b, and the oxide 230a to remove hydrogen therein. In particular, in the oxide 230a and the oxide 230b, a reaction in which a bond of VoH is cut, i.e., a reaction of "VoH→Vo+H", occurs, and the oxide 230a and the oxide 230b are dehydrogenated. Some hydrogen generated at this time is bonded to oxygen to be $H_2O$, and removed from the oxide 230 and the insulator 280, in some cases. Some hydrogen is gettered by the conductor 242 in some cases. As described above, irradiation with a microwave or a high-frequency wave such as RF can reduce the hydrogen concentrations in the insulator 280, the oxide 230b, and the oxide 230a. Note that irradiation with a microwave or a high-frequency wave such as RF may be performed before the CMP treatment.

Alternatively, an oxygen gas may be made into a plasma state with a microwave or a high-frequency wave such as RF to form oxygen radicals. That is, plasma treatment may be performed on the insulator 280, the oxide 230b, and the oxide 230a in an atmosphere containing oxygen. The treatment may be referred to as oxygen plasma treatment below. The formed oxygen radicals can supply oxygen to the insulator 280, the oxide 230b, and the oxide 230a. In the case where the plasma treatment is performed on the insulator 280, the oxide 230b, and the oxide 230a in an oxygen-containing atmosphere, the oxide 230 may be less likely to be irradiated with a microwave or a high-frequency wave such as RF.

Note that for the oxygen plasma treatment, a microwave treatment apparatus including a power source for generating high-density plasma using a microwave is preferably used, for example. The microwave treatment apparatus may include a power source for applying RF to the substrate side. Oxygen radicals at a high density can be generated with high-density plasma. Furthermore, application of RF to the substrate side allows oxygen ions generated by the high-density plasma to permeate the insulator 280 and the oxide 230 efficiently. The oxygen plasma treatment is preferably performed under a reduced pressure, and the pressure is set to be 60 Pa or higher, preferably 133 Pa or higher, further preferably 200 Pa or higher, and still further preferably 400 Pa or higher. Furthermore, the oxygen flow rate ratio ($O_2/O_2+Ar$) is lower than or equal to 50%, preferably higher than or equal to 10% and lower than or equal to 30%. The treatment temperature is lower than or equal to 750° C., preferably lower than or equal to 500° C., and is approximately 400° C., for example. The oxygen plasma treatment can be followed successively by heat treatment without exposure to air. The heat treatment may be performed at a temperature lower than or equal to 750° C., preferably lower than or equal to 500° C.

The oxygen plasma treatment can be followed successively by the above nitrogen plasma treatment without exposure to air. The oxygen plasma treatment and the nitrogen plasma treatment may be performed in the same chamber or in different chambers of a multi-chamber treatment apparatus. Thus, a solid-phase nitridation region like the region 241 can be formed on the surface of the insulator 280; therefore, additional entry of hydrogen into the insulator 280 in which the hydrogen concentration is reduced by the oxygen plasma treatment can be reduced.

Then, part of the insulator 280, part of the insulator layer 272B, the conductor layer 242B, and part of the oxide layer 243B are processed to form an opening reaching the oxide 230b (see FIG. 5). The opening is preferably formed to overlap with the conductor 205. The oxide 243a, the oxide 243b, the conductor 242a, the conductor 242b, the insulator 272a, and the insulator 272b are formed by forming the opening.

The part of the insulator 280, the part of the insulator layer 272B, the conductor layer 242B, and the part of the oxide layer 243B can be processed by a dry etching method or a wet etching method. Processing by a dry etching method is suitable for microfabrication. The processing may be performed under different conditions. For example, the part of the insulator 280 may be processed by a dry etching method, the part of the insulator layer 272B may be processed by a wet etching method, and the oxide layer 243B and the part of the conductor layer 242B may be processed by a dry etching method.

In some cases, the treatment such as the dry etching performed thus far causes the attachment or diffusion of impurities due to an etching gas or the like to a surface or an inside of the oxide 230a, the oxide 230b, or the like. Examples of the impurities include fluorine and chlorine.

In order to remove the above impurities and the like, cleaning is performed. Examples of the cleaning method include wet cleaning using a cleaning solution or the like, plasma treatment using plasma, and cleaning by heat treatment, and any of these cleanings may be performed in appropriate combination.

The wet cleaning may be performed using an aqueous solution in which oxalic acid, phosphoric acid, ammonia water, hydrofluoric acid, or the like is diluted with carbonated water or pure water. Alternatively, ultrasonic cleaning using pure water or carbonated water may be performed.

After the etching or the cleaning, heat treatment may be performed. The heat treatment is performed at a temperature higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. The heat treatment is preferably performed in an oxygen atmosphere, for example. This provides oxygen to the oxide 230$a$ and the oxide 230$b$, and reduces oxygen vacancies Vo. Alternatively, the heat treatment may be performed under reduced pressure. Alternatively, the heat treatment may be performed in such a manner that heat treatment is performed in an oxygen atmosphere, and then another heat treatment is successively performed in a nitrogen atmosphere without exposure to air.

Next, an oxide film 230C is deposited (see FIG. 6). Heat treatment may be performed before deposition of the oxide film 230C, and it is preferable that the heat treatment be performed under reduced pressure and that the oxide film 230C be successively deposited without exposure to the air. Preferably, the heat treatment is performed in an atmosphere containing oxygen. The treatment can remove moisture and hydrogen adsorbed onto the surface of the oxide 230$b$ and the like, and further can reduce the moisture concentration and the hydrogen concentration of the oxide 230$a$ and the oxide 230$b$. The heat treatment is preferably performed at a temperature higher than or equal to 100° C. and lower than or equal to 400° C., further preferably performed at a temperature higher than or equal to 150° C. and lower than or equal to 350° C. In this embodiment, the heat treatment is performed at 200° C. under reduced pressure.

Here, it is preferable that the oxide film 230C be provided in contact with at least part of the side surface of the oxide 230$a$, part of the side surface and part of the top surface of the oxide 230$b$, part of the side surface of the oxide 243, part of the side surface of the conductor 242, part of the side surface of the insulator 272, and the side surface of the insulator 280. When the conductor 242 is surrounded by the oxide 243, the insulator 272, and the oxide film 230C, a decrease in the conductivity of the conductor 242 due to oxidation can be inhibited in subsequent steps.

The oxide film 230C can be deposited by a sputtering method, a CVD method, an MBE method, a PLD method, an ALD method, or the like. The atomic ratio of Ga to In in the oxide film 230C is preferably greater than the atomic ratio of Ga to In in the oxide film 230B. In this embodiment, the oxide film 230C is deposited by a sputtering method using a target with In:Ga:Zn=1:3:4 [atomic ratio].

Note that the oxide film 230C may be a stack. For example, the oxide film 230C may be deposited by a sputtering method using a target of In:Ga:Zn=4:2:4.1 [atomic ratio] and successively deposited using a target of In:Ga:Zn=1:3:4 [atomic ratio].

In the deposition of the oxide film 230C, part of oxygen contained in the sputtering gas is sometimes supplied to the oxide 230$a$ and the oxide 230$b$. When the oxide film 230C is deposited, part of oxygen contained in the sputtering gas is supplied to the insulator 280 in some cases. Therefore, the proportion of oxygen contained in the sputtering gas for the oxide film 230C is preferably higher than or equal to 70%, further preferably higher than or equal to 80%, still further preferably 100%.

Next, heat treatment may be performed. The heat treatment may be performed under reduced pressure, and deposition of an insulating film 250A may be successively performed without exposure to the air. The heat treatment can remove moisture and hydrogen adsorbed onto the surface of the oxide film 230C and the like, and further can reduce the moisture concentration and the hydrogen concentration of the oxide 230$a$, the oxide 230$b$, and the oxide film 230C. The heat treatment is preferably performed at a temperature higher than or equal to 100° C. and lower than or equal to 400° C. In this embodiment, the heat treatment is performed at 200° C.

Next, the insulating film 250A is deposited over the oxide film 230C (see FIG. 6). The insulating film 250A can be deposited by a sputtering method, a CVD method, an MBE method, a PLD method, an ALD method, or the like. The insulating film 250A is preferably deposited by the deposition method using the gas in which hydrogen atoms are reduced or removed. This reduces the hydrogen concentration of the insulating film 250A. The hydrogen concentration of the insulating film 250A is preferably reduced because the insulating film 250A becomes the insulator 250 that is in contact with the oxide 230$c$ in a later step. Note that after the deposition of the insulating film 250A, irradiation with a microwave or a high-frequency wave such as RF or oxygen plasma treatment, which has been performed after the deposition of the insulator 280, may be performed.

Next, a conductive film 260Aa and a conductive film 260Ab are deposited (see FIG. 7). The conductive film 260Aa and the conductive film 260Ab can be deposited by a sputtering method, a CVD method, an MBE method, a PLD method, an ALD method, or the like. A CVD method is preferably used, for example. In this embodiment, the conductive film 260Aa is deposited by an ALD method, and the conductive film 260Ab is deposited by a CVD method.

Then, the oxide film 230C, the insulating film 250A, the conductive film 260Aa, and the conductive film 260Ab are polished by CMP treatment until the insulator 280 is exposed, so that the oxide 230$c$, the insulator 250, and the conductor 260 (the conductor 260$a$ and the conductor 260$b$) are formed (see FIG. 8).

Next, heat treatment may be performed. In this embodiment, treatment is performed at 400° C. in a nitrogen atmosphere for one hour. The heat treatment can reduce the moisture concentration and the hydrogen concentration of the insulator 250 and the insulator 280. After the heat treatment, the insulator 282 may be successively deposited without exposure to the air.

Next, the insulator 282 is formed over the conductor 260, the oxide 230$c$, the insulator 250, and the insulator 280. The insulator 282 can be deposited by a sputtering method, a CVD method, an MBE method, a PLD method, an ALD method, or the like (see FIG. 9). As an insulating film to be the insulator 282, aluminum oxide is preferably deposited by a sputtering method, for example. The insulator 282 is deposited by a sputtering method in an oxygen-containing atmosphere, whereby oxygen can be added to the insulator 280 during the deposition. At this time, the insulator 280 is preferably deposited while the substrate is being heated. It is preferable to form the insulator 282 in contact with the top surface of the conductor 260 because oxygen contained in the insulator 280 can be inhibited from being absorbed into the conductor 260 in a later heat treatment.

Next, part of the insulator 282, part of the insulator 280, part of the insulator 224, part of the insulator 222, part of the insulator 216, and part of the insulator 214 are processed to form an opening reaching the insulator 212 (see FIG. 10). The opening is formed to surround the transistor 200 in some cases. In other cases, the opening is formed to surround a plurality of the transistors 200. Accordingly, part of a side surface of the insulator 282, part of a side surface of the insulator 280, part of a side surface of the insulator 224, part of a side surface of the insulator 222, part of a side surface of the insulator 216, and part of a side surface of the insulator 214 are exposed in the opening.

The part of the insulator 282, the part of the insulator 280, the part of the insulator 224, the part of the insulator 222, the part of the insulator 216, and the part of the insulator 214 can be processed by a dry etching method or a wet etching method. Processing by a dry etching method is suitable for microfabrication. The processing may be performed under different conditions.

Next, nitrogen plasma treatment is performed to form, on the exposed side surfaces of the insulator 280, the insulator 224, and the insulator 216, the region 245 having a higher nitrogen concentration than different regions of the insulator 280, the insulator 224, and the insulator 216 (see FIG. 10). In the nitrogen plasma treatment, a nitrogen gas is made in a plasma state using a microwave or a high-frequency wave such as RF, and the nitrogen plasma acts on the vicinities of the side surfaces of the insulator 280, the insulator 224, and the insulator 216, which thus can be subjected to solid-phase nitridation. Furthermore, in the nitrogen plasma treatment, a rare gas such as argon is preferably introduced in addition to a nitrogen gas.

Note that as the nitrogen plasma treatment, microwave treatment in which a nitrogen gas is made into a plasma state by a microwave is preferably performed, for example. In microwave treatment in a nitrogen-containing atmosphere, high-density plasma is preferably generated using a microwave treatment apparatus described later. The microwave treatment apparatus may include a power source for applying RF to a substrate side. A high-density plasma is used in a nitrogen-containing atmosphere, whereby a high-density nitrogen radical can be generated. Furthermore, application of RF to the substrate side allows ions generated by the high-density plasma to be efficiently introduced into the insulator 280, the insulator 224, and the insulator 216. The microwave treatment in a nitrogen-containing atmosphere is preferably performed under a reduced pressure, and the pressure is set to 400 Pa or lower, preferably 200 Pa or lower, further preferably 60 Pa or lower, still further preferably 12 Pa or lower. Furthermore, the nitrogen flow rate ratio ($N_2/N_2+Ar$) is lower than or equal to 50%, preferably higher than or equal to 10% and lower than or equal to 30%. The treatment can be performed at approximately 400° C., for example.

In that case, the insulator 280 or the like may be irradiated with a microwave or a high-frequency wave such as RF. The irradiation microwave or the irradiation high-frequency wave such as RF enters the insulator 280, the oxide 230b, the oxide 230a, and the like and can sometimes remove hydrogen therein. For example, in the oxide 230a and the oxide 230b, a reaction in which a bond of VoH is cut, i.e., a reaction of "VoH→Vo+H", occurs, and the oxide 230a and the oxide 230b are dehydrogenated. Some hydrogen generated at this time is bonded to oxygen to be $H_2O$, and removed from the oxide 230 and the insulator 280, in some cases. Some hydrogen is gettered by the conductor 242 in some cases.

Although not illustrated, by the nitrogen plasma treatment for forming the region 245, a side surface of the opening in the insulator 214, the insulator 222, and the insulator 282 is also subjected to solid-phase nitridation in some cases.

Then, the insulator 283 is deposited to cover the insulator 282, the insulator 280, the insulator 224, the insulator 222, the insulator 216, and the insulator 214 (see FIG. 11). As illustrated in FIG. 11, the insulator 283 is in contact with the insulator 212 at a bottom surface of the opening. That is, the top and side surfaces of the transistor 200 are surrounded by the insulator 283 and the bottom surface of the transistor 200 is surrounded by the insulator 212. Surrounding the transistor 200 by the insulator 283 and the insulator 212 having high barrier properties can prevent entry of moisture and hydrogen from the outside.

The insulator 283 can be deposited by a sputtering method, a CVD method, an MBE method, a PLD method, an ALD method, or the like. As described above, the region 245 is formed on the side surfaces of the insulator 280, the insulator 224, and the insulator 216 before deposition of the insulator 283, whereby even when the insulator 283 is deposited by a deposition method in which a large amount of hydrogen is generated in a chamber, entry of the hydrogen into the insulator 280, the insulator 224, and the insulator 216 can be reduced. Accordingly, the insulator 283 can be deposited by a deposition method with favorable step coverage, such as a PECVD method; therefore, the insulator 283 can be deposited without a break or formation of a pinhole, even with a step being formed by the insulator 280 or the like.

Next, heat treatment may be performed. In this embodiment, treatment is performed at 400° C. in a nitrogen atmosphere for one hour. By the heat treatment, oxygen added by the deposition of the insulator 282 is diffused to the insulator 280 and can be supplied to the oxide 230a and the oxide 230b through the oxide 230c. The oxygen adding treatment performed in this manner on the oxide 230 can promote a reaction in which oxygen vacancies in the oxide 230 (the oxide 230b) are filled with oxygen, i.e., a reaction of "Vo+O→null". Furthermore, hydrogen remaining in the oxide 230 reacts with supplied oxygen, so that the hydrogen can be removed as $H_2O$ (dehydration). This can inhibit recombination of hydrogen remaining in the oxide 230 with oxygen vacancies and formation of VoH. Note that the heat treatment is not necessarily performed after the deposition of the insulator 283 and may be performed after the deposition of the insulator 282.

Next, the insulator 274 is deposited over the insulator 283 (see FIG. 12). The insulator 274 can be deposited by a sputtering method, a CVD method, an MBE method, a PLD method, an ALD method, or the like. The insulator 274 is preferably deposited by the deposition method using the gas in which hydrogen atoms are reduced or removed. Thus, the hydrogen concentration of the insulator 274 can be reduced.

Next, the insulator 274 is subjected to CMP treatment, so that the insulator 274 having a flat top surface is formed (see FIG. 12).

Next, an opening 255a reaching the conductor 242a is formed in the insulator 272a, the insulator 280, the insulator 282, the insulator 283, and the insulator 274, and an opening 255b reaching the conductor 242b is formed in the insulator 272b, the insulator 280, the insulator 282, the insulator 283, and the insulator 274 (see FIG. 12). The openings are formed by a lithography method. Note that the opening 255a and the opening 255b in the top view in FIG. 12A each have a circular shape; however, the shapes of the openings are not limited thereto. For example, the opening 255a and the opening 255b in the top view may each have an almost circular shape such as an elliptical shape, a polygonal shape such as a quadrangular shape, or a polygonal shape such as a quadrangular shape with rounded corners.

Next, nitrogen plasma treatment is performed to form, on the exposed top surfaces and side surfaces of the insulator 274 and the insulator 280, the region 241 having a higher nitrogen concentration than different regions of the insulator 274 and the insulator 280 (see FIG. 13). The region 241a is formed on an inner wall of the opening 255a in the insulator 280, the region 241b is formed on an inner wall of the opening 255b in the insulator 280, and the region 241c is formed on the top surface of the insulator 274, the inner wall of the opening 255a, and the inner wall of the opening 255b. In the nitrogen plasma treatment, a nitrogen gas is made in a plasma state using a microwave or a high-frequency wave such as RF, and the nitrogen plasma acts on the vicinities of the exposed top surfaces and side surfaces of the insulator 274 and the insulator 280, which thus can be subjected to solid-phase nitridation. Furthermore, in the nitrogen plasma treatment, a rare gas such as argon is preferably introduced in addition to a nitrogen gas.

Note that as the nitrogen plasma treatment, a microwave treatment in which a nitrogen gas is made into a plasma state is preferably performed, for example. In a microwave treatment in a nitrogen-containing atmosphere, high-density plasma is preferably generated using a microwave treatment apparatus described later. The microwave treatment apparatus may include a power source for applying RF to a substrate side. A high-density plasma is used in an atmosphere containing nitrogen, whereby a high-density nitrogen radical can be generated. Furthermore, application of RF to the substrate side allows ions generated by the high-density plasma to be efficiently introduced into the insulator 274 and the insulator 280. The microwave treatment in an atmosphere containing nitrogen is preferably performed under a reduced pressure, and the pressure is set to 400 Pa or lower, preferably 200 Pa or lower, further preferably 60 Pa or lower, still further preferably 12 Pa or lower. Furthermore, the treatment is performed with the nitrogen flow rate ratio ($N_2/N_2+Ar$) of 50% or lower, preferably 10% or higher and 30% or lower. The treatment can be performed at approximately 400° C., for example.

It is preferable that the insulator 241 as described above have a function of inhibiting diffusion of hydrogen (e.g., at least one of a hydrogen atom, a hydrogen molecule, and the like). Such a region 241 is formed between the conductor 240 and each of the insulator 274 and the insulator 280, whereby entry of hydrogen contained in the insulator 274 and the insulator 280 into the conductor 240 can be reduced. Thus, the amount of hydrogen diffused from the conductor 240 to the conductor 242 and the oxide 230 can be reduced. The transistor 200 including the oxide 230 with sufficiently reduced impurities such as hydrogen in the channel formation region can have normally-off characteristics, stable electrical characteristics, and improved reliability.

In the nitrogen plasma treatment, the insulator 274, the insulator 280, or the like may be irradiated with a microwave or a high-frequency wave such as or RF. The irradiation microwave or the irradiation high-frequency wave such as RF enters the insulator 274, the insulator 280, the oxide 230b, the oxide 230a, and the like and can sometimes remove hydrogen therein.

In the nitrogen plasma treatment, the conductor 242a is exposed on a bottom surface of the opening 255a, and the conductor 242b is exposed on a bottom surface of the opening 255b. Thus, the region 244a having a higher nitrogen concentration than a different region of the conductor 242a is formed in the vicinity of the surface of the conductor 242a, and the region 244b having a higher nitrogen concentration than a different region of the conductor 242b is formed in the vicinity of the surface of the conductor 242b. The region 244 preferably has substantially the same resistivity as the different region of the conductor 242. Thus, the region 244 does not significantly hinder the conductivity of the conductor 242 functioning as a source electrode and the drain electrode. Therefore, even when the region 241 is formed by the above nitrogen plasma treatment, the conductor 242 does not require special posttreatment.

In the case where an insulating film corresponding to the region 241 is deposited by a CVD method or the like, the insulating film is also deposited over the conductor 242, and thus a step of removing only the insulating film at bottom portions of the opening 255a and the opening 255b is needed. However, as described in this embodiment, the region 241 functioning as a barrier film is formed only on the side surfaces of the opening 255a and the opening 255b using the nitrogen plasma treatment, whereby an extra removing step is not needed; thus, the productivity of the semiconductor device can be improved.

Although not illustrated, by the nitrogen plasma treatment for forming the region 241, not only the region 244 but also side surfaces of the openings in the insulator 272a, the insulator 272b, the insulator 282, and the insulator 283 are subjected to solid-phase nitridation in some cases.

Next, a conductive film to be the conductor 240a and the conductor 240b is deposited. The conductive film to be the conductor 240a and the conductor 240b preferably has a stacked-layer structure that includes a conductor having a function of inhibiting passage of impurities such as water and hydrogen. For example, a stacked layer of tantalum nitride, titanium nitride, or the like and tungsten, molybdenum, copper, or the like can be employed. The conductive film to be the conductor 240 can be deposited by a sputtering method, a CVD method, an MBE method, a PLD method, an ALD method, or the like.

Then, CMP treatment is performed, thereby removing part of the conductive film to be the conductor 240a and the conductor 240b to expose the top surface of the insulator 274 (it can be also referred to as the region 241c). As a result, the conductive film remains only in the opening 255a and the opening 255b, so that the conductor 240a and the conductor 240b having flat top surfaces can be formed (see FIG. 14). Note that in some cases, by the CMP treatment, part of the top surface of the insulator 274 is removed, and the region 241c formed in the vicinity of the top surface of the insulator 274 is also removed at the same time.

Next, a conductive film to be the conductor 246 is deposited. The conductive film to be the conductor 246 can be deposited by a sputtering method, a CVD method, an MBE method, a PLD method, an ALD method, or the like.

Next, the conductive film to be the conductor 246 is processed by a lithography method to form the conductor 246a in contact with the top surface of the conductor 240a and the conductor 246b in contact with the top surface of the conductor 240b (see FIG. 1).

Through the above process, the semiconductor device including the transistor 200 illustrated in FIG. 1 can be manufactured. As illustrated in FIG. 2 to FIG. 14, with the use of the method for manufacturing the semiconductor device described in this embodiment, the transistor 200 can be manufactured.

<Microwave Treatment Apparatus>

A microwave treatment apparatus that can be used for the above method for manufacturing the semiconductor device is described below.

Figure 16:
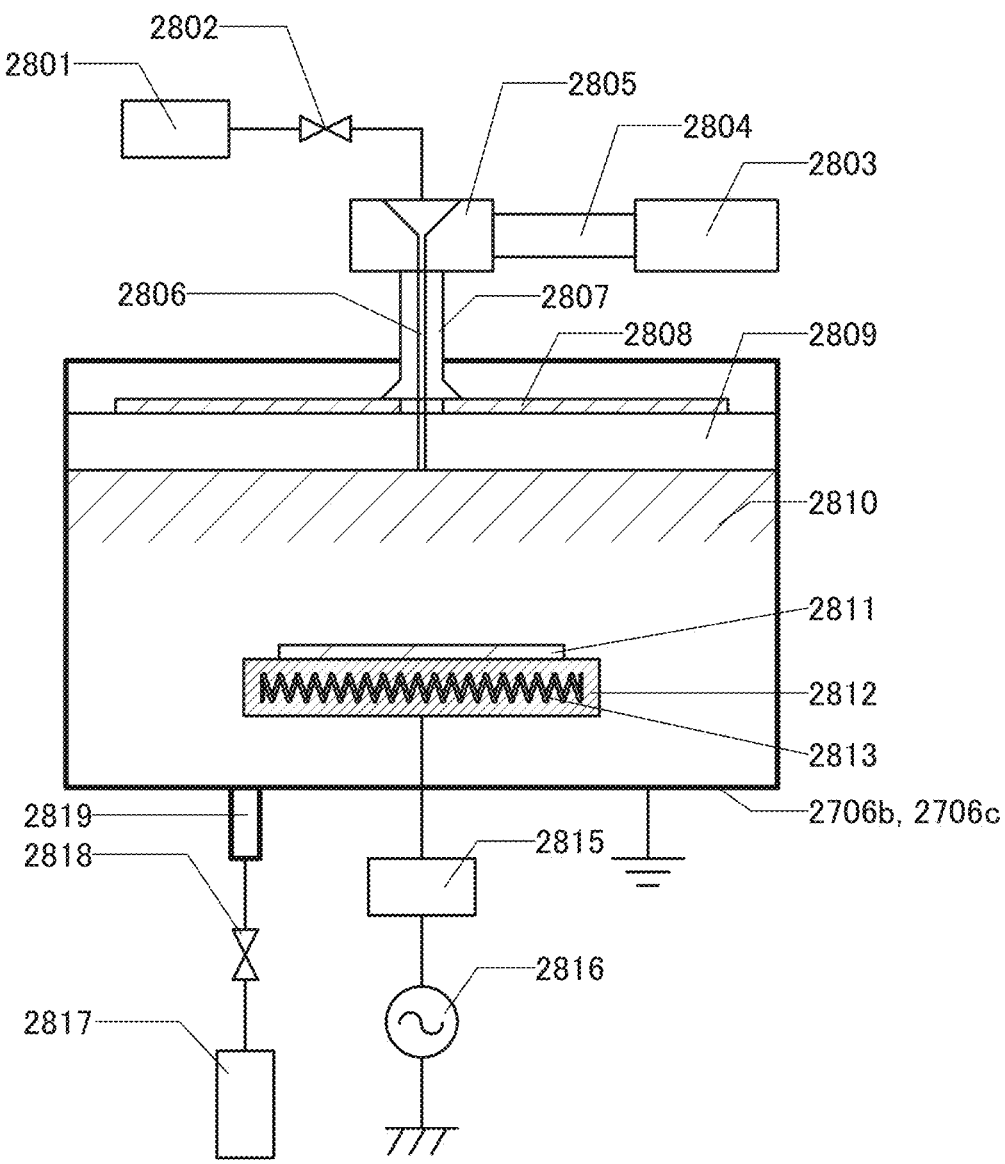
FIG. 16 is a cross-sectional view illustrating a microwave treatment apparatus of one embodiment of the present invention.
Figure 17:
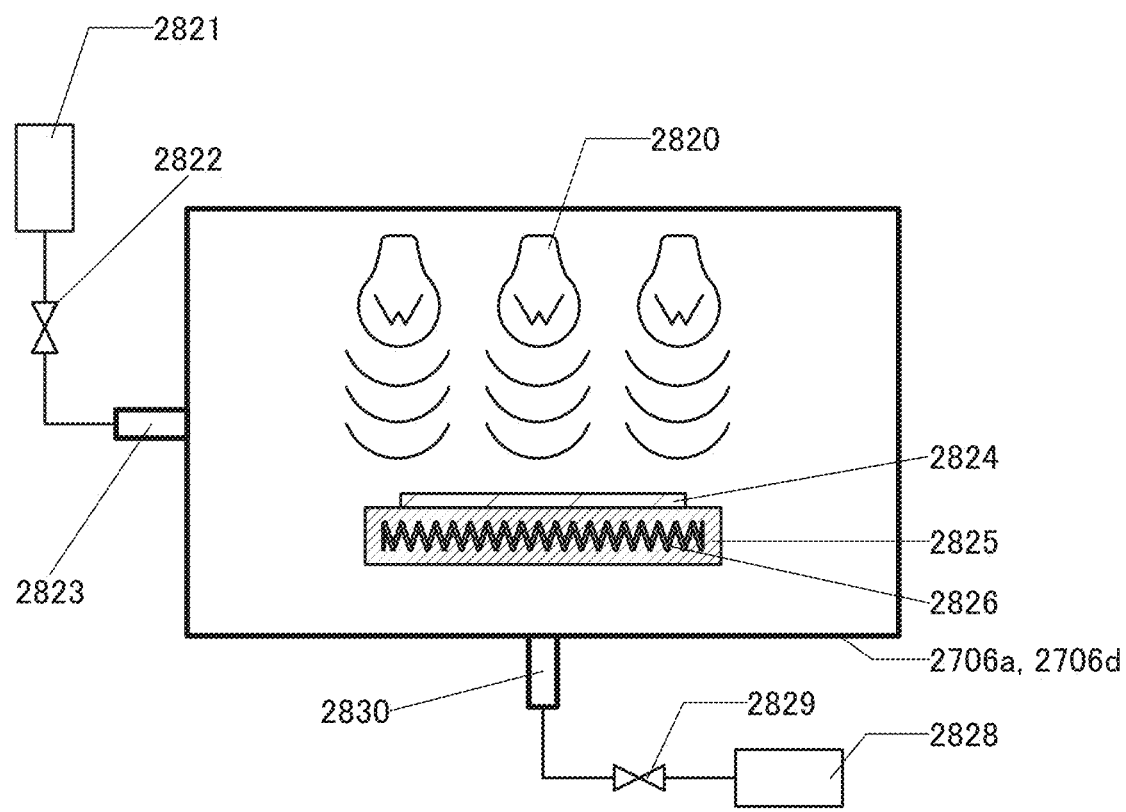
FIG. 17 is a cross-sectional view illustrating a microwave treatment apparatus of one embodiment of the present invention.

First, a structure of a manufacturing apparatus that allows entry of few impurities in manufacturing a semiconductor device or the like is described with reference to FIG. 15, FIG. 16, and FIG. 17.

Figure 15:
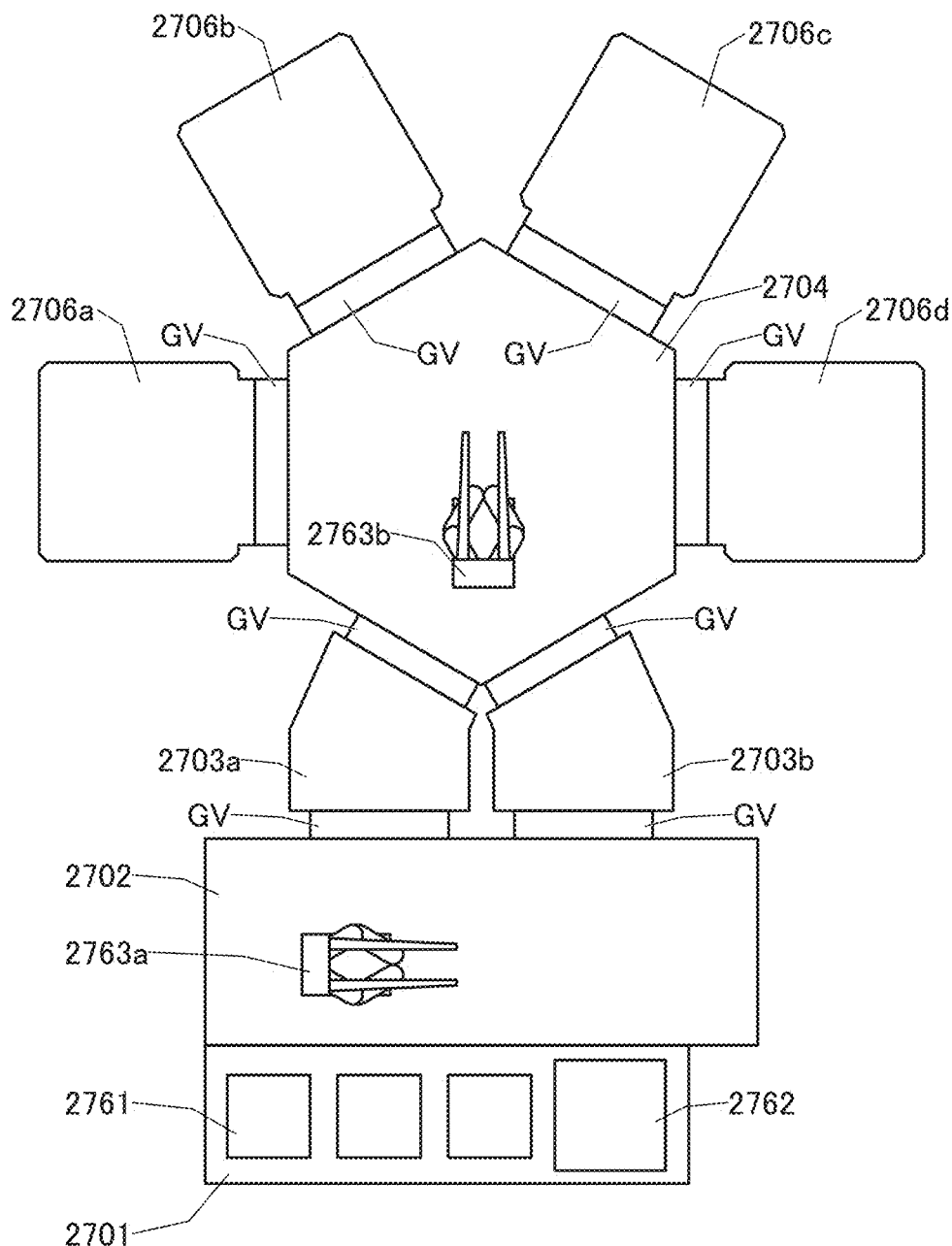
FIG. 15 is a top view illustrating a microwave treatment apparatus of one embodiment of the present invention.

FIG. 15 schematically illustrates a top view of a single wafer multi-chamber manufacturing apparatus 2700. The manufacturing apparatus 2700 includes an atmosphere-side substrate supply chamber 2701 including a cassette port 2761 for storing substrates and an alignment port 2762 for performing alignment of substrates; an atmosphere-side substrate transfer chamber 2702 through which a substrate is transferred from the atmosphere-side substrate supply chamber 2701; a load lock chamber 2703a where a substrate is carried in and the pressure inside the chamber is switched from atmospheric pressure to reduced pressure or from reduced pressure to atmospheric pressure; an unload lock chamber 2703b where a substrate is carried out and the pressure inside the chamber is switched from reduced pressure to atmospheric pressure or from atmospheric pressure to reduced pressure; a transfer chamber 2704 through which a substrate is transferred in a vacuum; a chamber 2706a; a chamber 2706b; a chamber 2706c; and a chamber 2706d.

Furthermore, the atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the chamber 2706a, the chamber 2706b, the chamber 2706c, and the chamber 2706d.

Note that gate valves GV are provided in connecting portions between the chambers so that each chamber excluding the atmosphere-side substrate supply chamber 2701 and the atmosphere-side substrate transfer chamber 2702 can be independently kept in a vacuum state. Furthermore, the atmosphere-side substrate transfer chamber 2702 is provided with a transfer robot 2763a, and the transfer chamber 2704 is provided with a transfer robot 2763b. With the transfer robot 2763a and the transfer robot 2763b, a substrate can be transferred inside the manufacturing apparatus 2700.

The back pressure (total pressure) in the transfer chamber 2704 and each of the chambers is, for example, lower than or equal to $1 \times 10^{-4}$ Pa, preferably lower than or equal to $3 \times 10^{-5}$ Pa, and further preferably lower than or equal to $1 \times 10^{-5}$ Pa. Furthermore, the partial pressure of a gas molecule (atom) having a mass-to-charge ratio (m/z) of 18 in the transfer chamber 2704 and each of the chambers is, for example, lower than or equal to $3 \times 10^{-5}$ Pa, preferably lower than or equal to $1 \times 10^{-5}$ Pa, and further preferably lower than or equal to $3 \times 10^{-6}$ Pa. Furthermore, the partial pressure of a gas molecule (atom) having m/z of 28 in the transfer chamber 2704 and each of the chambers is, for example, lower than or equal to $3 \times 10^{-5}$ Pa, preferably lower than or equal to $1 \times 10^{-5}$ Pa, and further preferably lower than or equal to $3 \times 10^{-6}$ Pa. Furthermore, the partial pressure of a gas molecule (atom) having m/z of 44 in the transfer chamber 2704 and each of the chambers is, for example, lower than or equal to $3 \times 10^{-5}$ Pa, preferably lower than or equal to $1 \times 10^{-5}$ Pa, and further preferably lower than or equal to $3 \times 10^{-6}$ Pa.

Note that the total pressure and the partial pressure in the transfer chamber 2704 and each of the chambers can be measured using a mass analyzer. For example, Qulee CGM-051, a quadrupole mass analyzer (also referred to as Q-mass) produced by ULVAC, Inc. can be used.

Furthermore, the transfer chamber 2704 and the chambers each desirably have a structure in which the amount of external leakage or internal leakage is small. For example, the leakage rate in the transfer chamber 2704 and each of the chambers is less than or equal to $3 \times 10^{-6}$ Pa·m³/s, and preferably less than or equal to $1 \times 10^{-6}$ Pa·m³/s. Furthermore, for example, the leakage rate of a gas molecule (atom) having m/z of 18 is less than or equal to $1 \times 10^{-7}$ Pa·m³/s, and preferably less than or equal to $3 \times 10^{-8}$ Pa·m³/s. Furthermore, for example, the leakage rate of a gas molecule (atom) having m/z of 28 is less than or equal to $1 \times 10^{-5}$ Pa·m³/s, and preferably less than or equal to $1 \times 10^{-6}$ Pa·m³/s. Furthermore, for example, the leakage rate of a gas molecule (atom) having m/z of 44 is less than or equal to $3 \times 10^{-6}$ Pa·m³/s, and preferably less than or equal to $1 \times 10^{-6}$ Pa·m³/s.

Note that a leakage rate can be derived from the total pressure and partial pressure measured using the above-described mass analyzer. The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or released gas from an internal member. Measures need to be taken from both aspects of external leakage and internal leakage in order that the leakage rate can be set to less than or equal to the above-described value.

For example, open/close portions of the transfer chamber 2704 and each of the chambers are preferably sealed with a metal gasket. For the metal gasket, metal covered with iron fluoride, aluminum oxide, or chromium oxide is preferably used. The metal gasket achieves higher adhesion than an O-ring and can reduce the external leakage. Furthermore, with the use of the metal covered with iron fluoride, aluminum oxide, chromium oxide, or the like, which is in the passive state, the release of gas containing impurities released from the metal gasket is inhibited, so that the internal leakage can be reduced.

Furthermore, for a member of the manufacturing apparatus 2700, aluminum, chromium, titanium, zirconium, nickel, or vanadium, which releases a small amount of gas containing impurities, is used. Furthermore, an alloy containing iron, chromium, nickel, and the like covered with the above-described material may be used. The alloy containing iron, chromium, nickel, and the like is rigid, resistant to heat, and suitable for processing. Here, when surface unevenness of the member is reduced by polishing or the like to reduce the surface area, the release of gas can be reduced.

Alternatively, the above-described member of the manufacturing apparatus 2700 may be covered with iron fluoride, aluminum oxide, chromium oxide, or the like.

The member of the manufacturing apparatus 2700 is preferably formed using only metal when possible, and in the case where a viewing window formed of quartz or the like is provided, for example, the surface is preferably thinly covered with iron fluoride, aluminum oxide, chromium oxide, or the like to inhibit release of gas.

An adsorbed substance present in the transfer chamber 2704 and each of the chambers does not affect the pressure in the transfer chamber 2704 and each of the chambers because it is adsorbed onto an inner wall or the like; however, it causes a release of gas when the transfer chamber 2704 and each of the chambers are evacuated. Thus, although there is no correlation between the leakage rate and the exhaust rate, it is important that the adsorbed substance present in the transfer chamber 2704 and each of the chambers be desorbed as much as possible and exhaust be performed in advance with the use of a pump with high exhaust capability. Note that the transfer chamber 2704 and each of the chambers may be subjected to baking to promote desorption of the adsorbed substance. By the baking, the desorption rate of the adsorbed substance can be increased about tenfold. The baking is performed at higher than or equal to 100° C. and lower than or equal to 450° C. At this time, when the adsorbed substance is removed while an inert gas is introduced into the transfer chamber 2704 and each of the chambers, the desorption rate of water or the like, which is difficult to desorb simply by exhaust, can be further increased. Note that when the inert gas to be introduced is heated to substantially the same temperature as the baking temperature, the desorption rate of the adsorbed substance can be further increased. Here, a rare gas is preferably used as the inert gas.

Alternatively, treatment for evacuating the transfer chamber 2704 and each of the chambers is preferably performed a certain period of time after a heated inert gas such as a rare gas, heated oxygen, or the like is introduced to increase the pressure in the transfer chamber 2704 and each of the chambers. The introduction of the heated gas can desorb the adsorbed substance in the transfer chamber 2704 and each of the chambers, and impurities present in the transfer chamber 2704 and each of the chambers can be reduced. Note that this treatment is effective when repeated more than or equal to 2 times and less than or equal to 30 times, and preferably more than or equal to 5 times and less than or equal to 15 times. Specifically, an inert gas, oxygen, or the like with a temperature higher than or equal to 40° C. and lower than or equal to 400° C., and preferably higher than or equal to 50° C. and lower than or equal to 200° C. is introduced, so that the pressure in the transfer chamber 2704 and each of the chambers can be kept to be higher than or equal to 0.1 Pa and lower than or equal to 10 kPa, preferably higher than or equal to 1 Pa and lower than or equal to 1 kPa, and further preferably higher than or equal to 5 Pa and lower than or equal to 100 Pa in the time range of 1 minute to 300 minutes, and preferably 5 minutes to 120 minutes. After that, the transfer chamber 2704 and each of the chambers are evacuated in the time range of 5 minutes to 300 minutes, and preferably 10 minutes to 120 minutes.

Next, the chamber 2706b and the chamber 2706c are described with reference to a schematic cross-sectional view illustrated in FIG. 16.

The chamber 2706b and the chamber 2706c are chambers that can perform microwave treatment on an object, for example. Note that the chamber 2706b is different from the chamber 2706c only in the atmosphere in performing the microwave treatment. The other structures are common and thus collectively described below.

The chamber 2706b and the chamber 2706c each include a slot antenna plate 2808, a dielectric plate 2809, a substrate holder 2812, and an exhaust port 2819. Furthermore, a gas supply source 2801, a valve 2802, a high-frequency generator 2803, a waveguide 2804, a mode converter 2805, a gas pipe 2806, a waveguide 2807, a matching box 2815, a high-frequency power source 2816, a vacuum pump 2817, and a valve 2818 are provided outside the chamber 2706b and the chamber 2706c, for example.

The high-frequency generator 2803 is connected to the mode converter 2805 through the waveguide 2804. The mode converter 2805 is connected to the slot antenna plate 2808 through the waveguide 2807. The slot antenna plate 2808 is positioned in contact with the dielectric plate 2809.

Furthermore, the gas supply source 2801 is connected to the mode converter 2805 through the valve 2802. Then, gas is transferred to the chamber 2706b and the chamber 2706c through the gas pipe 2806 that runs through the mode converter 2805, the waveguide 2807, and the dielectric plate 2809. Furthermore, the vacuum pump 2817 has a function of exhausting gas or the like from the chamber 2706b and the chamber 2706c through the valve 281 and the exhaust port 2819. Furthermore, the high-frequency power source 2816 is connected to the substrate holder 2812 through the matching box 2815.

The substrate holder 2812 has a function of holding a substrate 2811. For example, the substrate holder 2812 has a function as an electrostatic chuck or a mechanical chuck for holding the substrate 2811. Furthermore, the substrate holder 2812 has a function as an electrode to which electric power is supplied from the high-frequency power source 2816. Furthermore, the substrate holder 2812 includes a heating mechanism 2813 therein and has a function of heating the substrate 2811.

As the vacuum pump 2817, a dry pump, a mechanical booster pump, an ion pump, a titanium sublimation pump, a cryopump, or a turbomolecular pump can be used, for example. Furthermore, in addition to the vacuum pump 2827, a cryotrap may be used. The use of the cryopump and the cryotrap is particularly preferable because water can be efficiently exhausted.

Furthermore, for example, the heating mechanism 2813 is a heating mechanism that uses a resistance heater or the like for heating. Alternatively, a heating mechanism that uses heat conduction or heat radiation from a medium such as a heated gas for heating may be used. For example, RTA (Rapid Thermal Annealing) such as GRTA (Gas Rapid Thermal Annealing) or LRTA (Lamp Rapid Thermal Annealing) can be used. In GRTA, heat treatment is performed using a high-temperature gas. An inert gas is used as the gas.

Furthermore, the gas supply source 2801 may be connected to a purifier through a mass flow controller. As the gas, a gas whose dew point is −80° C. or lower, and preferably −100° C. or lower is preferably used. For example, an oxygen gas, a nitrogen gas, or a rare gas (an argon gas or the like) is used.

As the dielectric plate 2809, silicon oxide (quartz), aluminum oxide (alumina), or yttrium oxide (yttria) is used, for example. Furthermore, another protective layer may be further formed on a surface of the dielectric plate 2809. For the protective layer, magnesium oxide, titanium oxide, chromium oxide, zirconium oxide, hafnium oxide, tantalum oxide, silicon oxide, aluminum oxide, yttrium oxide, or the like is used. The dielectric plate 2809 is exposed to an especially high density region of high-density plasma 2810 described later; thus, provision of the protective layer can reduce the damage. Consequently, an increase in the number of particles or the like during the treatment can be inhibited.

The high-frequency generator 2803 has a function of generating a microwave of, for example, more than or equal to 03 GHz and less than or equal to 3.0 GHz, more than or equal to 0.7 GHz and less than or equal to 1.1 GHz, or more than or equal to 2.2 GHz and less than or equal to 2.8 GHz. The microwave generated by the high-frequency generator 2803 is propagated to the mode converter 2805 through the waveguide 2804. The mode converter 2805 converts the microwave propagated in the TE mode into a microwave in the TEM mode. Then, the microwave is propagated to the slot antenna plate 2808 through the waveguide 2807. The slot antenna plate 2808 is provided with a plurality of slot holes, and the microwave passes through the slot holes and the dielectric plate 2809. Then, an electric field is generated below the dielectric plate 2809, and the high-density plasma 2810 can be generated. In the high-density plasma 2810, ions and radicals based on the gas species supplied from the gas supply source 2801 are present. For example, oxygen radicals or nitrogen radicals are present.

At this time, the quality of a film or the like over the substrate 2811 can be modified by the ions and radicals generated in the high-density plasma 2810. Note that it is preferable in some cases to apply a bias to the substrate 2811 side using the high-frequency power source 2816. As the high-frequency power source 2816, an RF (Radio Frequency) power source with a frequency of 13.56 MHz, 27.12 MHz, or the like is used, for example. The application of a bias to the substrate side allows ions in the high-density plasma 2810 to efficiently reach a deep portion of an opening portion of the film or the like over the substrate 2811.

For example, in the chamber 2706*b*, oxygen radical treatment using the high-density plasma 2810 can be performed by introducing oxygen from the gas supply source 2801, and in the chamber 2706*c*, nitrogen radical treatment using the high-density plasma 2810 can be performed by introducing nitrogen from the gas supply source 2801.

Next, the chamber 2706*a* and the chamber 2706*d* are described with reference to a schematic cross-sectional view illustrated in FIG. 17.

The chamber 2706*a* and the chamber 2706*d* are chambers that can irradiate an object with an electromagnetic wave, for example. Note that the chamber 2706*a* is different from the chamber 2706*d* only in the kind of the electromagnetic wave. The other structures have many common portions and thus are collectively described below.

The chamber 2706*a* and the chamber 2706*d* each include one or a plurality of lamps 2820, a substrate holder 2825, a gas inlet 2823, and an exhaust port 2830. Furthermore, a gas supply source 2821, a valve 2822, a vacuum pump 2827, and a valve 2829 are provided outside the chamber 2706*a* and the chamber 2706*d*, for example.

The gas supply source 2821 is connected to the gas inlet 2823 through the valve 2822. The vacuum pump 2828 is connected to the exhaust port 2830 through the valve 2829. The lamp 2820 is provided to face the substrate holder 2825. The substrate holder 2825 has a function of holding a substrate 2824. Furthermore, the substrate holder 2825 includes a heating mechanism 2826 therein and has a function of heating the substrate 2824.

As the lamp 2820, a light source having a function of emitting an electromagnetic wave such as visible light or ultraviolet light is used, for example. For example, a light source having a function of emitting an electromagnetic wave which has a peak in a wavelength of longer than or equal to 10 nm and shorter than or equal to 2500 nm, longer than or equal to 500 nm and shorter than or equal to 2000 nm, or longer than or equal to 40 nm and shorter than or equal to 340 nm is used.

As the lamp 2820, a light source such as a halogen lamp, a metal halide lamp, a xenon arc lamp, a carbon arc lamp, a high-pressure sodium lamp, or a high-pressure mercury lamp is used, for example.

For example, part or the whole of electromagnetic wave emitted from the lamp 2820 is absorbed by the substrate 2824, so that the quality of a film or the like over the substrate 2824 can be modified. For example, generation or reduction of defects or removal of impurities can be performed. Note that generation or reduction of defects, removal of impurities, or the like can be efficiently performed while the substrate 2824 is heated.

Alternatively, for example, the electromagnetic wave emitted from the lamp 2820 may generate heat in the substrate holder 2825 to heat the substrate 2824. In this case, the substrate bolder 2825 does not need to include the beating mechanism 2826 therein.

For the vacuum pump 2827, refer to the description of the vacuum pump 2817. Furthermore, for the heating mechanism 2826, refer to the description of the heating mechanism 2813. Furthermore, for the gas supply source 2821, refer to the description of the gas supply source 2801.

With the use of the above-described manufacturing apparatus, the quality of a film or the like can be modified while the entry of impurities into an object is inhibited.

<Modification Example of Semiconductor Device>

Examples of a semiconductor device including the transistor 200 of one embodiment of the present invention, which are different from the semiconductor device described in <Structure example of semiconductor device> above, will be described below with reference to FIG. 18 to FIG. 21. Note that in the semiconductor device illustrated in FIG. 18 to FIG. 21, components having the same functions as the components in the semiconductor device described in <Structure example of semiconductor device> (see FIG. 1) are denoted by the same reference numerals. Note that in this section, the materials described in detail in <Structure example of semiconductor device> can be used as the constituent materials for the transistor 200.

<Modification Example 1 of Semiconductor Device>

Figure 18A:
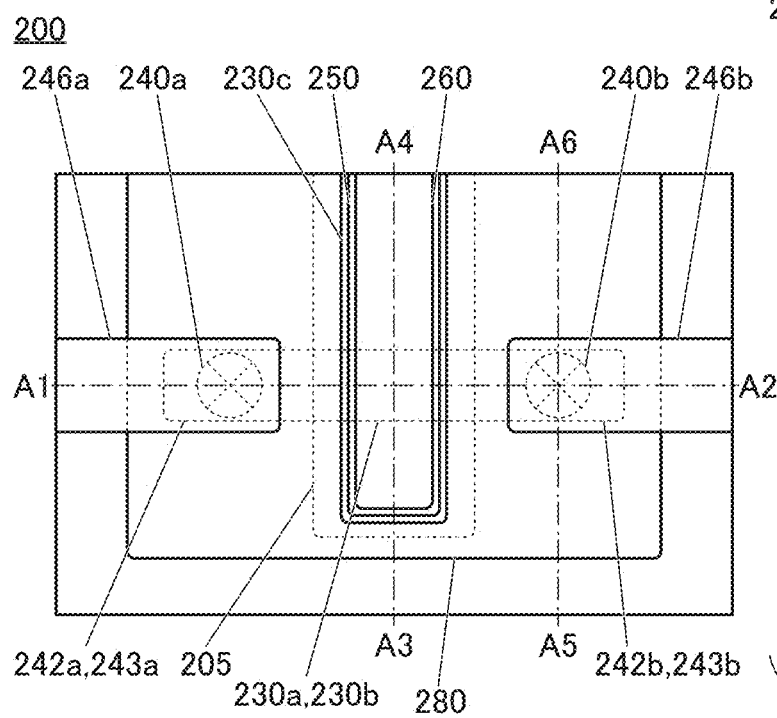
FIG. 18A, FIG. 18B, FIG. 18C, and FIG. 18D are a top view and cross-sectional views of a semiconductor device of one embodiment of the present invention.
Figure 18C:
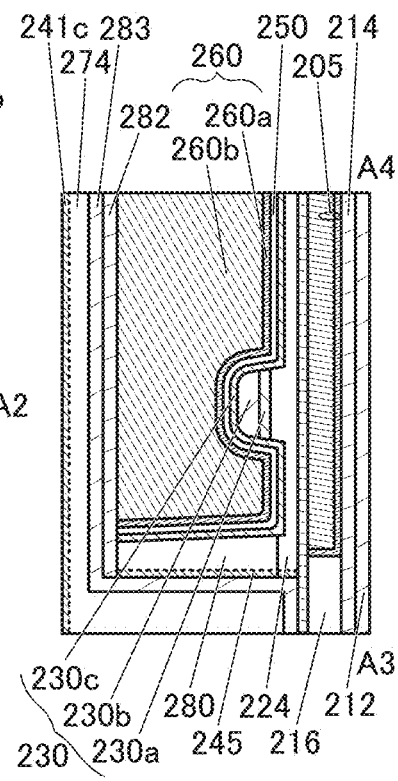
Figure 18B:
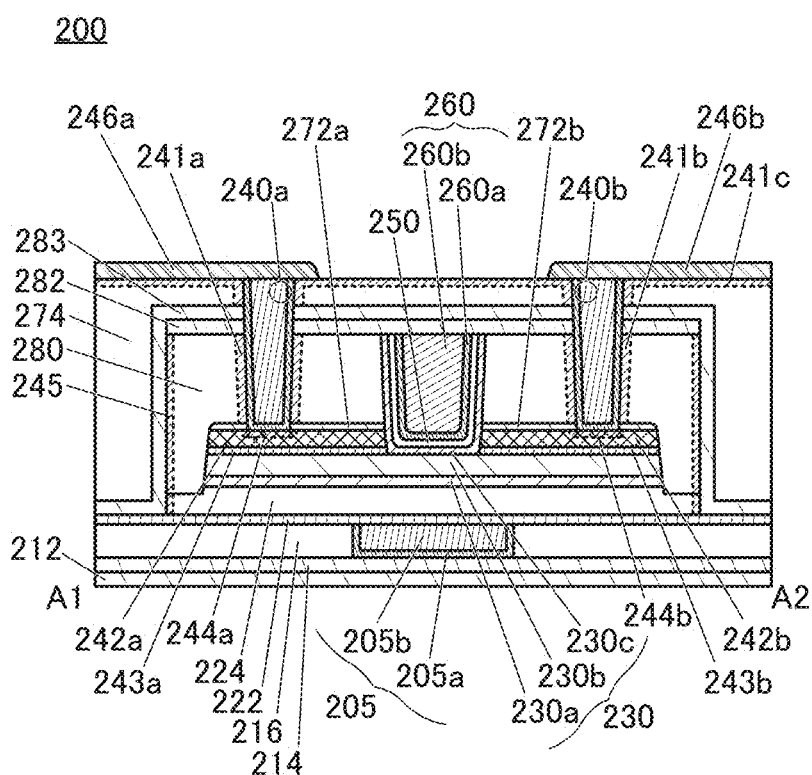
Figure 18D:
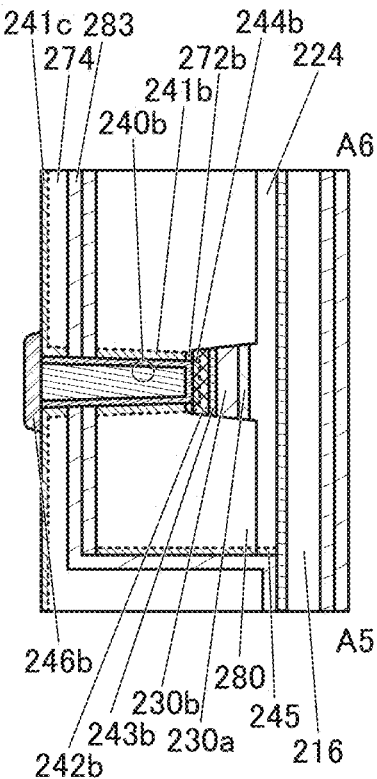

FIG. 18A is atop view of a semiconductor device including the transistor 200. FIG. 18B is a cross-sectional view corresponding to a portion indicated by dashed-dotted line A1-A2 in FIG. 18A, and is also a cross-sectional view of the transistor 200 in the channel length direction. FIG. 18C is a cross-sectional view corresponding to a portion indicated by dashed-dotted line A3-A4 in FIG. 18A, and is also a cross-sectional view of the transistor 200 in the channel width direction. FIG. 18D is a cross-sectional view corresponding to a portion indicated by dashed-dotted line A5-A6 in FIG. 18A. Note that for simplification of the drawing, some components are not illustrated in the top view in FIG. 18A.

The transistor 200 illustrated in FIG. 18 is different from the transistor 200 illustrated in FIG. 1 in that the insulator 224, the insulator 280, and the insulator 282 are patterned and sealed with the insulator 283 and the insulator 222. That is, the insulator 283 is in contact with the top surface and the side surface of the insulator 282, the side surface of the insulator 280, the side surface of the insulator 224, and the top surface of the insulator 222. Therefore, the region 245 is formed in the insulator 280 and the insulator 224. Thus, the insulator 224, the insulator 280, and the insulator 282 in addition to the oxide 230 and the like are isolated from the outside by the insulator 222 and the insulator 283.

With such a structure, the insulator 214, the insulator 216, and the insulator 222 do not need to be patterned, and thus the process can be simplified, and the productivity of the semiconductor device can be improved.

<Modification Example 2 of Semiconductor Device>

Figure 19A:
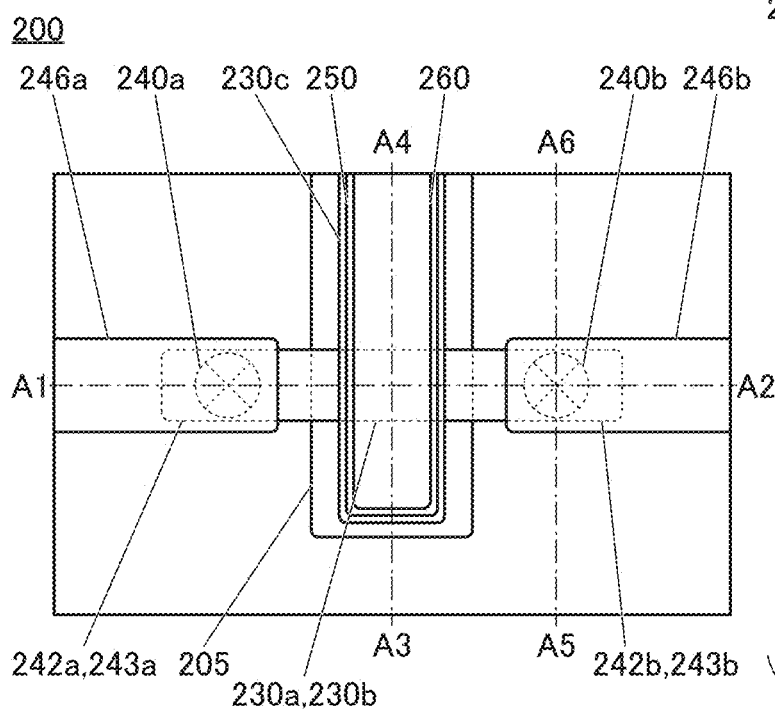
FIG. 19A, FIG. 19B, FIG. 19C, and FIG. 19D are a top view and cross-sectional views of a semiconductor device of one embodiment of the present invention.
Figure 19C:
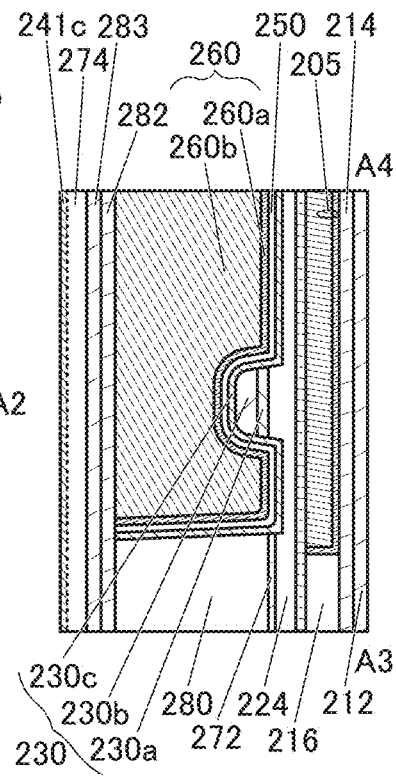
Figure 19B:
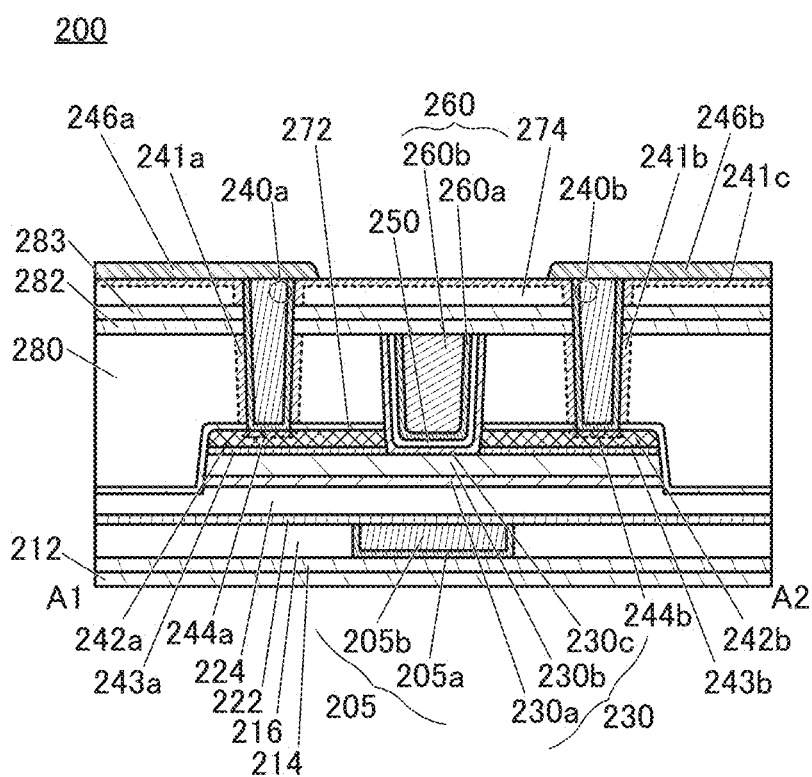
Figure 19D:
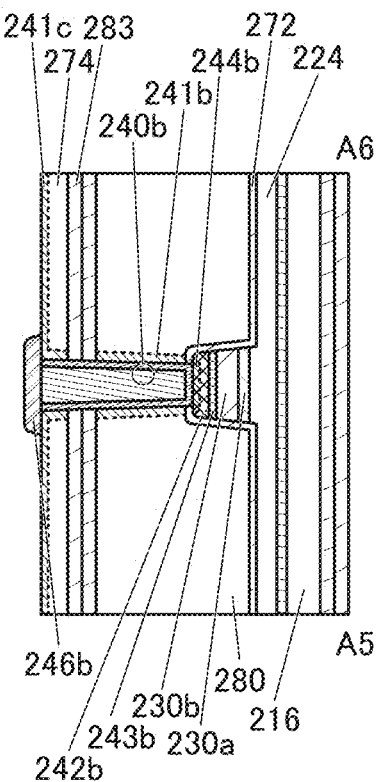

FIG. 19A is atop view of a semiconductor device including the transistor 200. FIG. 19B is a cross-sectional view corresponding to a portion indicated by dashed-dotted line A1-A2 in FIG. 19A, and is also a cross-sectional view of the transistor 200 in the channel length direction. FIG. 19C is a cross-sectional view corresponding to a portion indicated by dashed-dotted line A3-A4 in FIG. 19A, and is also a cross-sectional view of the transistor 200 in the channel width direction. FIG. 19D is a cross-sectional view corresponding to a portion indicated by dashed-dotted line A5-A6 in FIG. 19A. Note that for simplification of the drawing, some components are not illustrated in the top view in FIG. 19A.

The transistor 200 illustrated in FIG. 19 is different from the transistor 200 illustrated in FIG. 1 in that the insulator 214, the insulator 216, the insulator 222, the insulator 224, the insulator 280, and the insulator 282 are not patterned. Since the insulator 280, the insulator 224, and the insulator 216 are not patterned in the transistor 200 illustrated in FIG. 19, the region 245 is not formed.

With such a structure, the insulator 214, the insulator 216, the insulator 222, the insulator 224, the insulator 280, and the insulator 282 do not need to be patterned, and thus the process can be simplified, and the productivity of the semiconductor device can be improved.

Furthermore, the insulator 272 is provided to cover the insulator 224, the oxide 230a, the oxide 230b, the oxide 243, and the conductor 242 instead of the insulator 272a and the insulator 272b. For the insulator 272, an insulating film similar to the insulator 272a and the insulator 272b can be used.

The top surface and the side surface of the conductor 242, the side surface of the oxide 243, the side surface of the oxide 230a, and the side surface of the oxide 230b are covered with the insulator 272, and thus diffusion of oxygen and impurities such as hydrogen and water into the conductor 242 from the side surface direction of the conductor 242 and the top surface direction of the conductor 242 can be inhibited. Furthermore, the bottom surface of the conductor 242 is in contact with the oxide 243, and oxygen in the oxide 230b is blocked by the oxide 243 and thus inhibited from being diffused into the conductor 242. Hence, diffusion of oxygen into the conductor 242 from the periphery of the conductor 242 can be inhibited, so that oxidation of the conductor 242 can be inhibited. Impurities such as hydrogen and water can be inhibited from being diffused into the oxide 230a and the oxide 230b from the side surface direction of the oxide 230a and the side surface direction of the oxide 230b.

<Modification Example 3 of Semiconductor Device>

Figure 20A:
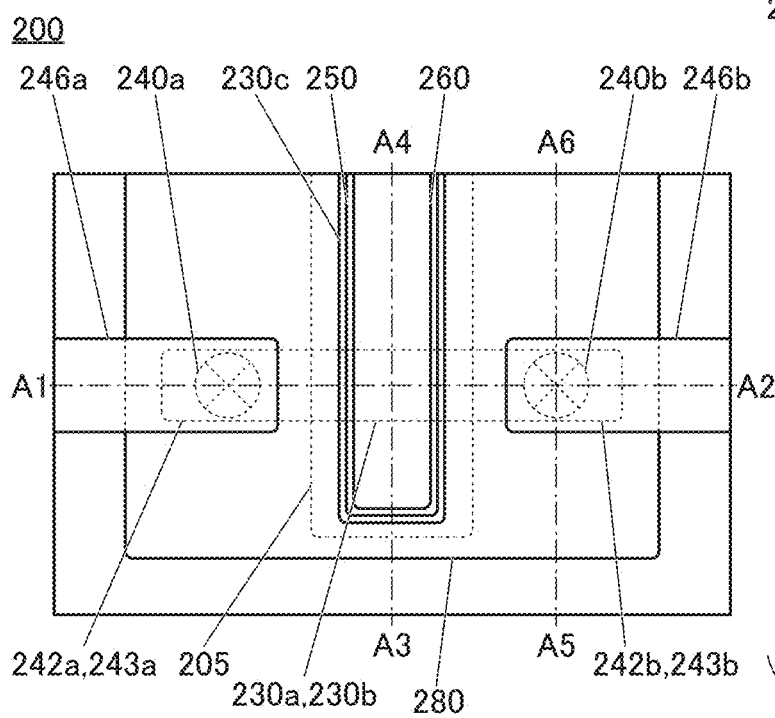
FIG. 20A, FIG. 20B, FIG. 20C, and FIG. 20D are a top view and cross-sectional views of a semiconductor device of one embodiment of the present invention.
Figure 20C:
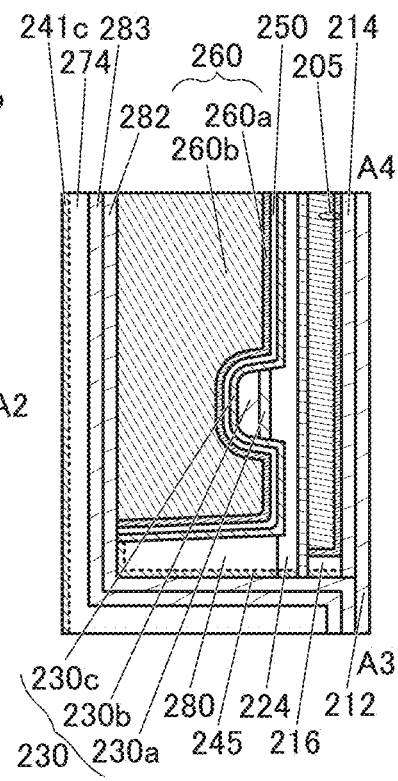
Figure 20B:
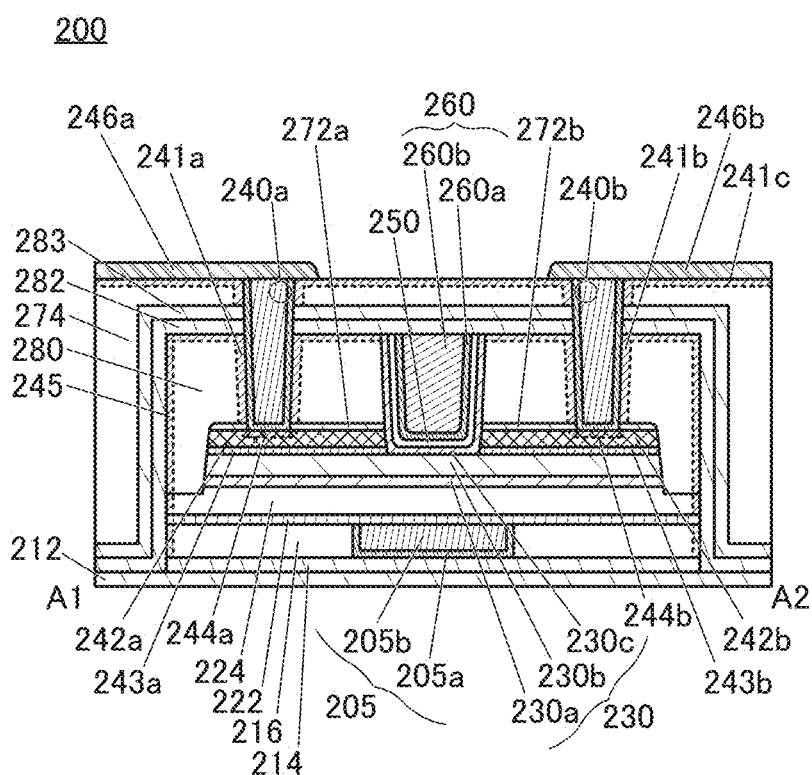
Figure 20D:
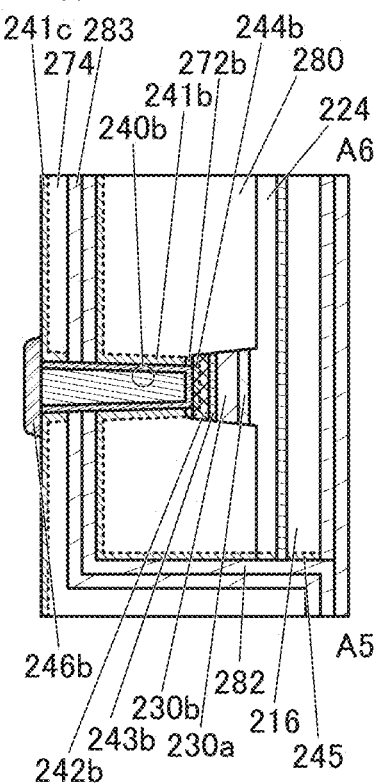

FIG. 20A is the top view of the semiconductor device including the transistor 200. FIG. 20B is a cross-sectional view corresponding to a portion indicated by dashed-dotted line A1-A2 in FIG. 20A, and is also a cross-sectional view of the transistor 200 in the channel length direction. FIG. 20C is a cross-sectional view corresponding to a portion indicated by dashed-dotted line A3-A4 in FIG. 20A, and is also a cross-sectional view of the transistor 200 in the channel width direction. FIG. 20D is a cross-sectional view corresponding to a portion indicated by dashed-dotted line A5-A6 in FIG. 20A. Note that for simplification of the drawing, some components are not illustrated in the top view in FIG. 20A.

The transistor 200 illustrated in FIG. 20 is different from the transistor 200 illustrated in FIG. 1 in that the insulator 214, the insulator 216, the insulator 222, the insulator 224, and the insulator 280 are patterned and sealed with the insulator 282 and the insulator 222. That is, the insulator 282 is in contact with the top surface and the side surface of the insulator 280, the side surface of the insulator 224, the side surface of the insulator 222, the side surface of the insulator 216, the side surface of the insulator 214, and the top surface of the insulator 212. Here, the insulator 283 is formed over the insulator 282.

In the case where the transistor 200 illustrated in FIG. 20 is manufactured, after formation of the conductor 260 and the like illustrated in FIG. 8, the step illustrated in FIG. 10 is performed without deposition of the insulator 282; thus, part of the insulator 280, part of the insulator 224, part of the insulator 222, part of the insulator 216, and part of the insulator 214 are processed to form an opening reaching the insulator 212. Furthermore, nitrogen plasma treatment is performed to form, on the exposed top and side surfaces of the insulator 280, the exposed side surface of the insulator 224, and the exposed side surface of the insulator 216, the region 245 having a higher nitrogen concentration than different regions of the insulator 280, the insulator 224, and the insulator 216 is formed. Then, the insulator 283 is deposited to cover the insulator 280, the insulator 224, the insulator 222, the insulator 216, and the insulator 214. Subsequent steps can be performed in a manner similar to the steps illustrated in the figures after FIG. 11.

In the transistor 200 illustrated in FIG. 20 and formed in this manner, the region 245 is also formed on the top surface of the insulator 280, unlike in the transistor 200 illustrated in FIG. 1. The insulator 214, the insulator 216, the insulator 222, the insulator 224, and the insulator 280 in addition to the oxide 230 and the like are isolated from the outside by the insulator 212, the insulator 282, and the insulator 283.

<Modification Example 4 of Semiconductor Device>

Figure 21A:
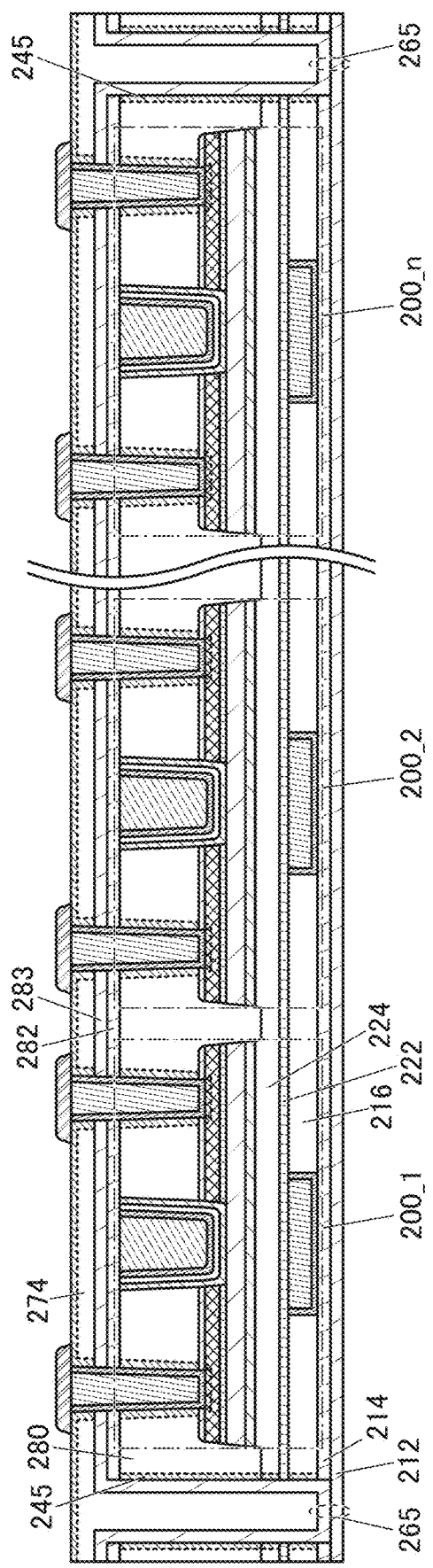
FIG. 21A and FIG. 21B are each a cross-sectional view of a semiconductor device of one embodiment of the present invention.
Figure 21B:
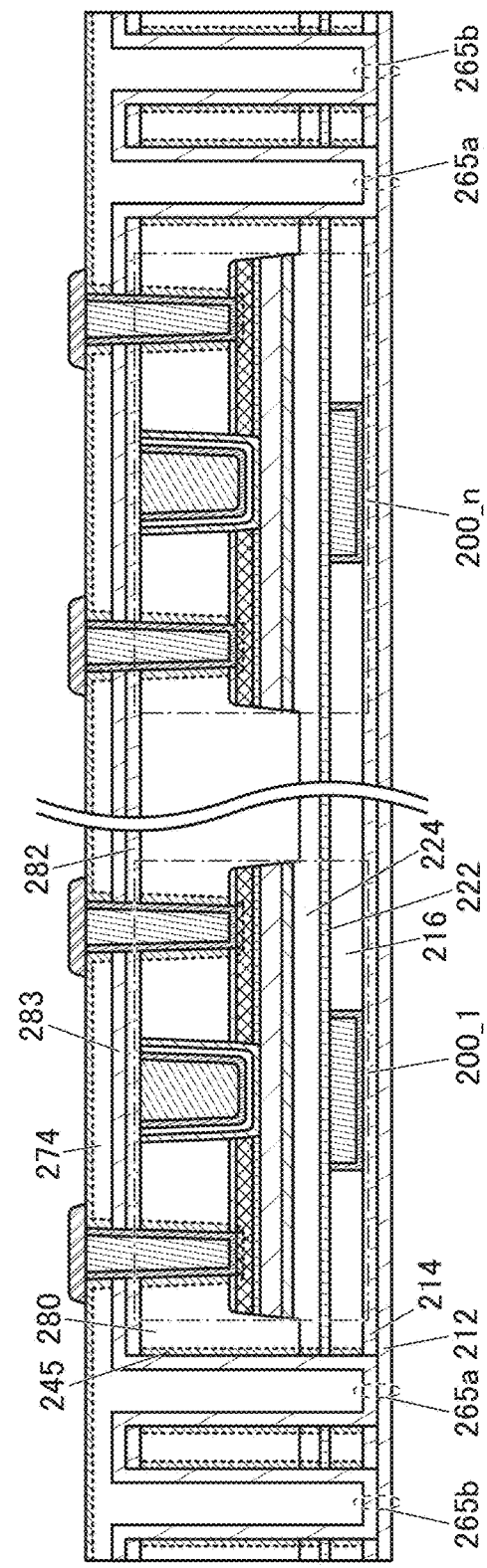

FIG. 21A and FIG. 21B each illustrate a structure in which a plurality of transistors 200_1 to 200_n are sealed with the insulator 283 and the insulator 212. Note that although the transistor 200_1 to the transistor 200_n appear to be arranged in the channel length direction in FIG. 21A and FIG. 21B, the present invention is not limited thereto. The transistor 200_1 to the transistor 200n may be arranged in the channel width direction, may be arranged in a matrix, or may be arranged without particular regularity.

As illustrated in FIG. 21A, a portion where the insulator 283 is in contact with the insulator 212 (hereinafter, sometimes referred to as a sealing portion 265) is formed outside the plurality of transistors 200_1 to 200_n. The sealing portion 265 is formed to surround the plurality of transistors 200_1 to 200_n. Such a structure enables the plurality of transistors 200_1 to 200_n to be surrounded by the insulator 283 and the insulator 212. That is, the four side surfaces and upper parts of the plurality of transistors 200_1 to 200_n can be surrounded by the insulator 283, and lower parts thereof can be surrounded by the insulator 212. As described above, a plurality of transistor groups surrounded by the sealing portion 265 are provided over a substrate.

The region 245 is formed on the side surfaces of the insulator 280, the insulator 224, and the insulator 216 in the vicinity of the sealing portion 265, and the transistor group surrounded by the sealing portion 265 is also surrounded by the region 245.

A dicing line (sometimes referred to as a scribe line, a dividing line, or a cutting line) may be provided to overlap with the sealing portion 265. The above substrate is divided at the dicing line, so that the transistor group surrounded by the sealing portion 265 is taken out as one chip.

Although the plurality of transistors 200_1 to 200_n are surrounded by one sealing portion 265 in the example illustrated in FIG. 21A, the present invention is not limited thereto. As illustrated in FIG. 21B, the plurality of transistors 200_1 to 200_n may be surrounded by a plurality of sealing portions. In FIG. 21B, the plurality of transistors 200_1 to 200_n are surrounded by a sealing portion 265a and are further surrounded by an outer sealing portion 265b.

When the plurality of transistors 200_1 to 200_n are surrounded by the plurality of sealing portions in this manner, a portion where the insulator 283 is in contact with the insulator 212 increases, which further can improve adhesion between the insulator 283 and the insulator 212. As a result, the plurality of transistors 200_1 to 200_$n$ can be more reliably sealed.

In that case, a dicing line may be provided to overlap with the sealing portion 265$a$ or the sealing portion 265$b$, or may be provided between the sealing portion 265$a$ and the sealing portion 265$b$.

According to one embodiment of the present invention, a semiconductor device having favorable electrical characteristics can be provided. According to one embodiment of the present invention, a semiconductor device having normally-off electrical characteristics can be provided. According to one embodiment of the present invention, a semiconductor device having favorable reliability can be provided. According to one embodiment of the present invention, a semiconductor device having a high on-state current can be provided. According to one embodiment of the present invention, a semiconductor device having excellent frequency characteristics can be provided. According to one embodiment of the present invention, a semiconductor device that can be miniaturized or highly integrated can be provided. According to one embodiment of the present invention, a semiconductor device having a low off-state current can be provided. According to one embodiment of the present invention, a semiconductor device with reduced power consumption can be provided. According to one embodiment of the present invention, a semiconductor device with high productivity can be provided.

Embodiment 2

In this embodiment, one embodiment of a semiconductor device is described with reference to FIG. 22 and FIG. 23.

[Memory Device 1]

Figure 22:
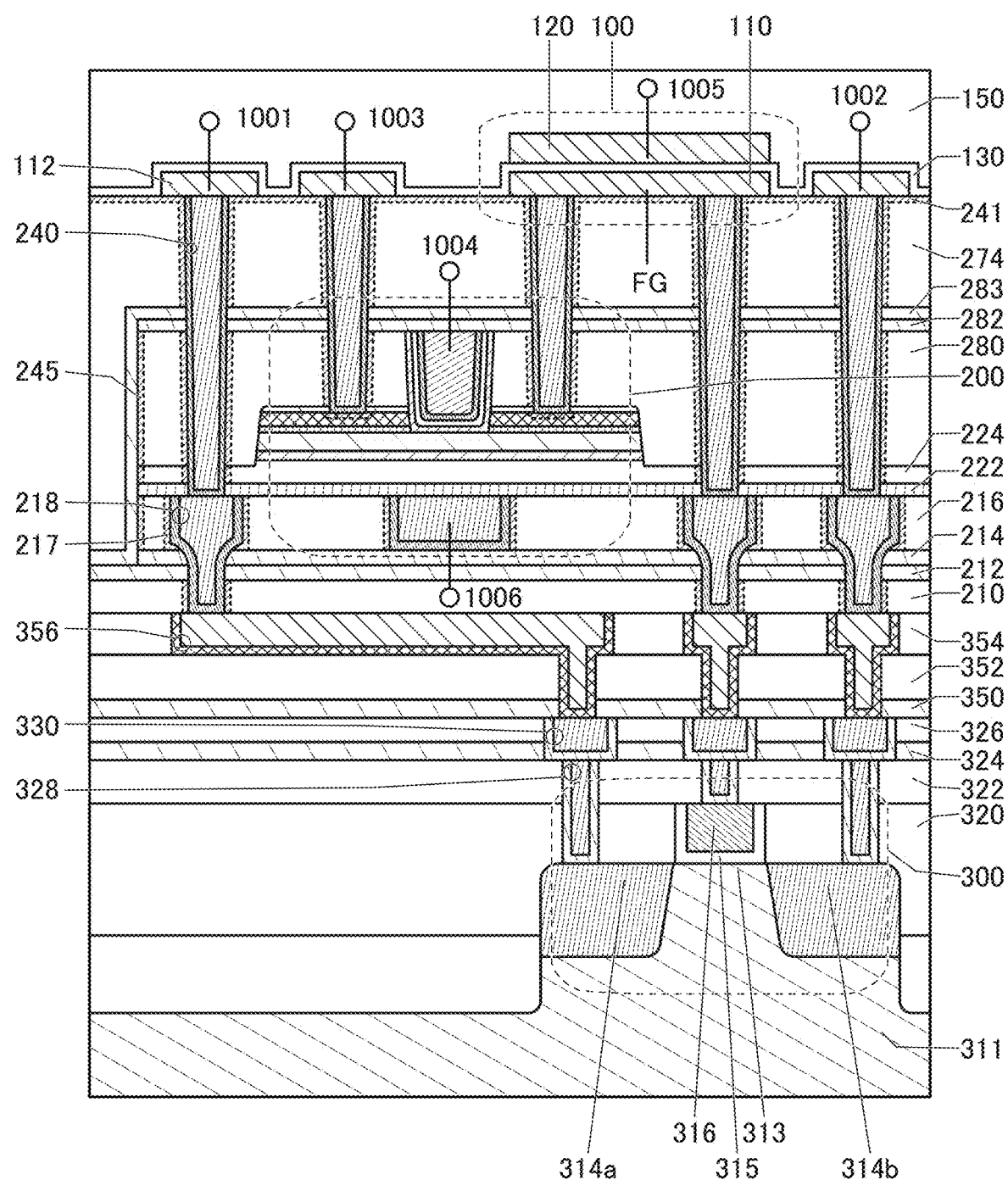
FIG. 22 is a cross-sectional view illustrating a structure of a memory device of one embodiment of the present invention.

FIG. 22 illustrates an example of a semiconductor device (a memory device) using a capacitor of one embodiment of the present invention. In the semiconductor device of one embodiment of the present invention, the transistor 200 is provided above a transistor 300, and a capacitor 100 is provided above the transistor 300 and the transistor 200. Note that the transistor 200 described in the above embodiment can be used as the transistor 200.

The transistor 200 is a transistor whose channel is formed in a semiconductor layer including an oxide semiconductor. Since the transistor 200 has a low off-state current, a memory device including the transistor 200 can retain stored data for a long time. In other words, such a memory device does not require refresh operation or has an extremely low frequency of the refresh operation, which leads to a sufficient reduction in power consumption of the memory device.

In the semiconductor device illustrated in FIG. 22, a wiring 1001 is electrically connected to a source of the transistor 300, and a wiring 1002 is electrically connected to a drain of the transistor 300. A wiring 1003 is electrically connected to one of the source and the drain of the transistor 200. A wiring 1004 is electrically connected to a first gate of the transistor 200. A wiring 1006 is electrically connected to a second gate of the transistor 200. A gate of the transistor 300 and the other of the source and the drain of the transistor 200 are electrically connected to one electrode of the capacitor 100. A wiring 1005 is electrically connected to the other electrode of the capacitor 100.

The memory devices illustrated in FIG. 22 can form a memory cell array when arranged in a matrix.

<Transistor 300>

The transistor 300 is provided over a substrate 311 and includes a conductor 316 functioning as a gate, an insulator 315 functioning as a gate insulator, a semiconductor region 313 formed of a part of the substrate 311, and a low-resistance region 314$a$ and a low-resistance region 314$b$ functioning as the source region and the drain region. The transistor 300 may be a p-channel type or an n-channel type.

Here, in the transistor 300 illustrated in FIG. 22, the semiconductor region 313 (part of the substrate 311) in which a channel is formed has a convex shape. Furthermore, the conductor 316 is provided to cover top and side surfaces of the semiconductor region 313 with the insulator 315 therebetween. Note that a material adjusting the work function may be used for the conductor 316. The transistor 300 having such a structure is also referred to as a FIN transistor because the projecting portion of the semiconductor substrate is utilized. An insulator functioning as a mask for forming the projecting portion may be included in contact with the top surface of the projecting portion. Although the case where the projecting portion is formed by processing part of the semiconductor substrate is described here, a semiconductor film having a projecting shape may be formed by processing an SOI substrate.

Note that the transistor 300 illustrated in FIG. 22 is an example and the structure is not limited thereto; an appropriate transistor is used in accordance with a circuit structure or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, a conductor 112 and the conductor 110 over the conductor 246 can be formed at the same time. Note that the conductor 112 functions as a plug or a wiring that is electrically connected to the capacitor 100, the transistor 200, or the transistor 300.

Although the conductor 112 and the conductor 110 having a single-layer structure are illustrated in FIG. 22, the structure is not limited thereto; a stacked-layer structure of two or more layers may be employed. For example, between a conductor having a barrier property and a conductor having high conductivity, a conductor which is highly adhesive to the conductor having a barrier property and the conductor having high conductivity may be formed.

For the insulator 130, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like is used, and a stacked layer or a single layer can be provided.

For example, for the insulator 130, a stacked-layer structure using a material with high dielectric strength such as silicon oxynitride and a high permittivity (high-k) material is preferably used. In the capacitor 100 having such a structure, a sufficient capacitance can be ensured owing to the high permittivity (high-k) insulator, and the dielectric strength can be increased owing to the insulator with high dielectric strength, so that the electrostatic breakdown of the capacitor 100 can be inhibited.

As the insulator of a high permittivity (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

As the material having a high dielectric strength (a material having a low relative permittivity), silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

<Wiring Layers>

Wiring layers provided with an interlayer film, a wiring, a plug, and the like may be provided between the structure bodies. A plurality of wiring layers can be provided in accordance with the design. Here, a plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases and part of a conductor functions as a plug in other cases.

For example, an insulator 320, an insulator 322, an insulator 324, and an insulator 326 are stacked over the transistor 300 in this order as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring.

The insulator functioning as an interlayer film may function as a planarization film that covers a roughness thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 22, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

Similarly, a conductor 218, a conductor (conductor 205) included in the transistor 200, and the like are embedded in an insulator 210, the insulator 212, the insulator 214, and the insulator 216. Note that the conductor 218 functions as a plug or a wiring that is electrically connected to the capacitor 100 or the transistor 300. In addition, an insulator 150 is provided over the conductor 120 and the insulator 130.

Here, like the region 241 described in the above embodiment, a region 217 which has been subjected to solid-phase nitridation is preferably formed in contact with the side surface of the conductor 218. The region 217 is formed in the vicinity of an inner wall of an opening formed in the insulator 210 and the insulator 216. That is, the region 217 is provided between the conductor 218 and the insulator 210 and the insulator 216. Note that the conductor 205 and the conductor 218 can be formed in parallel; thus, the region 217 is sometimes formed in contact with the side surface of the conductor 205.

Since the region 217 is formed in the vicinities of the side surfaces of the insulator 210 and the insulator 216, entry of impurities such as water and hydrogen from the insulator 210, the insulator 216, or the like into the oxide 230 through the conductor 218 can be inhibited. Moreover, by formation of the region 217, oxygen contained in the insulator 210 or the insulator 216 can be prevented from being absorbed by the conductor 218.

The region 217 can be formed in a manner similar to that of the region 241. For example, after formation of an opening in which the conductor 218 is embedded, nitrogen plasma treatment is performed, and thus the side surfaces of the insulator 210 and the insulator 216 are subjected to solid-phase nitridation to form the region 217. Note that in the case where the oxidation resistance of the conductor 218 is sufficiently high and the hydrogen concentration of the insulator 216 or the like is sufficiently lowered, the region 217 is not necessarily provided.

As an insulator that can be used as an interlayer film, an insulating oxide, an insulating nitride, an insulating oxynitride, an insulating nitride oxide, an insulating metal oxide, an insulating metal oxynitride, an insulating metal nitride oxide, or the like is given.

For example, when a material having a low relative permittivity is used for the insulator functioning as an interlayer film, the parasitic capacitance between wirings can be reduced. Accordingly, a material is preferably selected in accordance with the function of an insulator.

For example, for the insulator 150, the insulator 210, the insulator 352, the insulator 354, or the like, an insulator having a low relative permittivity is preferably used. For example, the insulator preferably includes silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Because silicon oxide and silicon oxynitride have thermal stability, a combination of silicon oxide or silicon oxynitride with a resin allows the stacked-layer structure to be thermally stable and have a low relative permittivity. Examples of the resin include polyester, polyolefin, polyamide (e.g., nylon and aramid), polyimide, polycarbonate, and acrylic.

When the transistor using an oxide semiconductor is surrounded by an insulator having a function of inhibiting transmission of oxygen and impurities such as hydrogen, the electrical characteristics of the transistor can be stabilized. Thus, the insulator having a function of inhibiting transmission of oxygen and impurities such as hydrogen can be used for the insulator 214, the insulator 212, the insulator 350, and the like.

The insulator having a function of inhibiting transmission of oxygen and impurities such as hydrogen can have, for example, a single-layer structure or a stacked-layer structure of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductors that can be used for wirings or plugs, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a semiconductor having a high electric conductivity typified by polycrystalline silicon containing an impurity element such as phosphorus, or silicide such as nickel silicide may be used.

For example, for the conductor 328, the conductor 330, the conductor 356, the conductor 218, the conductor 112, and the like, a single-layer structure or a stacked-layer structure using a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<Plugs in Layer Provided with Oxide Semiconductor>

As described in the above embodiment, the region 241 is preferably formed in contact with the side surface of the conductor 240 functioning as a plug. The region 241 is formed in the vicinity of the inner wall of the opening formed in the insulator 224, the insulator 280, and the insulator 274. In other words, the region 241 is provided between the conductor 240 and the insulator 224, the insulator 280, and the insulator 274. Note that when the top surface of the insulator 274 is exposed in formation of the region 241, the region 241 is also formed in the vicinity of the top surface of the insulator 274.

Since the region 241 is formed in the vicinities of the side surfaces of the insulator 224, the insulator 280, and the insulator 274, entry of impurities such as water and hydrogen from the insulator 224, the insulator 280, the insulator 274, or the like to the oxide 230 through the conductor 240 can be inhibited. In addition, the formation of the region 241 can prevent oxygen contained in the insulator 224, the insulator 280, and the insulator 274 from being absorbed by the conductor 240. Thus, the amount of hydrogen diffused from the conductor 240 to the conductor 242 and the oxide 230 can be reduced.

For example, the region 241 is formed in such a manner that after the formation of the opening in which the conductor 240 is embedded, nitrogen plasma treatment is performed, and the side surfaces of the insulator 224, the insulator 280, and the insulator 274 are subjected to solid-phase nitridation.

As in the above embodiment, the transistor 200 is preferably sealed with the insulator 283 and the insulator 212. Furthermore, the region 245 is preferably formed in the vicinities of interfaces of the insulator 216, the insulator 224, and the insulator 280 with the insulator 283. When the region 245 is formed between the insulator 283 and the insulator 280, the insulator 224, and the insulator 216, entry of hydrogen contained in the insulator 274 into the insulator 280 and the like can be reduced.

Here, the conductor 240 penetrates the insulator 283 and the conductor 218 penetrates the insulator 212; however, as described above, the region 241 is provided in contact with the conductor 240, and the region 217 is provided in contact with the conductor 218. This can also reduce hydrogen entering the inside of the insulator 283 and the insulator 212 through the conductor 240 and the conductor 218. In this manner, the transistor 200 is sealed more surely with the insulator 283, the insulator 212, the region 241, and the region 217, so that entry of impurities such as hydrogen contained in the insulator 274 or the like from the outside of the insulator 283 can be reduced.

As described in the above embodiment, the insulator 216, the insulator 224, the insulator 280, the insulator 250, and the insulator 274 are preferably formed by the deposition method using the gas in which hydrogen atoms are reduced or removed. Thus, the hydrogen concentrations of the insulator 216, the insulator 224, the insulator 280, the insulator 250, and the insulator 274 can be lowered.

As illustrated in FIG. 22, the conductor 240 and the conductor 218, which are the vias connected to the conductor 242, are provided in the insulator 216, the insulator 224, the insulator 280, and the insulator 274. As described above, when the hydrogen concentration of the insulator 216, the insulator 224, the insulator 280, and the insulator 274 is reduced, the amount of hydrogen diffused into the conductor 242 and the oxide 230 through the conductor 240 and the conductor 218 can be further reduced.

In this manner, the hydrogen concentration of silicon-based insulating films in the vicinity of the transistor 200 can be reduced; thus, the hydrogen concentration of the oxide 230 can be reduced.

<Dicing Line>

A dicing line (referred to as a scribe line, a dividing line, or a cutting line in some cases) which is provided when a large-sized substrate is divided into semiconductor elements so that a plurality of semiconductor devices are each formed in a chip form is described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 22, it is preferable that a region in which the insulator 283 and the insulator 212 are in contact with each other overlap with the dicing line. That is, an opening is provided in the insulator 280, the insulator 224, the insulator 222, the insulator 216, and the insulator 214 in the vicinity of a region to be the dicing line that is provided on an outer edge of the memory cell including the plurality of transistors 200.

That is, in the opening provided in the insulator 280, the insulator 224, the insulator 222, the insulator 216, and the insulator 214, the insulator 212 is in contact with the insulator 283. For example, the insulator 212 and the insulator 283 may be formed using the same material and the same method. When the insulator 212 and the insulator 283 are formed using the same material and the same method, the adhesion therebetween can be increased. For example, silicon nitride is preferably used.

With such a structure, the transistors 200 can be surrounded with the insulator 212 and the insulator 283. Since the insulator 212 and the insulator 283 have a function of inhibiting diffusion of oxygen, hydrogen, and water even when the substrate is divided into circuit regions each of which is provided with the semiconductor elements in this embodiment to form a plurality of chips, entry and diffusion of impurities such as hydrogen and water from the direction of a side surface of the divided substrate to the transistor 200 can be prevented.

With the structure, excess oxygen in the insulator 280 and the insulator 224 can be prevented from diffusing to the outside. Accordingly, excess oxygen in the insulator 280 and the insulator 224 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, the transistor 200 can have a small variation in the electrical characteristics and higher reliability.

The above is the description of the structure example. With the use of the structure, a semiconductor device using a transistor including an oxide semiconductor can have a small variation in electrical characteristics and higher reliability. Alternatively, a transistor including an oxide semiconductor with a high on-state current can be provided. Alternatively, a transistor including an oxide semiconductor with low off-state current can be provided. Alternatively, a semiconductor device with low power consumption can be provided.

[Memory Device 2]

Figure 23:
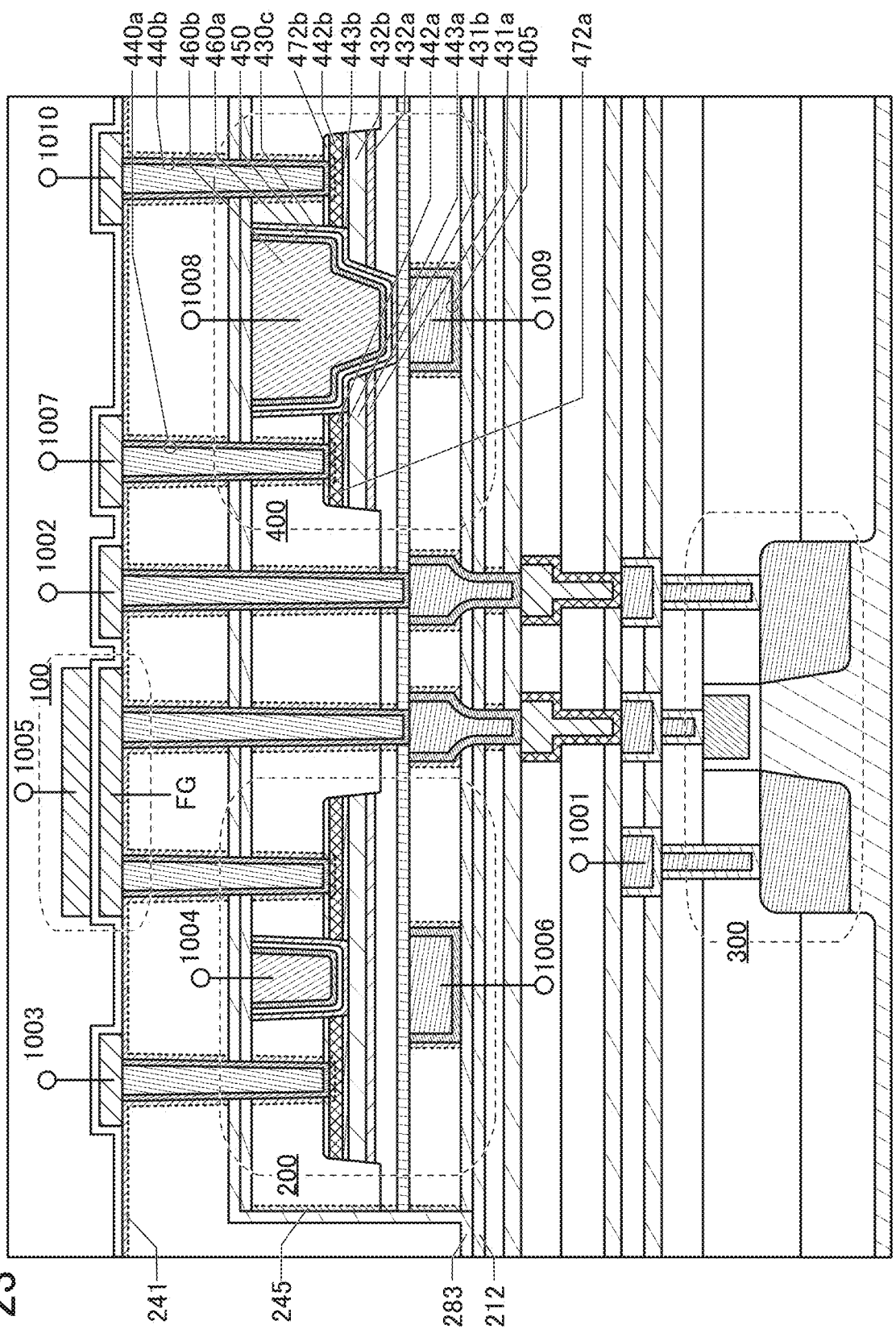
FIG. 23 is a cross-sectional view illustrating a structure of a memory device of one embodiment of the present invention.

FIG. 23 illustrates an example of a memory device using the semiconductor device of one embodiment of the present invention. The memory device illustrated in FIG. 23 includes a transistor 400 in addition to the semiconductor device including the transistor 200, the transistor 300, and the capacitor 100 illustrated in FIG. 22.

The transistor 400 can change a second gate voltage of the transistor 200. For example, a first gate and a second gate of the transistor 400 are diode-connected to a source, and the source of the transistor 400 is connected to the second gate of the transistor 200. When a negative potential of the second gate of the transistor 200 is held in this structure, a first gate-source voltage and a second gate-source voltage of the transistor 400 are 0 V. In the transistor 400, a drain current when the second gate voltage and the first gate voltage are 0 V is extremely low; thus, the negative potential of the second gate of the transistor 200 can be held for a long time even without power supply to the transistor 200 and the transistor 400. Accordingly, the memory device including the transistor 200 and the transistor 400 can retain stored data for a long time.

In FIG. 23, the wiring 1001 is electrically connected to the source of the transistor 300, and the wiring 1002 is electrically connected to the drain of the transistor 300. The wiring 1003 is electrically connected to one of the source and the drain of the transistor 200, the wiring 1004 is electrically connected to the gate of the transistor 200, and the wiring 1006 is electrically connected to a back gate of the transistor 200. The gate of the transistor 300 and the other of the source and the drain of the transistor 200 are electrically connected to one electrode of the capacitor 100. The wiring 1005 is electrically connected to the other electrode of the capacitor 100. A wiring 1007 is electrically connected to the source of the transistor 400. A wiring 1008 is electrically connected to a gate of the transistor 400. A wiring 1009 is electrically connected to a back gate of the transistor 400. A wiring 1010 is electrically connected to the drain of the transistor 400. The wiring 1006, the wiring 1007, the wiring 1008, and the wiring 1009 are electrically connected to each other.

When the memory device illustrated in FIG. 23 are arranged in a matrix like the memory device illustrated in FIG. 22, a memory cell array can be formed. Note that one transistor 400 can change second gate voltages of a plurality of transistors 200. For this reason, the number of transistors 400 is preferably smaller than the number of transistors 200. The transistor 200 and the transistor 400 can be sealed with the insulator 212 and the insulator 283 in the memory device illustrated in FIG. 23, as in the memory device illustrated in FIG. 22.

<Transistor 400>

The transistor 400 and the transistors 200 are formed in the same layer and thus can be fabricated in parallel. The transistor 400 includes a conductor 460 (a conductor 460a and a conductor 460b) functioning as a first gate; a conductor 405 (a conductor 405a and a conductor 405b) functioning as a second gate; the insulator 222 and an insulator 450 each functioning as a gate insulating layer; an oxide 430c including a channel formation region; a conductor 442a, an oxide 443a, an oxide 431a, and an oxide 431b functioning as a source; a conductor 442b, an oxide 443b, an oxide 432a, and an oxide 432b functioning as a drain; a conductor 440 (a conductor 440a and a conductor 440b) functioning as a plug; and an insulator 472 (an insulator 472a and an insulator 472b) functioning as a barrier insulating film of the conductor 442. Part of the region 241 formed in the insulator 280 and the insulator 274 functions as a barrier layer for the conductor 440.

In the transistor 400, the conductor 405 is in the same layer as the conductor 205. The oxide 431a and the oxide 432a are in the same layer as the oxide 230a, and the oxide 431b and the oxide 432b are in the same layer as the oxide 230b. The conductor 442 is in the same layer as the conductor 242. The oxide 443 is in the same layer as the oxide 243. The oxide 430c is in the same layer as the oxide 230c. The insulator 450 is in the same layer as the insulator 250. The conductor 460 is in the same layer as the conductor 260. The conductor 440 is in the same layer as the conductor 240. The insulator 472 is in the same layer as the insulator 272.

Note that the structure body in the same layer can be formed at the same time. For example, the oxide 430c can be formed by processing an oxide film to be the oxide 230c.

In the oxide 430c functioning as an active layer of the transistor 400, oxygen vacancies are reduced and impurities such as hydrogen or water are reduced, as in the oxide 230 or the like. Accordingly, the threshold voltage of the transistor 400 can be higher than 0 V, an off-state current can be reduced, and the drain current when the second gate voltage and the first gate voltage are 0 V can be extremely low.

The structures, methods, and the like described in this embodiment can be used in combination as appropriate with the structures, configurations, methods, and the like described in the other embodiments and other examples.

Embodiment 3

In this embodiment, a memory device of one embodiment of the present invention including a transistor in which an oxide is used for a semiconductor (hereinafter referred to as an OS transistor in some cases) and a capacitor (hereinafter referred to as an OS memory device in some cases), is described with reference to FIG. 24 and FIG. 25. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 24A:
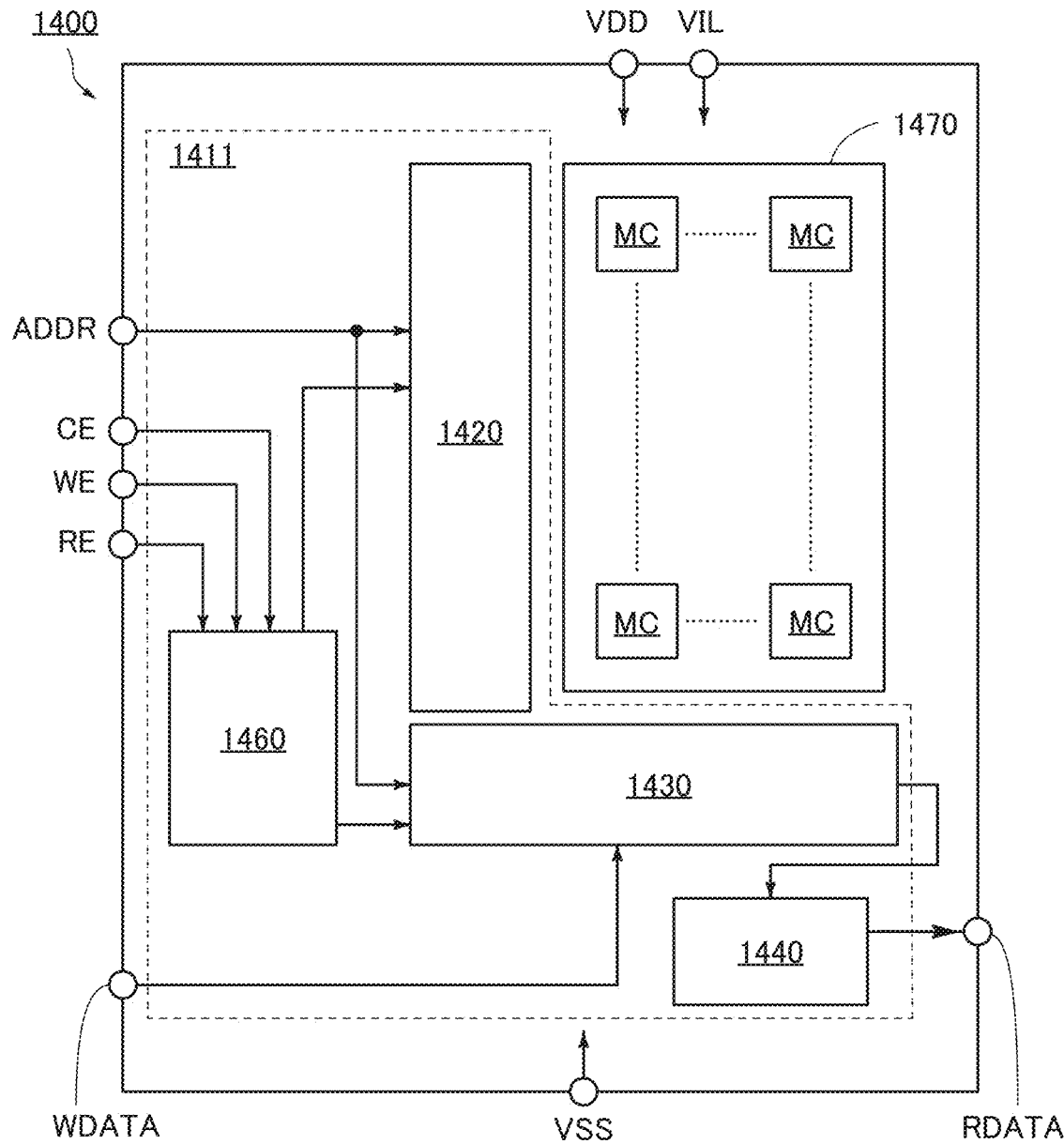
FIG. 24A and FIG. 24B are block diagrams each illustrating a structure example of a memory device of one embodiment of the present invention.

FIG. 24A illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and are described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and WDATA is input to the write circuit.

The control logic circuit 1460 processes the input signals (CE, WE, and RE) input from the outside, and generates control signals for the row decoder and the column decoder. CE is a chip enable signal, WE is a write enable signal, and RE is a read enable signal. Signals processed by the control logic circuit 1460 are not limited thereto, and other control signals may be input as necessary.

The memory cell array 1470 includes a plurality of memory cells MC arranged in a matrix and a plurality of wirings. Note that the number of the wirings that connect the memory cell army 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 24B:
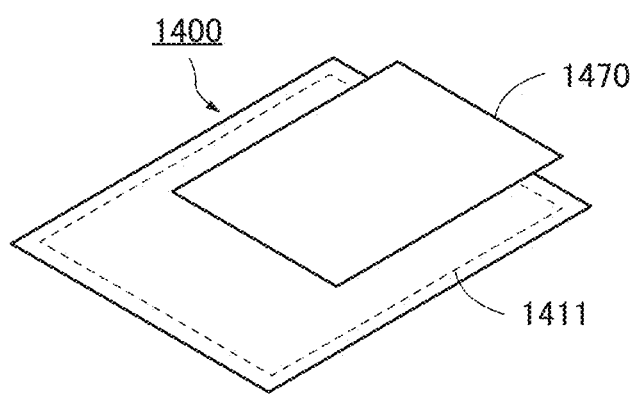

Note that FIG. 24A illustrates an example in which the peripheral circuit 1411 and the memory cell array 1470 are formed on the same plane; however, this embodiment is not limited thereto. For example, as illustrated in FIG. 24B, the memory cell array 1470 may be provided to overlap part of the peripheral circuit 1411. For example, the sense amplifier may be provided below the memory cell array 1470 so that they overlap with each other.

FIG. 25 illustrates structure examples of a memory cell applicable to the memory cell MC.

[DOSRAM]

Figure 25A:
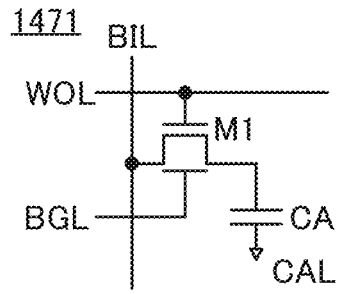
FIG. 25A, FIG. 25B, FIG. 25C, FIG. 25D, FIG. 25E, FIG. 25F, FIG. 25G, and FIG. 25H are circuit diagrams each illustrating a structure example of a memory device of one embodiment of the present invention.
Figure 25B:
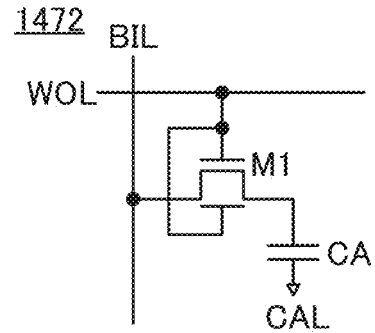
Figure 25C:
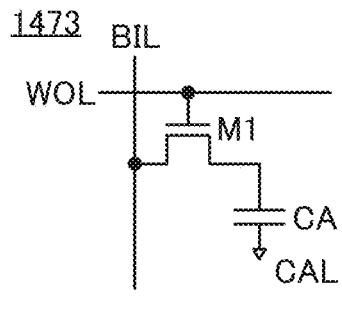
Figure 25D:
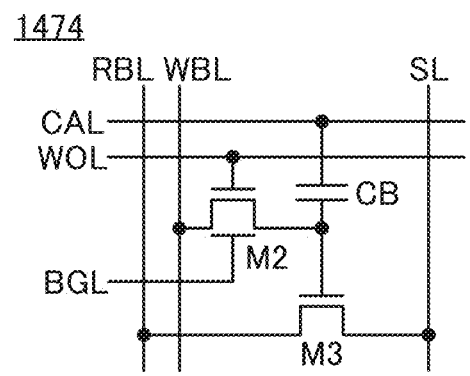
Figure 25E:
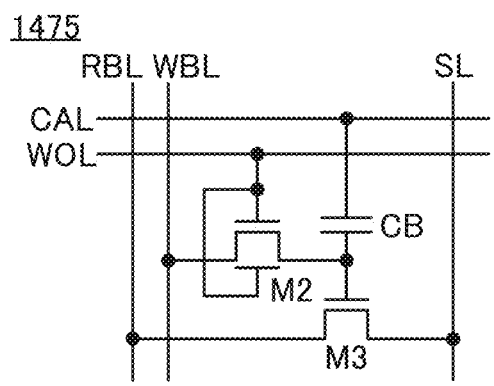
Figure 25F:
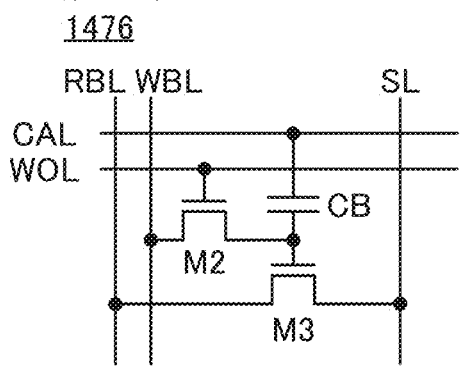
Figure 25G:
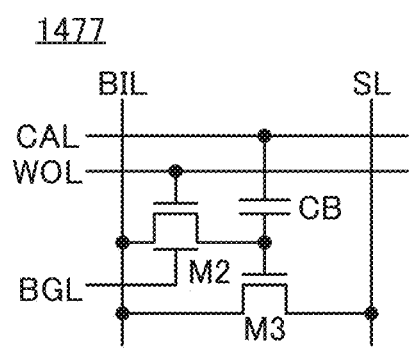

FIG. 25A to FIG. 25C each illustrate a circuit structure example of a memory cell of a DRAM. In this specification and the like, a DRAM using a memory cell including one OS transistor and one capacitor is referred to as DOSRAM (Dynamic Oxide Semiconductor Random Access Memory) in some cases. A memory cell 1471 illustrated in FIG. 25A includes a transistor M1 and a capacitor CA. Note that the transistor M1 includes a gate (also referred to as a front gate in some cases) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. Applying a given potential to the wiring BGL can increase or decrease the threshold voltage of the transistor M1.

The memory cell MC is not limited to the memory cell 1471, and the circuit structure can be changed. For example, as in a memory cell 1472 illustrated in FIG. 25B, the back gate of the transistor M1 may be connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 illustrated in FIG. 25C.

In the case where the semiconductor device described in any of the above embodiments is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of the refresh operation for the memory cell can be decreased. In addition, refresh operation of the memory cell can be unnecessary. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.

[NOSRAM]

FIG. 25D to FIG. 25H each illustrate a circuit structure example of a gain-cell memory cell including two transistors and one capacitor. A memory cell 1474 illustrated in FIG. 25D includes a transistor M2, a transistor M3, and a capacitor CB. Note that the transistor M2 includes a front gate (simply referred to as a gate in some cases) and a back gate. In this specification and the like, a memory device including a gain-cell memory cell using an OS transistor as the transistor M2 is referred to as NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. A gate of the transistor M2 is connected to the wiring WOL. A back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a potential to the back gate of the transistor M2. By application of a given potential to the wiring BGL, the threshold voltage of the transistor M2 can be increased or decreased.

The memory cell MC is not limited to the memory cell 1474, and the circuit structure can be changed as appropriate. For example, as in a memory cell 1475 illustrated in FIG. 25E, the back gate of the transistor M2 may be connected not to the wiring BGL but to the wiring WOL in the memory cell MC. Alternatively, for example, the memory cell MC may be a memory cell including a single-gate transistor, that is, the transistor M2 not including a back gate, as in a memory cell 1476 illustrated in FIG. 25F. Alternatively, for example, as in a memory cell 1477 illustrated in FIG. 25G, the wiring WBL and the wiring RBL may be combined into one wiring BIL in the memory cell MC.

In the case where the semiconductor device described in any of the above embodiments is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. That is, with the use of the transistor M2, written data can be retained for a long time, and thus the frequency of the refresh operation for the memory cell can be decreased. Alternatively, refresh operation of the memory cell can be unnecessary. In addition, since the transistor M2 has an extremely low leakage current, multi-level data or analog data can be retained in the memory cell 1474. The same applies to the memory cells 1475 to 1477.

Note that the transistor M3 may be a transistor containing silicon in a channel formation region (hereinafter also referred to as a Si transistor in some cases). The conductivity type of the Si transistor may be of either an n-channel type or a p-channel type. The Si transistor has higher field-effect mobility than the OS transistor in some cases. Therefore, a Si transistor may be used as the transistor M3 functioning as a reading transistor. Furthermore, the transistor M2 can be provided to be stacked over the transistor M3 when a Si transistor is used as the transistor M3; therefore, the area occupied by the memory cell can be reduced, leading to high integration of the memory device.

Alternatively, the transistor M3 may be an OS transistor. When an OS transistor is used as each of the transistors M2 and M3, the circuit of the memory cell array 1470 can be formed using only n-channel transistors.

Figure 25H:
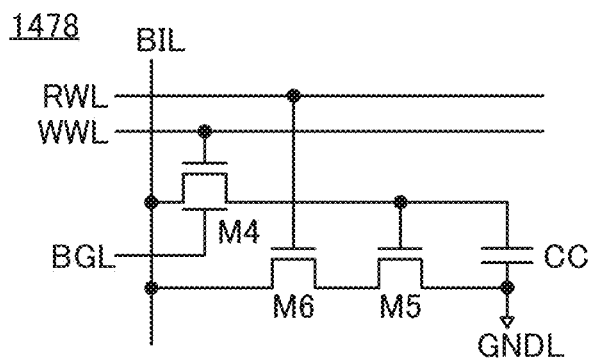

FIG. 25H illustrates an example of a gain-cell memory cell including three transistors and one capacitor. A memory cell 1478 illustrated in FIG. 25H includes transistors M4 to M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wirings RBL and WBL instead of the wiring BIL.

The transistor M4 is an OS transistor including a back gate that is electrically connected to the wiring BGL. Note that the back gate and the gate of the transistor M4 may be electrically connected to each other. Alternatively, the transistor M4 does not necessarily include the back gate.

Note that each of the transistors M5 and M6 may be an n-channel Si transistor or a p-channel Si transistor. Alternatively, the transistors M4 to M6 may be OS transistors, in which case the circuit of the memory cell array 1470 can be formed using only n-channel transistors.

In the case where the semiconductor device described in any of the above embodiments is used in the memory cell 1478, the transistor 200 can be used as the transistor M4, the transistor 300 can be used as the transistors M5 and M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. Positions and functions of these circuits, wirings connected to the circuits, circuit elements, and the like can be changed, deleted, or added as needed.

The structures, methods, and the like described in this embodiment can be used in combination as appropriate with the structures, configurations, methods, and the like described in the other embodiments and other examples.

Embodiment 4

In this embodiment, an example of a chip 1200 on which the semiconductor device of the present invention is mounted is described with reference to FIG. 26. A plurality of circuits (systems) are mounted on the chip 1200. The technique for integrating a plurality of circuits (systems) on one chip as described above is referred to as system on chip (SoC) in some cases.

Figure 26A:
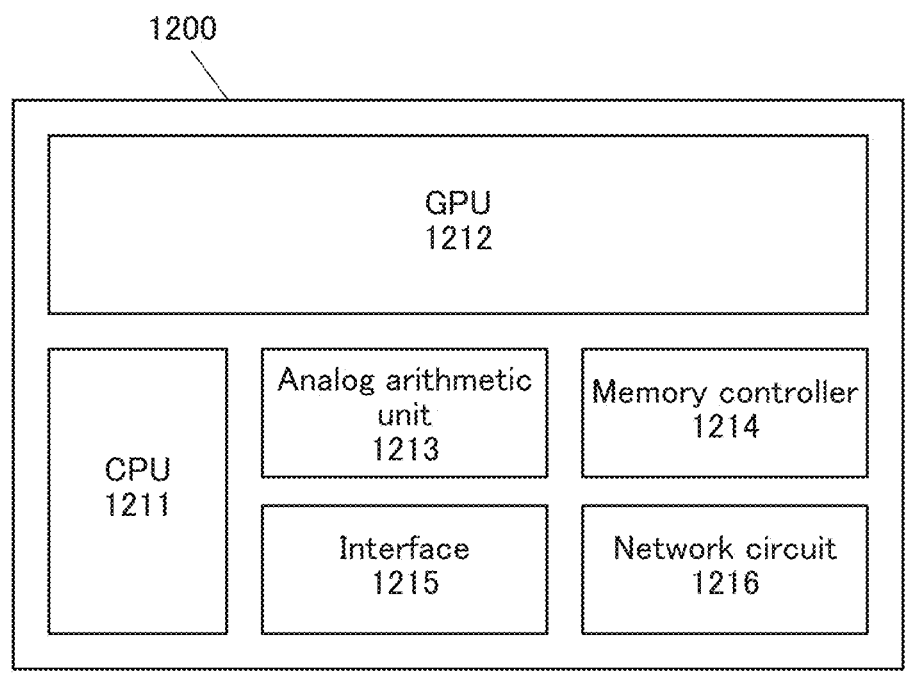
FIG. 26A and FIG. 26B are schematic diagrams of a semiconductor device of one embodiment of the present invention.

As illustrated in FIG. 26A, the chip 1200 includes a CPU (Central Processing Unit) 1211, a GPU (Graphics Processing Unit) 1212, one or more of analog arithmetic units 1213, one or more of memory controllers 1214, one or more of interfaces 1215, one or more of network circuits 1216, and the like.

Figure 26B:
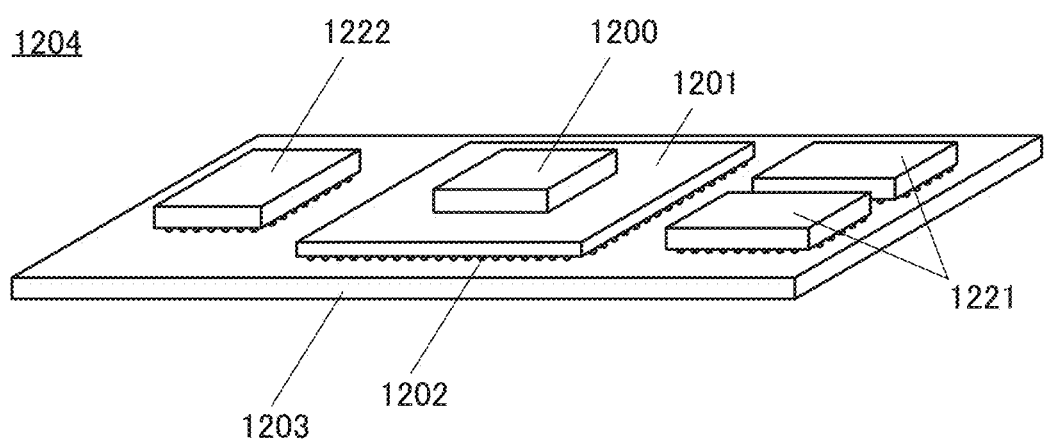

A bump (not illustrated) is provided on the chip 1200, and as illustrated in FIG. 26B, the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can implement an arithmetic operation such as a deep neural network (DNN), a convolutional neural network (CNN), a recurrent neural network (RNN), an autoencoder, a deep Boltzmann machine (DBM), or a deep belief network (DBN); thus, the chip 1200 can be used as an AI chip or the GPU module 1204 can be used as an AI system module.

The structures, methods, and the like described in this embodiment can be used in combination as appropriate with the structures, configurations, methods, and the like described in the other embodiments and other examples.

Embodiment 5

In this embodiment, application examples of the memory device using the semiconductor device described in the above embodiment are described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 27 schematically illustrates some structure examples of removable memory devices. The semiconductor device described in the above embodiment is processed into a packaged memory chip and used in a variety of storage devices and removable memories, for example.

Figure 27A:
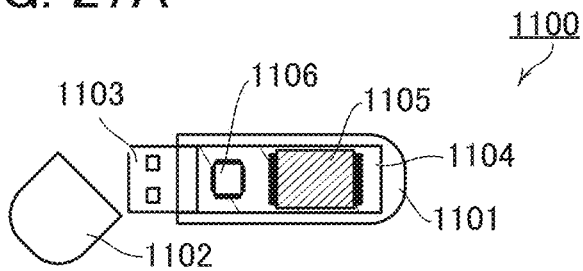
FIG. 27A, FIG. 27B, FIG. 27C, FIG. 27D, and FIG. 27E are schematic diagrams of memory devices of embodiments of the present invention.

FIG. 27A is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

Figures 27B, 27C:
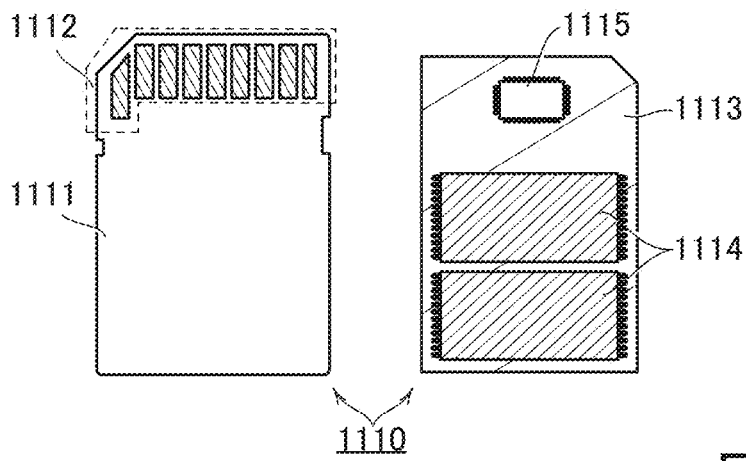

FIG. 27B is a schematic external view of an SD card, and FIG. 27C is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

Figures 27D, 27E:
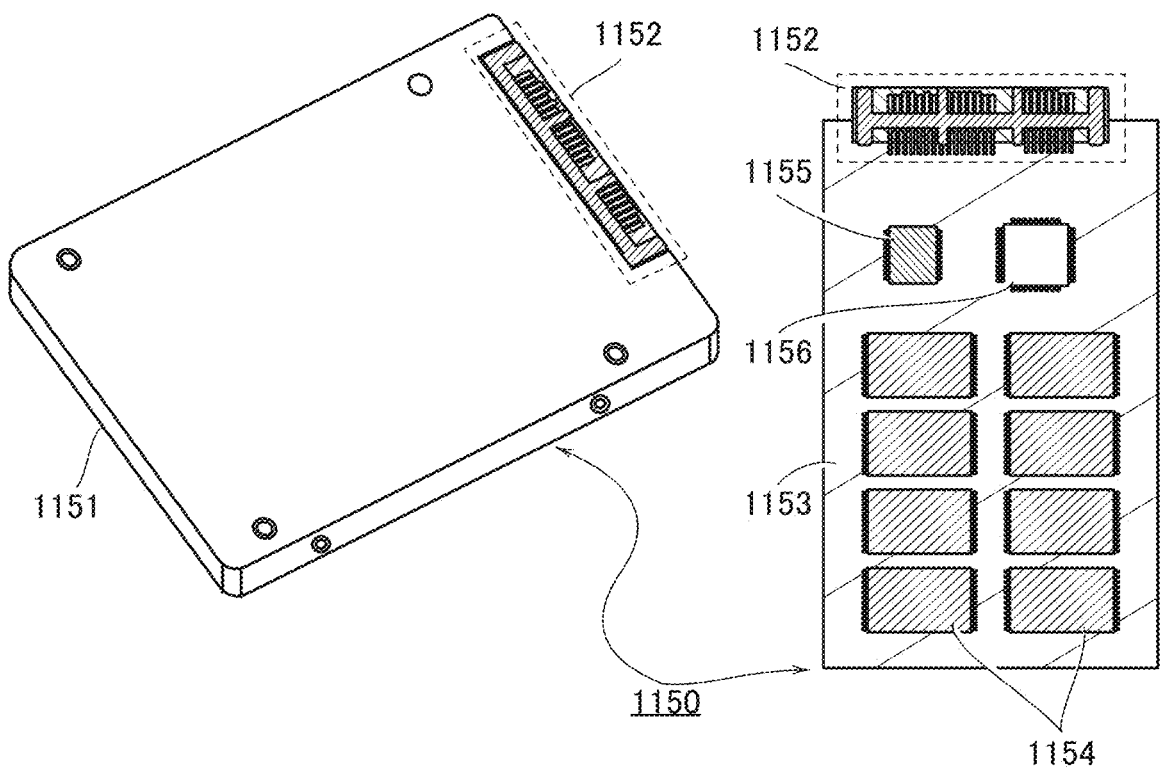

FIG. 27D is a schematic external view of an SSD, and FIG. 27E is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like on the substrate 1153.

The structures, methods, and the like described in this embodiment can be used in combination as appropriate with the structures, configurations, methods, and the like described in the other embodiments and other examples.

Embodiment 6

In this embodiment, specific examples of electronic devices to which the semiconductor device of one embodiment of the present invention can be applied are described with reference to FIG. 28.

Specifically, the semiconductor device of one embodiment of the present invention can be used for a processor such as a CPU and a GPU or a chip. FIG. 28 illustrates specific examples of electronic devices including a processor such as a CPU and a GPU or a chip of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, a mobile phone, a portable game console, a portable information terminal, and an audio reproducing device in addition to electronic devices provided with a relatively large screen, such as a television device, a desktop or laptop personal computer, a monitor for a computer and the like, digital signage, and a large game machine like a pachinko machine. In addition, when the integrated circuit or the chip of one embodiment of the present invention is provided in the electronic device, the electronic device can include artificial intelligence.

The electronic device of one embodiment of the present invention may include an antenna. When a signal is received by the antenna, a video, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, a position, speed, acceleration, angular velocity, rotational frequency, distance, light, liquid, magnetism, temperature, a chemical substance, sound, time, hardness, an electric field, current, voltage, electric power, radioactive rays, a flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 28 illustrates examples of the electronic device.

[Mobile Phone]

Figure 28A:
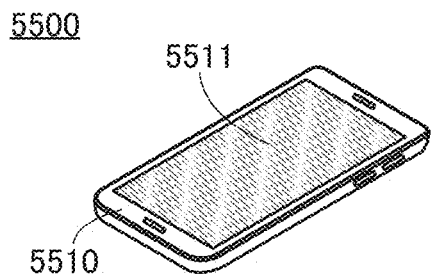

FIG. 28A illustrates a mobile phone (smartphone) which is a type of an information terminal. An information terminal 5500 includes a housing 5510 and a display portion 5511, and as input interfaces, a touch panel is provided in the display portion 5511 and a button is provided in the housing 5510.

The information terminal 5500 can execute an application utilizing artificial intelligence with the use of the chip of one embodiment of the present invention. Examples of the application utilizing artificial intelligence include an application for recognizing a conversation and displaying the contents of the conversation on the display portion 5511; an application for recognizing letters, figures, and the like input to the touch panel of the display portion 5511 by a user and displaying them on the display portion 5511; and an application for performing biometric authentication using fingerprints, voice prints, or the like.

[Information Terminal 1]

Figure 28B:
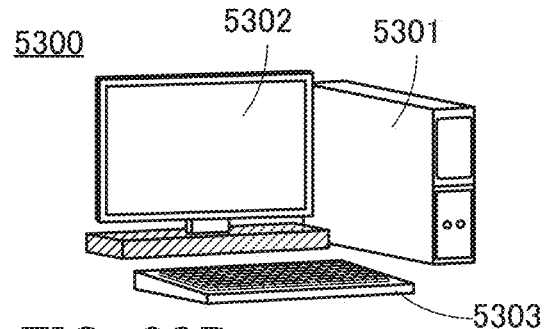

FIG. 28B illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the chip of one embodiment of the present invention as the information terminal 5500 described above. Examples of the application utilizing artificial intelligence include design-support software, text correction software, and software for automatic menu generation. Furthermore, with the use of the desktop information terminal 5300, novel artificial intelligence can be developed.

Note that in the above description, although the smartphone and the desktop information terminal are respectively illustrated in FIG. 28A and FIG. 28B as examples of the electronic device, one embodiment of the present invention can also be applied to an information terminal other than the smartphone and the desktop information terminal. Examples of an information terminal other than a smartphone and a desktop information terminal include a PDA (Personal Digital Assistant), a laptop information terminal, and a workstation.

[Electronic Device]

Figure 28C:
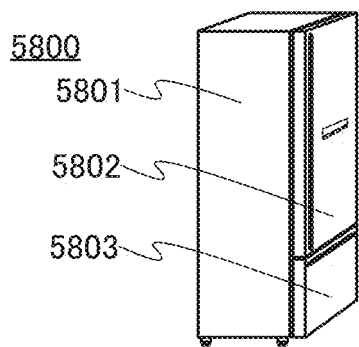

FIG. 28C illustrates an electric refrigerator-freezer 5800 which is an example of an electronic device. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting the temperature to be appropriate for the foods stored in the electric refrigerator-freezer 5800, and the like.

Although the electric refrigerator-freezer is described as an electronic device in the example, other examples of the electronic device include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Console]

Figure 28D:
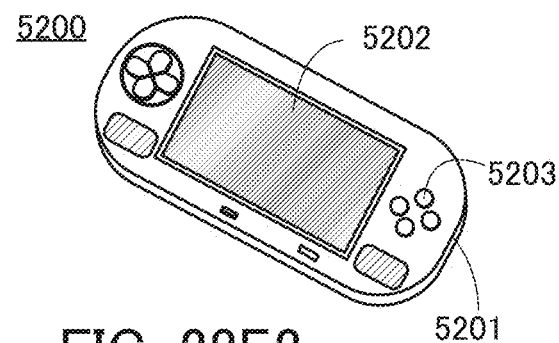
Figure 28D:
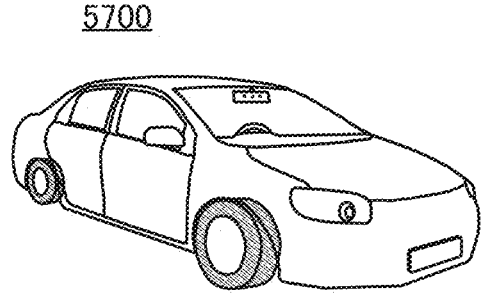
Figure 28D:
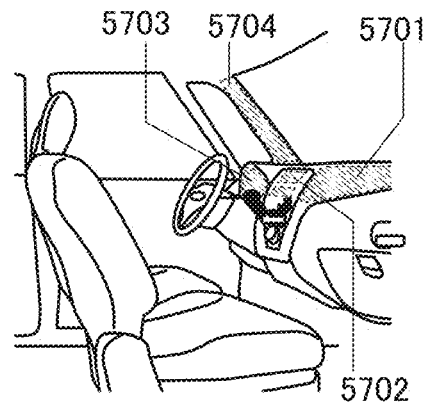

FIG. 28D illustrates a portable game console 5200 which is an example of a game console. The portable game console includes a housing 5201, a display portion 5202, a button 5203, and the like.

With the use of the GPU or the chip of one embodiment of the present invention in the portable game console 5200, the portable game console 5200 with low power consumption can be obtained. Furthermore, heat generation from a circuit can be reduced owing to low power consumption; thus, the influence of heat generation on the circuit itself, the peripheral circuit, and the module can be reduced.

Moreover, with the use of the GPU or the chip of one embodiment of the present invention in the portable game console 5200, the portable game console 5200 including artificial intelligence can be obtained.

Basically, the progress of a game, the actions and words of game characters, and expressions of a phenomenon or the like that occurs in the game are determined by a program of the game; however, the use of artificial intelligence in the portable game console 5200 enables expressions not limited by the program of the game. For example, expressions are possible in which questions posed by the player, the progress of the game, time, and the actions and words of game characters are changed.

When a game requiring a plurality of players is played on the portable game console 5200, the artificial intelligence can create a virtual game player, thus, the game can be played alone with the game player created by the artificial intelligence as an opponent.

Although the portable game console is illustrated in FIG. 28D as an example of a game machine, the game machine using the GPU or the chip of one embodiment of the present invention is not limited thereto. Examples of the game machine using the GPU or the chip of one embodiment of the present invention include a home stationary game machine, an arcade game machine installed in entertainment facilities (a game center, an amusement park, and the like), a throwing machine for batting practice installed in sports facilities, and the like.

[Moving Vehicle]

The GPU or the chip of one embodiment of the present invention can be used in an automobile, which is a moving vehicle, and around a driver's seat in the automobile.

FIG. 28E1 illustrates an automobile 5700 which is an example of a moving vehicle, and FIG. 28E2 illustrates the periphery of a windshield inside the automobile. FIG. 28E2 illustrates a display panel 5701, a display panel 5702, and a display panel 5703 that are attached to a dashboard and a display panel 5704 that is attached to a pillar.

The display panel 5701 to the display panel 5703 can display a variety of kinds of information by displaying a speedometer, a tachometer, a mileage, a fuel meter, a gearshift indicator, air-condition setting, and the like. The content, layout, or the like of the display on the display panels can be changed appropriately to suit the user's preferences, so that the design can be improved. The display panel 5701 to the display panel 5703 can also be used as lighting devices.

The display panel 5704 displays an image taken by an imaging device (not illustrated) provided for the automobile 5700, whereby the view obstructed by the pillar (blind areas) can be complemented. That is, display of an image taken by an imaging device provided on the outside of the automobile 5700 can fill in blind areas and improve safety. In addition, display of an image that complements the area that cannot be seen makes it possible to confirm safety more naturally and comfortably. The display panel 5704 can also be used as a lighting device.

Because the GPU or the chip of one embodiment of the present invention can be used as a component of artificial intelligence, the chip can be used in an automatic driving system of the automobile 5700, for example. The chip can also be used for a system for navigation, risk prediction, or the like. The display panel 5701 to the display panel 5704 may display information regarding navigation, risk prediction, and the like.

Although an automobile is described above as an example of a moving vehicle, moving vehicles are not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Broadcasting System]

The GPU or the chip of one embodiment of the present invention can be used in a broadcasting system.

Figure 28F:
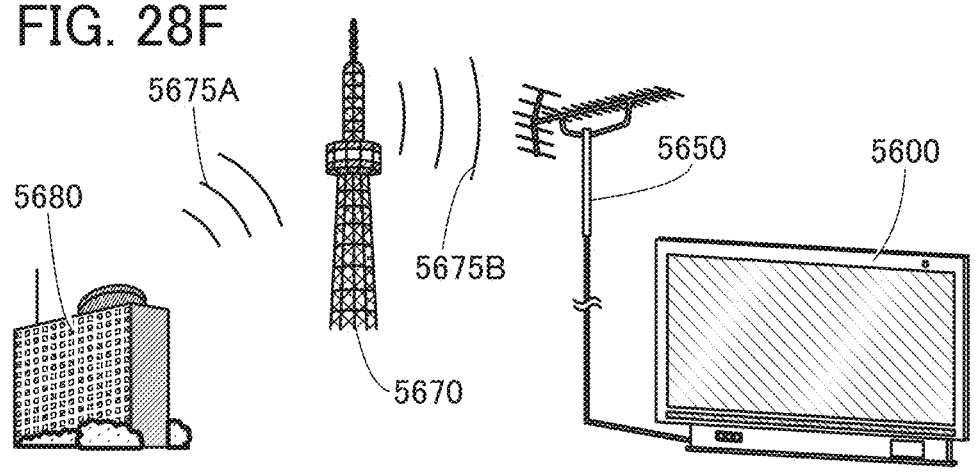

FIG. 28F schematically illustrates data transmission in a broadcasting system.

Specifically, FIG. 28F illustrates a path in which a radio wave (a broadcasting signal) transmitted from a broadcast station 5680 reaches a television receiver (TV) 5600 of each household. The TV 5600 includes a receiving device (not illustrated), and the broadcast signal received by an antenna 5650 is transmitted to the TV 5600 through the receiving device.

Although an UHF (Ultra High Frequency) antenna is illustrated as the antenna 5650 in FIG. 28F, a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 28F and may be satellite broadcasting using an artificial satellite, data broadcasting using an optical line, or the like.

The above-described broadcasting system may be a broadcasting system utilizing artificial intelligence by including the chip of one embodiment of the present invention. When the broadcast data is transmitted from the broadcast station 5680 to the TV 5600 of each household, the broadcast data is compressed by an encoder. The antenna 5650 receives the compressed broadcast data, and then the broadcast data is decompressed by a decoder of the receiving device in the TV 5600. Utilizing the artificial intelligence enables, for example, recognition of a display pattern included in a displayed image in motion compensation prediction, which is one of the compressing methods for the encoder. In addition, in-frame prediction or the like can also be performed utilizing the artificial intelligence. Furthermore, for example, when the broadcast data with low resolution is received and the broadcast data is displayed on the TV 5600 with high resolution, image interpolation processing such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As the application of artificial intelligence in the TV 5600, a recording device with artificial intelligence may be provided in the TV 5600, for example. With such a structure, the artificial intelligence can learn the user's preference, so that TV programs that suit the user's preference can be recorded automatically in the recording device.

The electronic device and the functions of the electronic device, the application example of the artificial intelligence and its effects, and the like described in this embodiment can be combined as appropriate with the description of another electronic device.

The structures, methods, and the like described in this embodiment can be used in combination as appropriate with the structures, configurations, methods, and the like described in the other embodiments and other examples.

Example 1

Figure 29:
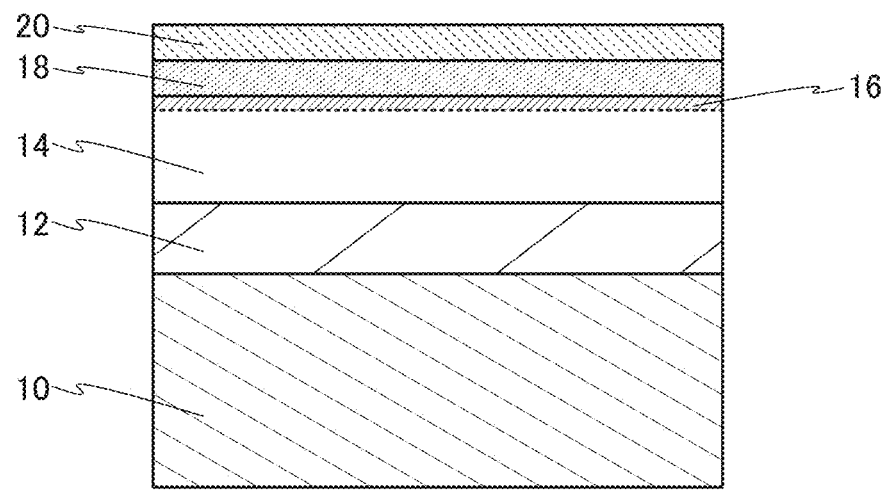
FIG. 29 is a schematic view illustrating a structure of a sample in Example of the present invention.

In this example, Sample 1A, Sample 1B, and Sample 1C each having a structure illustrated in FIG. 29 are fabricated, and analysis results of these samples are described.

The structure illustrated in FIG. 29 includes a silicon substrate 10, a silicon oxide film 12 over the silicon substrate 10, a silicon oxynitride film 14 over the silicon oxide film 12, a silicon oxynitride film 18 over the silicon oxynitride film 14, and a silicon oxynitride film 20 over the silicon oxynitride film 18. Here, a nitride region 16 is formed in the vicinity of an interface of the silicon oxynitride film 14 with the silicon oxynitride film 18. The silicon oxynitride film 20 includes deuterium D. Note that the nitride region 16 is not formed in Sample 1A. The nitride region 16 is formed in each of Sample 1B and Sample 1C; however, they are different in a method for forming the nitride region 16.

First, a method for fabricating Sample 1A, Sample 1B, and Sample 1C is described.

First, for each of Sample 1A, Sample 1B, and Sample 1C, by thermal oxidation of the silicon substrate 10, the silicon oxide film 12 was formed on a surface of the silicon substrate 10 to have a target thickness of 100 nm.

Next, for each of Sample 1A, Sample 1B, and Sample 1C, the silicon oxynitride film 14 was deposited to have a target thickness of 150 nm by a PECVD method. An $SiH_4$ gas at 5 sccm and an $N_2O$ gas at 1000 sccm were used as deposition gases, the deposition pressure was 133.3 Pa, the deposition power was 45 W (13.56 MHz), the substrate temperature was 325° C., and the distance between electrodes was 20 mm.

Next, microwave treatment was performed on Sample 1B and Sample 1C using a microwave treatment apparatus. The microwave treatment was performed as follows: an Ar gas at 1000 sccm and an $N_2$ gas at 200 sccm were used as treatment gases; the pressure was 12 Pa; the power was 1200 W; and the treatment temperature was 400° C. Here, the treatment time for Sample 1B was 300 seconds, and the treatment time for Sample 1C was 1800 seconds. Thus, the nitride region 16 is formed in the vicinity of the surface of the silicon oxynitride film 14 in each of Sample 1B and Sample 1C. Note that as for Sample 1A, the microwave treatment is not performed, and thus the nitride region 16 is not formed.

Next, for each of Sample 1A, Sample 1B, and Sample 1C, the silicon oxynitride film 18 was deposited to have a target thickness of 50 nm under the same deposition conditions as those for the silicon oxynitride film 14.

Next, for each of Sample 1A, Sample 1B, and Sample 1C, the silicon oxynitride film 20 was deposited to have a target thickness of 50 nm by a PECVD method. An $SiH_4$ gas at 2 sccm, an $N_2O$ gas at 800 sccm, and a $D_2$ dilution gas at 200 sccm were used as deposition gases, the deposition pressure was 200 Pa, the deposition power was 150 W (60 MHz), the substrate temperature was 160° C., and the distance between electrodes was 35 mm. Note that the $D_2$ dilution gas is a gas in which a $D_2$ gas is diluted to 5% using an Ar gas as a base.

As for Samples 1A to 1C which were fabricated, cross-sectional STEM images were taken by HD-2700 manufactured by Hitachi High Technologies Corporation at an accelerating voltage of 200 kV, and an analysis by energy dispersive X-ray spectroscopy (EDX) was performed.

Figure 30C:
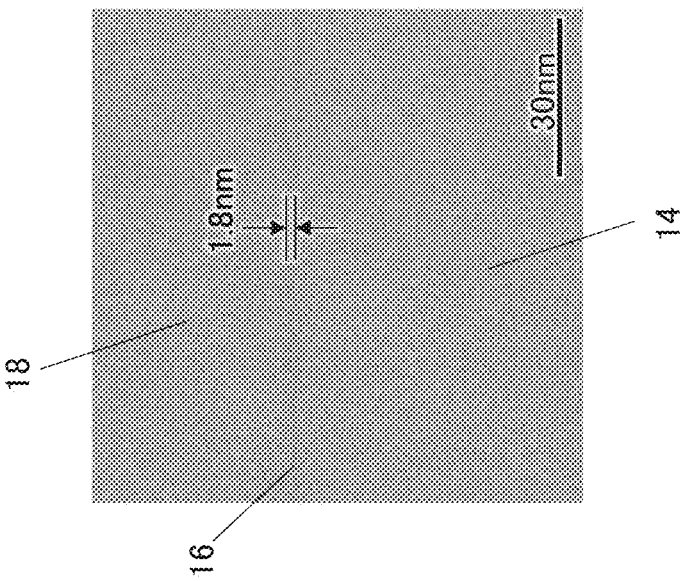
FIG. 30A, FIG. 30B, and FIG. 30C are STEM images of samples in Example of the present invention.
Figure 30B:
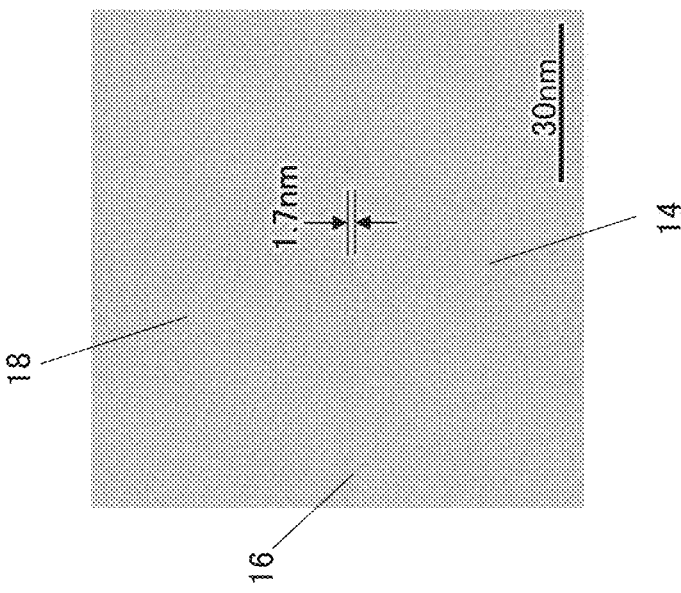
Figure 30A:
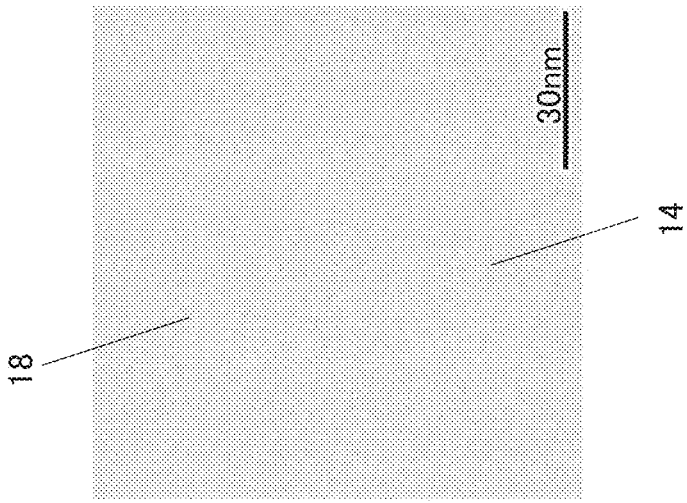

FIG. 30A to FIG. 30C illustrate cross-sectional STEM images of the vicinity of an interface between the silicon oxynitride film 14 and the silicon oxynitride film 18 in each of Sample 1A to Sample 1C. As shown in FIG. 30A, the nitride region 16 was not observed in the vicinity of the interface of the silicon oxynitride film 14 in Sample 1A which was not subjected to the microwave treatment. In contrast, as shown in FIG. 30B and FIG. 30C, the nitride region 16 was observed in the vicinity of the interface of the silicon oxynitride film 14 in each of Sample 1B and Sample 1C which were subjected to the microwave treatment. The thickness of the nitride region 16 in Sample 1B was approximately 1.7 nm, and the thickness of the nitride region 16 in Sample 1C was approximately 1.8 nm. In other words, regardless of the microwave treatment time, the thicknesses of the nitride region 16 were substantially the same.

Figure 31:
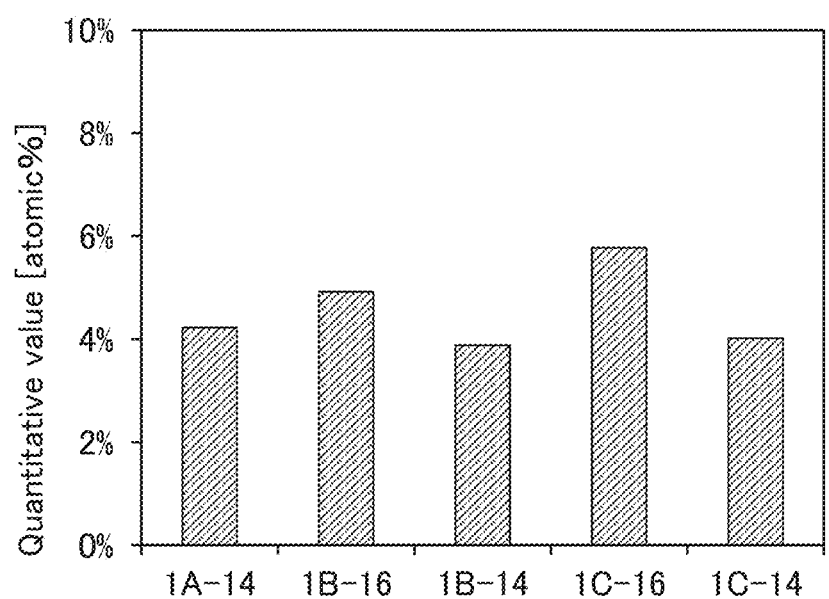
FIG. 31 shows EDX analysis results of samples in Example of the present invention.

Next, FIG. 31 shows EDX analysis results of the silicon oxynitride film 14 of Sample 1A (1A-14), the nitride region of Sample 1B (1B-16), the silicon oxynitride film 14 of Sample 1B (1B-14), the nitride region of Sample 1C (1C-16), and the silicon oxynitride film 14 of Sample 1C (1C-14). FIG. 31 is a bar graph showing quantitative values [atomic %] of nitrogen.

In each of Sample 1B and Sample 1C, the nitrogen concentration of the nitrogen region 16 is higher than that of the silicon oxynitride film 14, and thus it is found that the surface of the silicon oxynitride film 14 is nitride by the microwave treatment. This tendency was more significant in Sample 1C in which the time for the microwave treatment was longer than in Sample 1B.

Next, Sample 1D to Sample 1F which had a structure similar to that of Sample 1A to Sample 1C and were subjected to heat treatment at 400° C. for one hour in a nitrogen atmosphere were fabricated.

Figure 32A:
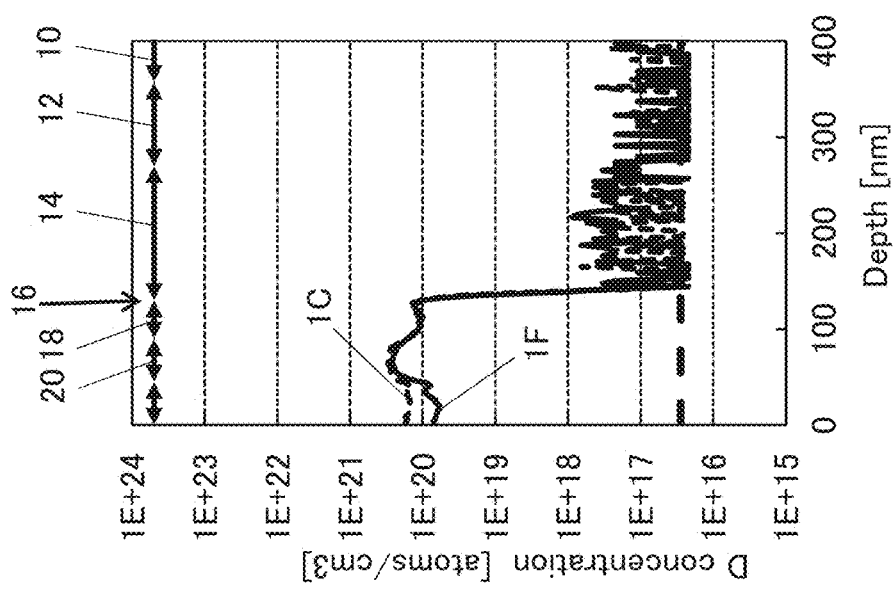
FIG. 32A, FIG. 32B, and FIG. 32C are graphs showing SIMS analysis results of samples in Example of the present invention.
Figure 32B:
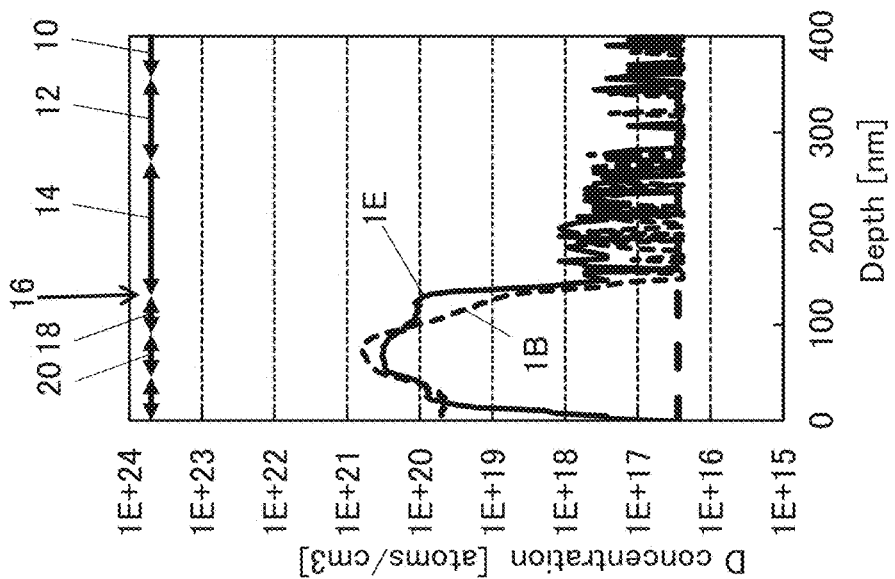
Figure 32C:
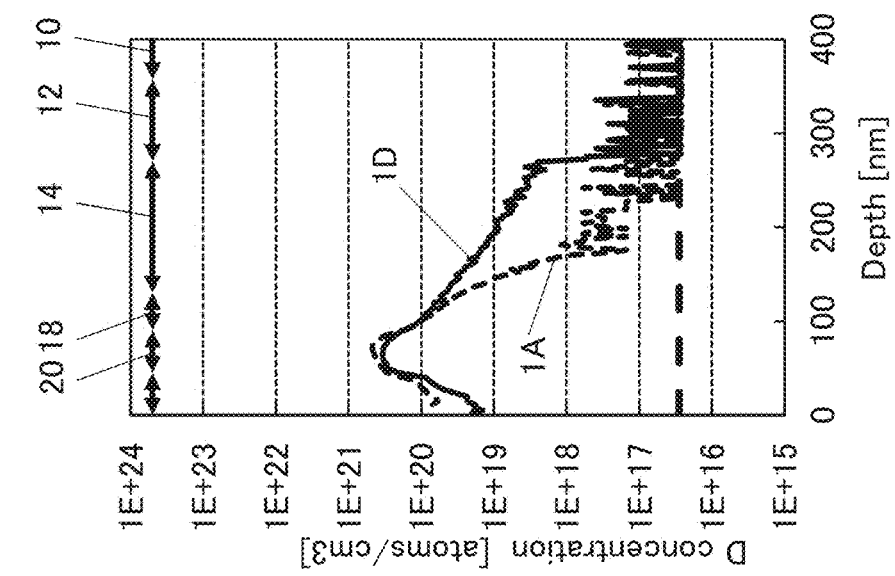

Each of Sample 1A to Sample 1F fabricated in this manner was subjected to SIMS analysis, and a state of diffusion of deuterium D contained in the silicon oxynitride film 20 was examined. FIG. 32A shows the concentrations of deuterium D [atoms/cm$^3$] in Sample 1A and Sample 1D, FIG. 32B shows the concentrations of deuterium D [atoms/cm$^3$] in Sample 1B and Sample 1E, and FIG. 32C shows the concentrations of deuterium D [atoms/cm$^3$] in Sample 1C and Sample 1F. Note that in each of Sample 1A to Sample 1F, SIMS analysis was performed from the silicon substrate 10 side, and an adhesive is formed over the silicon oxynitride film 20. A dashed line in the SIMS graph shown in each of FIG. 32A to FIG. 32C indicates a lower measurement limit. Quantified layers are the silicon oxynitride film 14, the silicon oxynitride film 18, and the silicon oxynitride film 20.

As shown in FIG. 32A, in Sample 1A and Sample 1D, deuterium D is diffused into the silicon oxynitride film 14, which is particularly significant in Sample 1D which was subjected to heat treatment. In contrast, as shown in FIG. 32B and FIG. 32C, in each of Sample 1B, Sample 1C, Sample 1E, and Sample 1F, the concentration of deuterium D is significantly reduced at the interface between the silicon oxynitride film 18 and the silicon oxynitride film 14, i.e., in the nitride region 16. In other words, it is found that deuterium D contained in the silicon oxynitride film is blocked by the nitride region 16 in each of these samples.

As described above, the nitride region is formed in the silicon oxynitride film by the microwave treatment, whereby a layer having a barrier property against hydrogen can be formed. When such a layer is used as described in the above embodiment, hydrogen diffused into an oxide semiconductor can be reduced. As described above, an oxide semiconductor with sufficiently reduced impurities such as hydrogen is used in a channel formation region of a transistor, whereby the transistor can have normally-off characteristics, stable electrical characteristics, and improved reliability.

Example 2

In this example, measurement results of the resistivities of Sample 2A to Sample 2I in each of which a tantalum nitride film deposited over a silicon substrate was subjected to the microwave treatment in a nitrogen-containing atmosphere are described.

First, a method for fabricating Sample 2A to Sample 2I is described.

First, for each of Sample 2A to Sample 2I, by thermal oxidation of a silicon substrate, a silicon oxide film was formed on a surface of the silicon substrate to have a target thickness of 100 nm.

Next, for each of Sample 2A to Sample 2I, a tantalum nitride film was deposited to have a target thickness of 20 nm by a DC sputtering method. In the deposition of the tantalum nitride film, a tantalum target was used; an argon gas at 50 sccm and a nitrogen gas at 10 sccm were used as deposition gases; the deposition pressure was 0.6 Pa; the deposition power was 1000 W; the substrate temperature was room temperature; and the distance between the target and the substrate was 60 mm.

Next, Sample 2B to Sample 2I were subjected to the microwave treatment using a microwave treatment apparatus. The microwave treatment was performed as follows: an Ar gas at 1000 sccm and a $N_2$ gas at 200 sccm were used as treatment gases; the power was 1200 W; and the treatment temperature was 400° C. Here, conditions of the pressure and the treatment time for the microwave treatment which was performed on Sample 2B to Sample 2I are shown in Table 1 below.

TABLE 1

|  | 2B | 2C | 2D | 2E | 2F | 2G | 2H | 2I |
|---|---|---|---|---|---|---|---|---|
| Pressure | 12 Pa | 60 Pa | 133 Pa | 400 Pa | 667 Pa | 12 Pa | 12 Pa | 12 Pa |
| Treatment time | 5 min. | 5 min. | 5 min. | 5 min. | 5 min. | 1 min. | 10 min. | 30 min. |

Figure 33A:
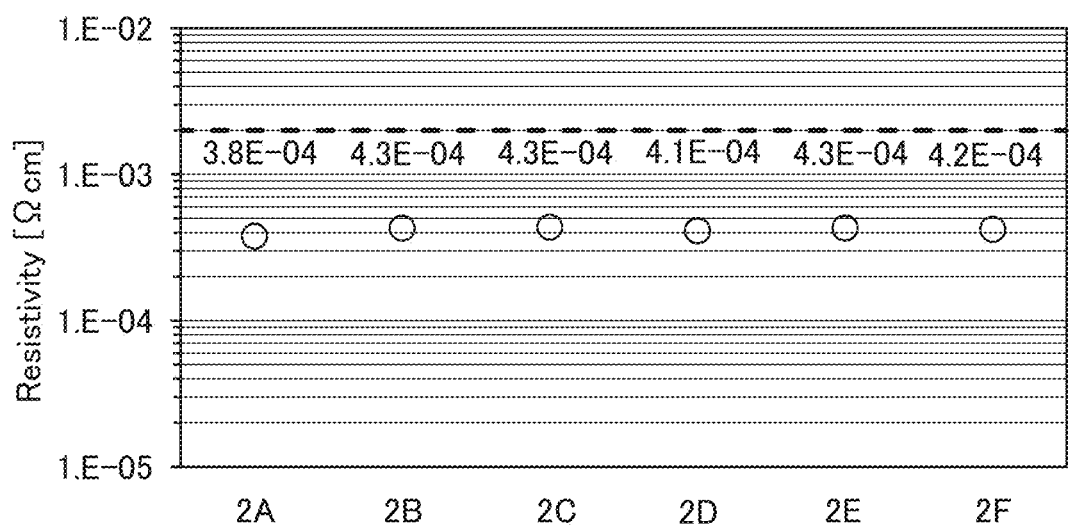
FIG. 33A and FIG. 33B show the resistivities of samples in Example of the present invention.
Figure 33B:
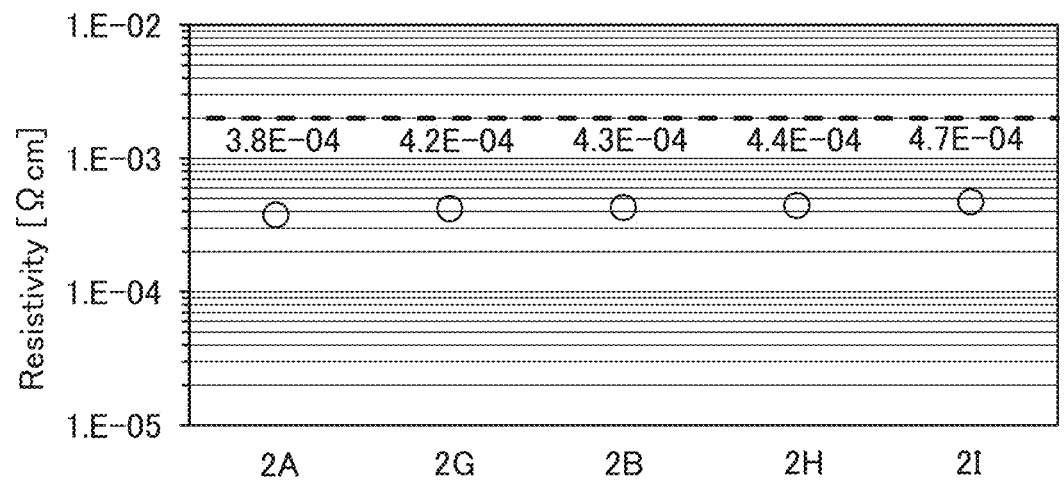

FIG. 33A and FIG. 33B show measurement results of the sheet resistances of the tantalum nitride films of Sample 2A to Sample 2I which were fabricated. FIG. 33A is a graph in which Sample 2A to Sample 2F fabricated in such a manner that the treatment time was fixed to 5 minutes and different pressure conditions were used are compared, and FIG. 33B is a graph in which Sample 2A, 2G, 2B, 2H, and 2I fabricated in such a manner that the pressure was fixed to 12 Pa and different treatment time conditions were used are compared. In each of FIG. 33A and FIG. 33B, the vertical axis indicates the resistivity [Ωcm]. A dotted line is drawn at $2.0 \times 10^{-3}$ Ωcm in each of FIG. 33A and FIG. 33B; this is a target value of the resistivity of each of the source electrode and the drain electrode in the transistor described in the above embodiment.

As shown in FIG. 33A, the resistivities of Sample 2B to Sample 2F which were subjected to the microwave treatment were increased slightly more than that of Sample 2A which was not subjected to the microwave treatment but had substantially the same resistivities. Sample 2B to Sample 2F did not show dependence of the resistivity on the pressure for the microwave treatment.

As shown in FIG. 33B, the resistivities of Samples 2G, 2B, 2H, and 2I which were subjected to the microwave treatment tended to be increased in accordance with the treatment time. However, the resistivities of Samples 2G, 2B, 2H, and 2I were sufficiently low with respect to $2.0 \times 10^{-3}$ Ωcm.

As described above, it was found that even when the source electrode and the drain electrode were subjected to the microwave treatment in forming the nitride region in the silicon oxynitride film, the resistivity of the tantalum nitride used for the source electrode and the drain electrode was not significantly increased. Such a conductive film is used for the source electrode and the drain electrode, whereby the source electrode and the drain electrode do not require special posttreatment after formation of the nitride region in the silicon oxynitride film; thus, the productivity of the semiconductor device can be improved.

Example 3

In this example, Sample 3A to Sample 3H having the structure illustrated in FIG. 29 in Example 1 are fabricated and analysis results of these samples are described. Sample 3A to Sample 3H are different from Sample 1A to Sample 1F in the conditions for forming the nitride region 16.

As in Example 1, the structure illustrated in FIG. 29 includes the silicon substrate 10, the silicon oxide film 12 over the silicon substrate 10, the silicon oxynitride film 14 over the silicon oxide film 12, the silicon oxynitride film 18 over the silicon oxynitride film 14, and the silicon oxynitride film 20 over the silicon oxynitride film 18. Here, the nitride region 16 is formed in the vicinity of the interface of the silicon oxynitride film 14 with the silicon oxynitride film 18. The silicon oxynitride film 20 includes deuterium D. Note that the nitride region 16 is not formed in each of Sample 3A and Sample 3E. The nitride region 16 is formed in each of Sample 3B, Sample 3C, Sample 3D, Sample 3F, Sample 3G, and Sample 3H; however, they are different in conditions for forming the nitride region 16.

First, a method for fabricating Sample 3A to Sample 3H is described.

First, for each of Sample 3A to Sample 3H, by thermal oxidation of the silicon substrate 10, the silicon oxide film 12 was formed on the surface of the silicon substrate 10 to have a target thickness of 100 nm.

Next, for each of Sample 3A to Sample 3H, the silicon oxynitride film 14 was deposited to have a target thickness of 150 nm by a PECVD method. An $SiH_4$ gas at 5 sccm and an $N_2O$ gas at 1000 sccm were used as deposition gases, the deposition pressure was 133.3 Pa, the deposition power was 45 W (13.56 MHz), the substrate temperature was 325° C., and the distance between electrodes was 20 mm.

Next, Sample 3B, Sample 3C, Sample 3D, Sample 3F, Sample 3G, and Sample 3H were subjected to the microwave treatment using a microwave treatment apparatus. The microwave treatment was performed as follows: an Ar gas at 1000 sccm and an $N_2$ gas at 200 sccm were used as treatment gases, the power was 1200 W, the treatment temperature was 400° C., and the treatment time was 300 seconds. Here, the pressure for Sample 3B and Sample 3F was 12 Pa, the pressure for Sample 3C and Sample 3G was 60 Pa, and the pressure for Sample 3D and Sample 3H was 400 Pa. Thus, the nitride region 16 is formed in the vicinity of the surface of the silicon oxynitride film 14 of each of Sample 3B, Sample 3C, Sample 3D, Sample 3F, Sample 3G, and Sample 3H. Note that as for each of Sample 3A and Sample 3E, the microwave treatment is not performed, and thus the nitride region 16 is not formed.

Next, for each of Sample 3A, to Sample 3H, the silicon oxynitride film 18 was deposited to have a target thickness of 50 nm under the same deposition conditions as those for the silicon oxynitride film 14.

Next, for each of Sample 3A to Sample 3H, the silicon oxynitride film 20 was deposited to have a target thickness of 50 nm by a PECVD method. An $SiH_4$ gas at 2 sccm, an $N_2O$ gas at 800 sccm, and a $D_2$ dilution gas at 200 sccm were used as deposition gases, the deposition pressure was 200 Pa, the deposition power was 150 W (60 MHz), the substrate temperature was 160° C., and the distance between electrodes was 35 mm. Note that the $D_2$ dilution gas is a gas in which a $D_2$ gas is diluted to 5% using an Ar gas as a base.

Next, Sample 3E, Sample 3F, Sample 3G, and Sample 3H were subjected to heat treatment at 400° C. for eight hours in a nitrogen atmosphere.

Figure 34A:
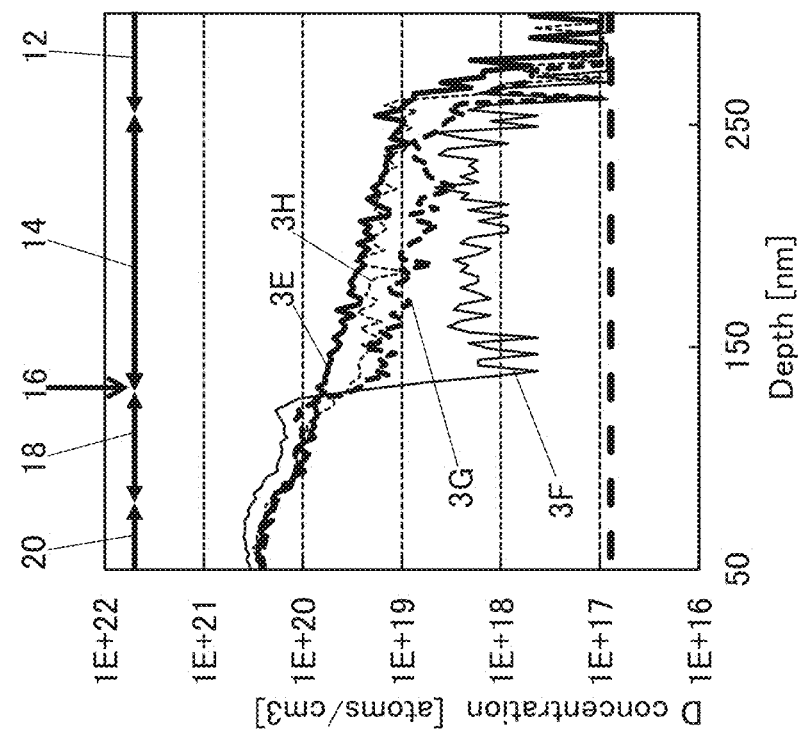
FIG. 34A and FIG. 34B are graphs showing SIMS analysis results of samples in Example of the present invention.
Figure 34B:
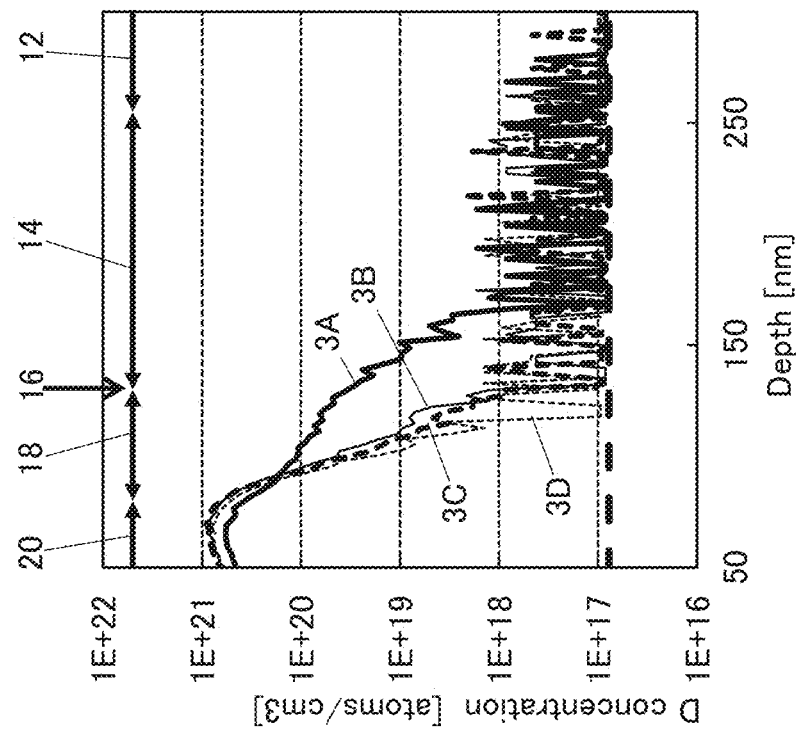

Each of Sample 3A to Sample 3H fabricated in this manner was subjected to SIMS analysis, and a state of diffusion of deuterium D contained in the silicon oxynitride film 20 was examined. FIG. 34A shows the concentrations of deuterium D [atoms/cm$^3$] in Sample 3A to Sample 3D, and FIG. 34B shows the concentrations of deuterium D [atoms/cm$^3$] in Sample 3E to Sample 3H. Note that Sample 3A to Sample 3H were subjected to SIMS analysis from the silicon substrate 10 side, and an adhesive is formed over the silicon oxynitride film 20. Dashed lines in the SIMS graphs shown in FIG. 34A and FIG. 34B indicate lower measurement limits. Quantified layers are the silicon oxide film 12, the silicon oxynitride film 14, the silicon oxynitride film 18, and the silicon oxynitride film 20.

As shown in FIG. 34A, in each of Sample 3B to Sample 3D which were not subjected to high-temperature heat treatment for a long time, deuterium D contained in the silicon oxynitride film 20 is blocked by the nitride region 16 regardless of the pressure of the microwave treatment. In contrast, as shown in FIG. 34B, in each of Sample 3F to Sample 3H which were subjected to high-temperature heat treatment for a long time, deuterium D contained in the silicon oxynitride film 20 is more blocked by the nitride region 16 than in Sample 3E in which the nitride region 16 is not formed; however, dependence of the hydrogen block property on the pressure for the microwave treatment is observed. That is, in Sample 3G with a pressure of 60 Pa, diffusion of deuterium D is inhibited more than in Sample 3H with a pressure of 400 Pa; and in Sample 3F with a pressure of 12 Pa, diffusion of deuterium D is inhibited more than in Sample 3G with a pressure of 60 Pa.

As described above, the nitride region is formed in the silicon oxynitride film with a low pressure in the microwave treatment, whereby the barrier property against hydrogen can be improved. Such a nitride region is used as described in the above embodiment, whereby even when high-temperature heat treatment is performed for a long time in the manufacturing process of the above semiconductor device, hydrogen diffused into the oxide semiconductor can be reduced. As described above, an oxide semiconductor with sufficiently reduced impurities such as hydrogen is used in a channel formation region of a transistor, whereby the transistor can have normally-off characteristics, stable electrical characteristics, and improved reliability.

Example 4

Figure 35:
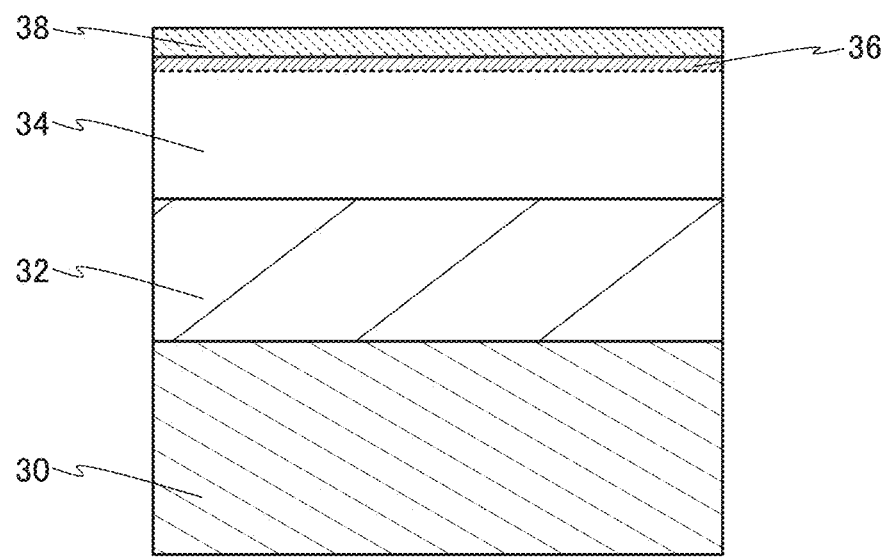
FIG. 35 is a schematic view illustrating a structure of a sample in Example of the present invention.

In this example, Sample 4A and Sample 4B each having a structure illustrated in FIG. 35 are fabricated, and analysis results of these samples are described.

The structure illustrated in FIG. 35 includes a silicon substrate 30, a silicon oxide film 32 over the silicon substrate 30, a silicon oxide film 34 over the silicon oxide film 32, and a silicon nitride film 38 over the silicon oxide film 34. Here, in Sample 4B, a nitride region 36 is formed in the vicinity of an interface of the silicon oxide film 34 with the silicon nitride film 38. Note that the nitride region 36 is not formed in Sample 4A.

First, a method for fabricating Sample 4A and Sample 4B is described.

First, for each of Sample 4A and Sample 4B, the silicon substrate 30 was subjected to thermal oxidation to form the silicon oxide film 32 to have a target thickness of 100 nm on the surface of the silicon substrate 30.

Next, for each of Sample 4A and Sample 4B, the silicon oxide film 34 was deposited to have a target thickness of 100 nm by a RF sputtering method. The silicon oxide film 34 was deposited using an $SiO_2$ (anhydrous synthetic quartz) target. An oxygen gas at 50 sccm was used as a deposition gas; the deposition pressure was 0.7 Pa (measured with Miniature Gauge MG-2 manufactured by CANON ANELVA CORPORATION); the deposition power was 1500 W; the substrate temperature was 170° C.; and the target-substrate distance was 60 mm.

Next, microwave treatment was performed on Sample 4B using a microwave treatment apparatus. The microwave treatment was performed as follows: an Ar gas at 1000 sccm and an $N_2$ gas at 200 sccm were used as treatment gases; the power was 1200 W; the treatment temperature was 400° C.; the pressure was 12 Pa; and the treatment time was 300 seconds. Thus, the nitride region 36 is formed in the vicinity of the surface of the silicon oxide film 34 in Sample 4B. Note that as for Sample 4A, the microwave treatment is not performed, and thus the nitride region 36 is not formed.

Next, for each of Sample 4A and Sample 4B, the silicon nitride film 38 was deposited to have a target thickness of 20 nm by a PECVD method. An $SiH_4$ gas at 5 sccm and an $N_2$ gas at 2500 sccm were used as deposition gases, the deposition pressure was 100 Pa, the deposition power was 250 W (13.56 MHz), the substrate temperature was 350° C., and the distance between electrodes was 20 mm. In this step, Sample 4A and Sample 4B are exposed to a large amount of hydrogen generated in a chamber.

Figure 36:
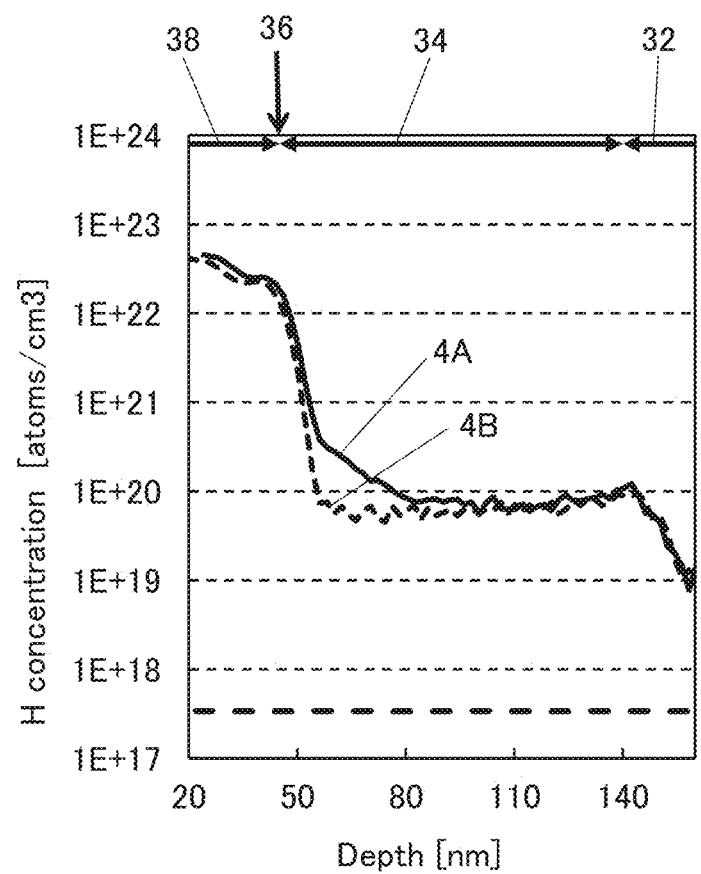
FIG. 36 is a graph showing SIMS analysis results of samples in Example of the present invention.

Each of Sample 4A and Sample 4B fabricated in this manner was subjected to SIMS analysis, and it was checked whether hydrogen in the deposition of the silicon nitride film 38 was diffused into the silicon oxide film 34. FIG. 36 shows the concentration of hydrogen H [atoms/cm$^3$] in Sample 4A and Sample 4B. Note that in Sample 4A and Sample 4B, SIMS analysis was performed from the silicon substrate 30 side, and an adhesive is formed over the silicon nitride film 38. A dashed line in the SIMS graph shown in FIG. 36 indicates a lower measurement limit. A quantified layer is the silicon oxide film 34.

As shown in FIG. 36, in Sample 4A, hydrogen H is diffused into the silicon oxide film 34. In contrast, in Sample 4B, the concentration of hydrogen H is significantly lowered at the interface between the silicon nitride film 38 and the silicon oxide film 34, i.e., in the nitride region 36. In other words, it is found that hydrogen in the deposition of the silicon nitride film 38 is reduced by the nitride region 36 in Sample 4B.

As described above, the nitride region is formed by the microwave treatment, whereby even when a deposition method in which a large amount of hydrogen is generated in a chamber, such as a PECVD method, is used in a state where the nitride region is exposed, hydrogen diffused into a region on an inner side than the nitride region can be reduced. When such a nitride region is used as described in the above embodiment, hydrogen diffused into an oxide semiconductor can be reduced. As described above, an oxide semiconductor with sufficiently reduced impurities such as hydrogen is used in a channel formation region of a transistor, whereby the transistor can have normally-off characteristics, stable electrical characteristics, and improved reliability.

The structures, methods, and the like described in this embodiment can be used in combination as appropriate with the structures, compositions, methods, and the like described in the other embodiments and other examples.

REFERENCE NUMERALS

200: transistor, 200_n: transistor, 200_1: transistor, 205: conductor, 205a: conductor, 205b: conductor, 210: insulator, 212: insulator, 214: insulator, 216: insulator, 217: region, 218: conductor, 222: insulator, 224: insulator, 230: oxide, 230a: oxide, 230A: oxide film, 230b: oxide, 230B: oxide film, 230c: oxide, 230C: oxide film, 240: conductor, 240a: conductor, 240b: conductor, 241: region, 241a: region, 241b: region, 241c: region, 242: conductor, 242a: conductor, 242A: conductive film, 242b: conductor, 242B: conductor layer, 243: oxide, 243a: oxide, 243A: oxide film, 243b: oxide, 243B: oxide layer, 244: region, 244a: region, 244b: region, 245: region, 246: conductor, 246a: conductor, 246b: conductor, 250: insulator, 250A: insulating film, 255a: opening, 255*b*: opening, 260: conductor, 260*a*: conductor, 260Aa: conductive film, 260Ab: conductive film, 260*b*: conductor, 265: sealing portion, 265*a*: sealing portion, 265*b*: sealing portion, 272: insulator, 272*a*: insulator, 272A: insulating film, 272*b*: insulator, 272B: insulator layer, 274: insulator, 280: insulator, 281: valve, 282: insulator, 283: insulator

The invention claimed is:

1. A method for manufacturing a semiconductor device comprising first and second conductors, first to sixth insulators, and a first oxide, the method comprising:
    forming the first insulator over a substrate;
    forming the first conductor over the first insulator;
    forming the second insulator over the first conductor;
    forming the third insulator over the second insulator;
    forming the first oxide over the third insulator;
    forming the fourth insulator over the first oxide;
    forming a first opening reaching the first oxide in the fourth insulator;
    forming a first conductive film in the first opening;
    removing part of the first conductive film until a top surface of the fourth insulator is exposed to form the second conductor from the first conductive film;
    forming the fifth insulator in contact with the fourth insulator and the second conductor;
    removing part of the fifth insulator, part of the fourth insulator, part of the third insulator, and part of the second insulator to form a second opening reaching the first insulator; and
    forming the sixth insulator covering the fifth insulator, the fourth insulator, the third insulator, and the second insulator and in contact with the first insulator in the second opening,
    wherein the third insulator and the fourth insulator are deposited using a gas containing a molecule including a silicon atom, and
    wherein the molecule including a silicon atom contains three or less hydrogen atoms per silicon atom.

2. The method for manufacturing a semiconductor device, according to claim 1,
    wherein microwave treatment is performed in a nitrogen-containing atmosphere after the second opening is formed.

3. The method for manufacturing a semiconductor device, according to claim 1,
    wherein the molecule including a silicon atom does not contains a hydrogen atom.

4. The method for manufacturing a semiconductor device, according to claim 1,
    wherein the gas containing a molecule including a silicon atom does not contain a hydrogen atom.

5. The method for manufacturing a semiconductor device, according to claim 1,
    wherein the first insulator and the sixth insulator are less likely to transmit hydrogen than the fourth insulator.

6. The method for manufacturing a semiconductor device, according to claim 1,
    wherein the fourth insulator is deposited by a PECVD method or an APCVD method.

\* \* \* \* \*